(12) United States Patent
Bhattacharyya

(10) Patent No.: US 7,158,401 B2
(45) Date of Patent: Jan. 2, 2007

(54) METHODS FOR MACHINE DETECTION OF AT LEAST ONE ASPECT OF AN OBJECT, METHODS FOR MACHINE IDENTIFICATION OF A PERSON, AND METHODS OF FORMING ELECTRONIC SYSTEMS

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 11/000,784

(22) Filed: Nov. 30, 2004

(65) Prior Publication Data

US 2005/0099839 A1 May 12, 2005

Related U.S. Application Data

(63) Continuation of application No. 10/386,619, filed on Mar. 11, 2003, now Pat. No. 6,845,034.

(51) Int. Cl.
*G11C 11/24* (2006.01)
(52) U.S. Cl. .................... 365/149; 365/129; 235/492; 716/1; 716/3
(58) Field of Classification Search ............... 365/149, 365/129; 235/492; 716/1, 3
See application file for complete search history.

(56) References Cited

U.S. PATENT DOCUMENTS 5,471,039 A * 11/1995 Irwin, Jr. et al. ........... 235/441
6,649,980 B1 11/2003 Noguchi 2001/0026477 A1 10/2001 Manning

OTHER PUBLICATIONS

Ono, K. et al., "Analysis of Current-Voltage Characteristics in Polysilicon TFTs for LCDs", IEDM Tech. Digest, 1988, pp. 256-259.
Yamauchi, N. et al., "Drastically Improved Performance in Poly-Si TFTs with Channel Dimensions Comparable to Grain Size", IEDM Tech. Digest, 1989, pp. 353-356.
King, T. et al, "A Low-Temperature (550° C.) Silicon-Germanium MOS Thin-Film Transistor Technology for Large-Area Electronics", IEDM Tech. Digest, 1991, pp. 567-570.
Kuriyama, H. et al.,"High Mobility Poly-Si TFT by a New Excimer Laser Annealing Method for Large Area Electronics", IEDM Tech. Digest, 1991, pp. 563-566.
Jeon, J. et al., "A New Poly-Si TFT with Selectively Doped Channel Fabricated by Novel Excimer Laser Annealing", IEDM Tech. Digest, 2000, pp. 213-216.
Kim, C.H. et al., "A New High-Performance Poly-Si TFT by Simple Excimer Laser Annealing on Selectively Floating a-Si Layer", IEDM Tech. Digest, 2001, pp. 751-754.
Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.

(Continued)

*Primary Examiner*—Van Thu Nguyen
*Assistant Examiner*—Pho M. Luu
(74) *Attorney, Agent, or Firm*—Wells St. John P.S.

(57) ABSTRACT

Electronic systems including Si/Ge substrates. The electronic systems can include data storage devices and/or logic devices having active regions extending into a crystalline Si/Ge material. An entirety of the portion of an active region within the crystalline Si/Ge material can be within a single crystal of the material. The assemblies can be utilized for detecting properties of objects, and in particular aspects can be incorporated into assemblies utilized for identifying persons. The assemblies can be fabricated over a range of versatile substrates, including, for example, glass, alumina or metal.

72 Claims, 27 Drawing Sheets

OTHER PUBLICATIONS

Hara, A. et al., "High Performance Poly-Si TFTs on a Glass by a Stable Scanning CW Laser Lateral Crystallization", IEDM Tech. Digest, 2001, pp. 747-750.

Jagar, S. et al., "Single Grain Thin-Film-Transistor (TFT) with SOI CMOS Performance Formed by Metal-Induced -Lateral-Crystallization", IEDM Tech. Digest, 1999, p. 293-296.

Gu, J. et al., "High Performance Sub-100 nm Si Thin-Film Transistors by Pattern-Controlled Crystalli-zation of Thin Channel Layer and High Temperature Annealing", DRC Conf. Digest 2002, pp. 49-50.

Kesan, V. et al., "High Performance 0. 25 μm p-MOSFETs with Silicon-Germanium Channels for 300K and 77K Operation", IEDM Tech. Digest, 1991, pp. 25-28.

Garone, P.M. et al., "Mobility Enhancement and Quantum Mechanical Modeling in $Ge_xSi_{1-x}$ Channel MOSFETs from 90 to 300K", IEDM Tech. Digest, 1991, pp. 29-32.

Feder, B.J., "I.B.M. Finds Way to Speed Up Chips", The New York Times, Jun. 8, 2001, reprinted from http://www.nytimes.com/2001/06/08 /technology/08BLUE.html, 2 pgs.

Rim, K. et al., "Strained Si NMOSFET's for High Performance CMOS Technology", 2001 Sympos. on VLSI Tech. Digest of Technical Papers, p. 59-60.

Li, P. e tal., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, Natl. Science Council of Taiwan., pp. 1, 9.

Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.

Rim, K. et al., "Characteristics and Device Design of Sub-100 nm Strained SiN- and PMOSFETs", 2002 Sympos. on VLSI Tech. Digest of Technical Papers, pp. 98-99.

Belford, R.E. et al., "Performance-Augmented CMOS Using Back-End Uniaxial Strain", DRC Conf. Digest, 2002, pp. 41-42.

Shima, M. et al., "<100> Channel Strained-SiGe p-MOSFET with Enhanced Hole Mobility and Lower Parasitic Resistance", 2002 Sympos. on VLSI Tech. Digest of Technical Papers, pp. 94-95.

Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.

Bae, G.J. et al., "A Novel SiGe-Inserted SOI Structure for High Performance PDSOI CMOSFET", IEDM Tech. Digest, 2000, pp. 667-670.

Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outliine.

Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.

Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Takagi, S., "Strained-Si- and SiGe-on-Insulator (Strained SOI and SGOI) MOSFETs for High Performance/Low Power CMOS Application", DRC Conf. Digest, 2002, pp. 37-40.

"IBM Builds World's Fastest Communications Microchip", Reuters U.S. Company News, Feb. 25, 2002, reprinted from http://activequote300.fidelity.com/rtrnews/ individual n.../..., 1 pg.

Markoff, J., "I.B.M. Circuits are Now Faster and Reduce Use of Power", The New York Times, Feb. 25, 2002, reprinted Mar. 20, 2002 from http://story.news.yahoo.com/ news?tmpl=story&u=/nyt/20020225/..., 1 pg.

Park, J.S. et al., "Normal Incident SiGe/Si Multiple Quantum Well Infrared Detector", IEDM Tech. Digest, 1991, pp. 749-752.

Current, M.I. et al., "Atomic-Layer Cleaving with $Si_xGe_y$ Strain Layers for Fabrication of Si and Ge-Rich SOI Device Layers", 2001 IEEE Internatl. SOI Conf. Oct. 2001, pp. 11-12.

Bhattacharyya, A., "The Role of Microelectronic Integration in Environmental Control: A Perspective", Mat. Res. Soc. Symp. Proc. vol. 344, 1994, pp. 281-293.

Myers, S.M. et al., "Deuterium Interactions in Oxygen-Implanted Copper", J. Appl. Phys., vol. 65(1),. Jan. 1, 1989, p. 311-321.

Saggio, M. et al., "Innovative Localized Lifetime Control in High-Speed IGBT's", IEEE Elec. Dev. Lett., V. 18, No. 7, Jul. 1997, pp. 333-335.

Lu, N.C.C. et al., "A Buried-Trench DRAM Cell Using a Self-Aligned Epitaxy Over Trench Technology", IEDM Tech. Digest, 1988, pp. 588-591.

Yamada, T. et al., "Spread Source/Drain (SSD) MOSFET Using Selective Silicon Growth for 64Mbit DRAMs", IEDM Tech. Digest, 1989, pp. 35-38.

van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

* cited by examiner

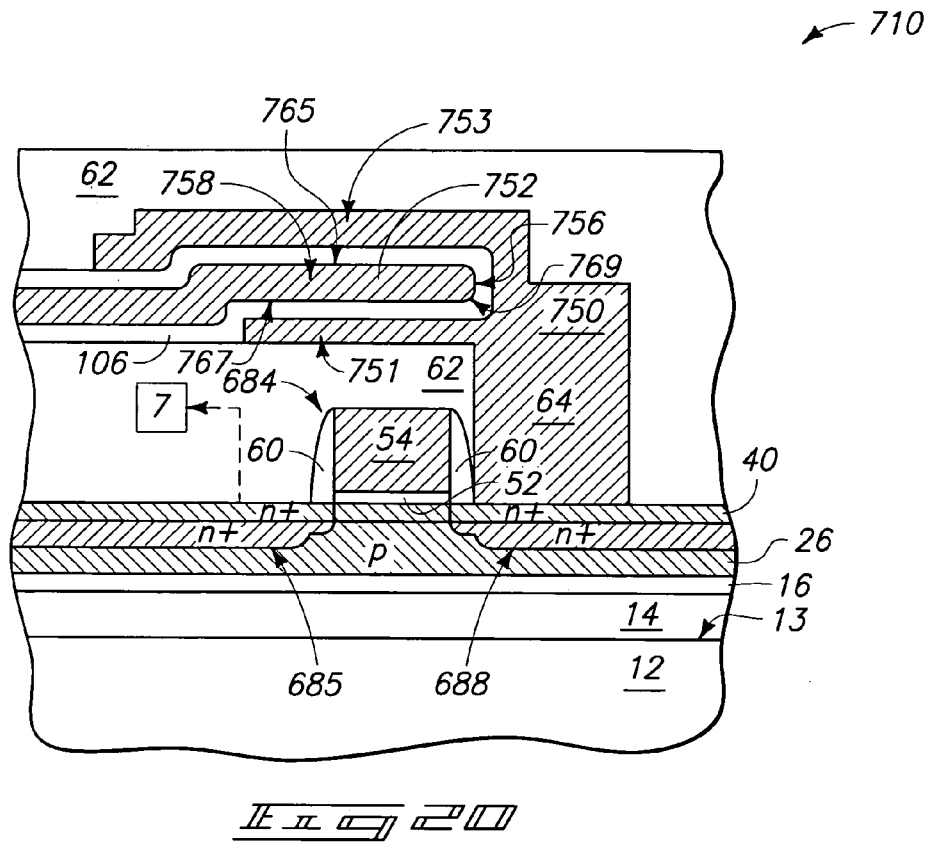
_Fig. 20_
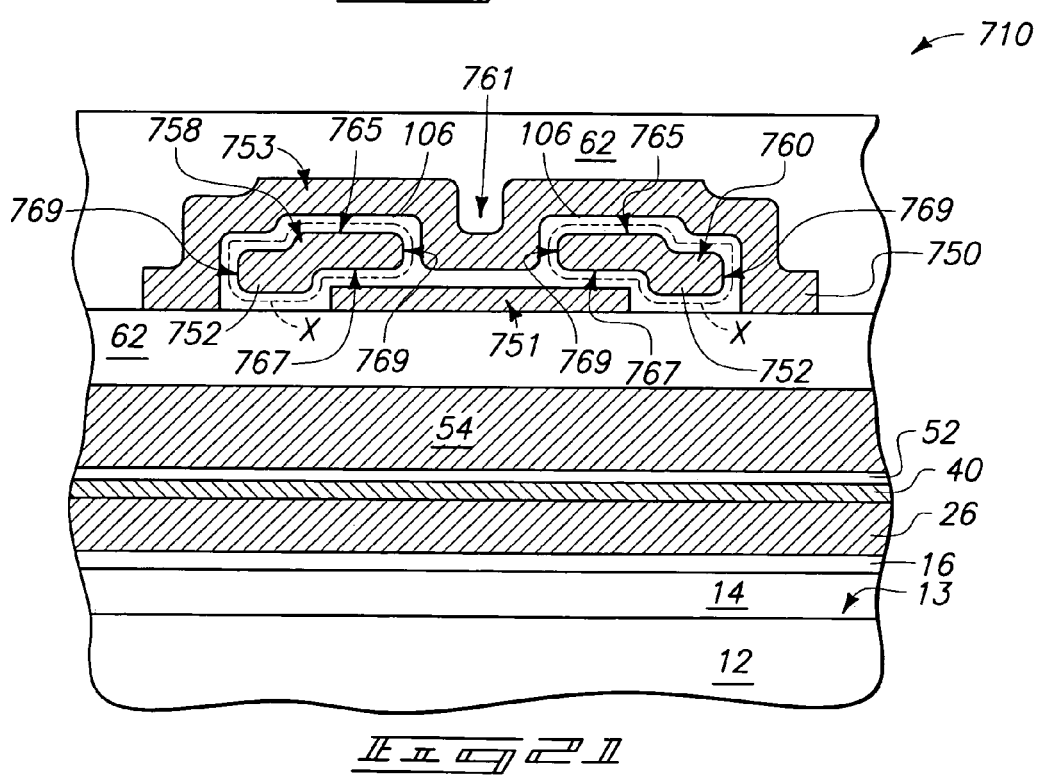
_Fig. 21_

⊠ TOP LEVEL CONTACT
▨ BOTTOM LEVEL CONTACT

☒ TOP LEVEL CONTACT
■ BOTTOM LEVEL CONTACT

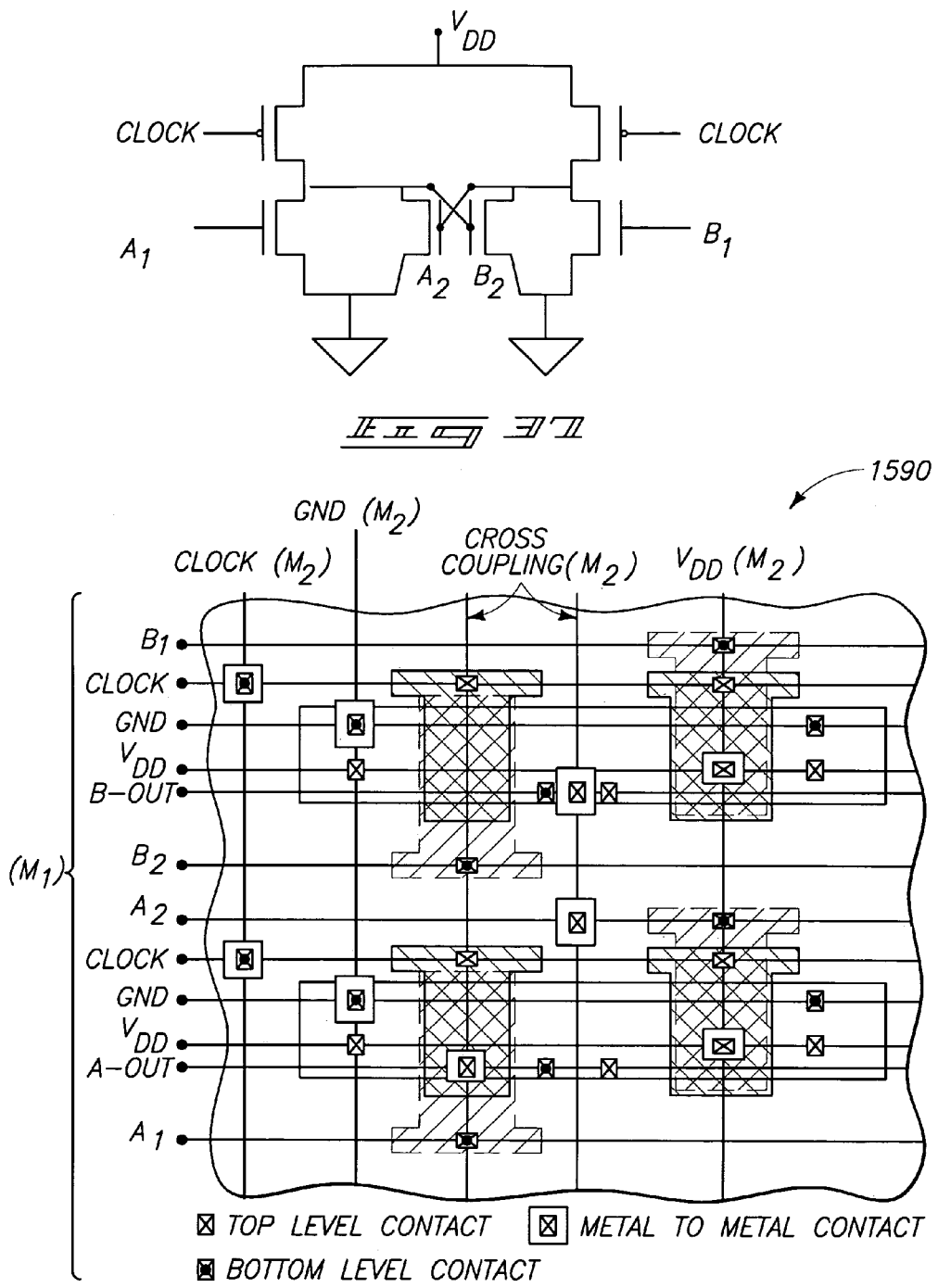

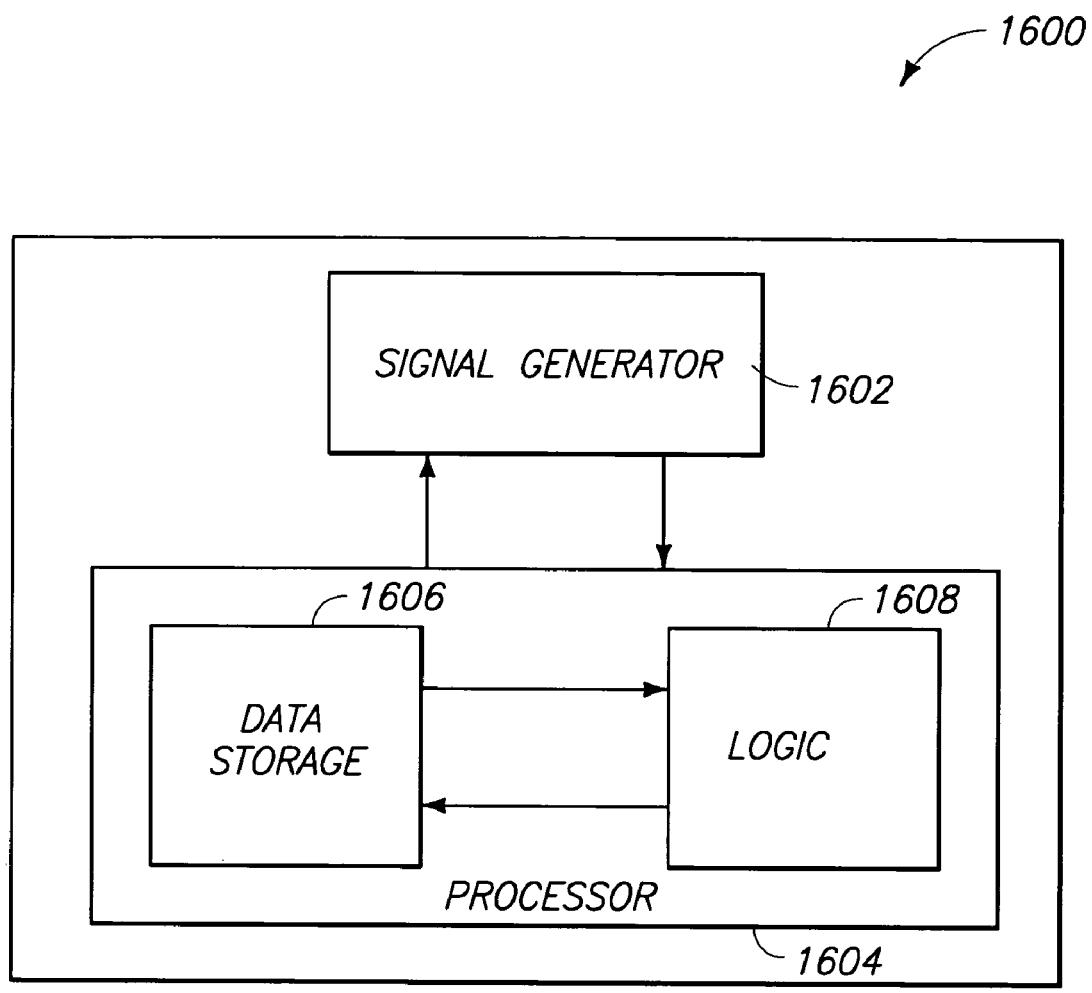

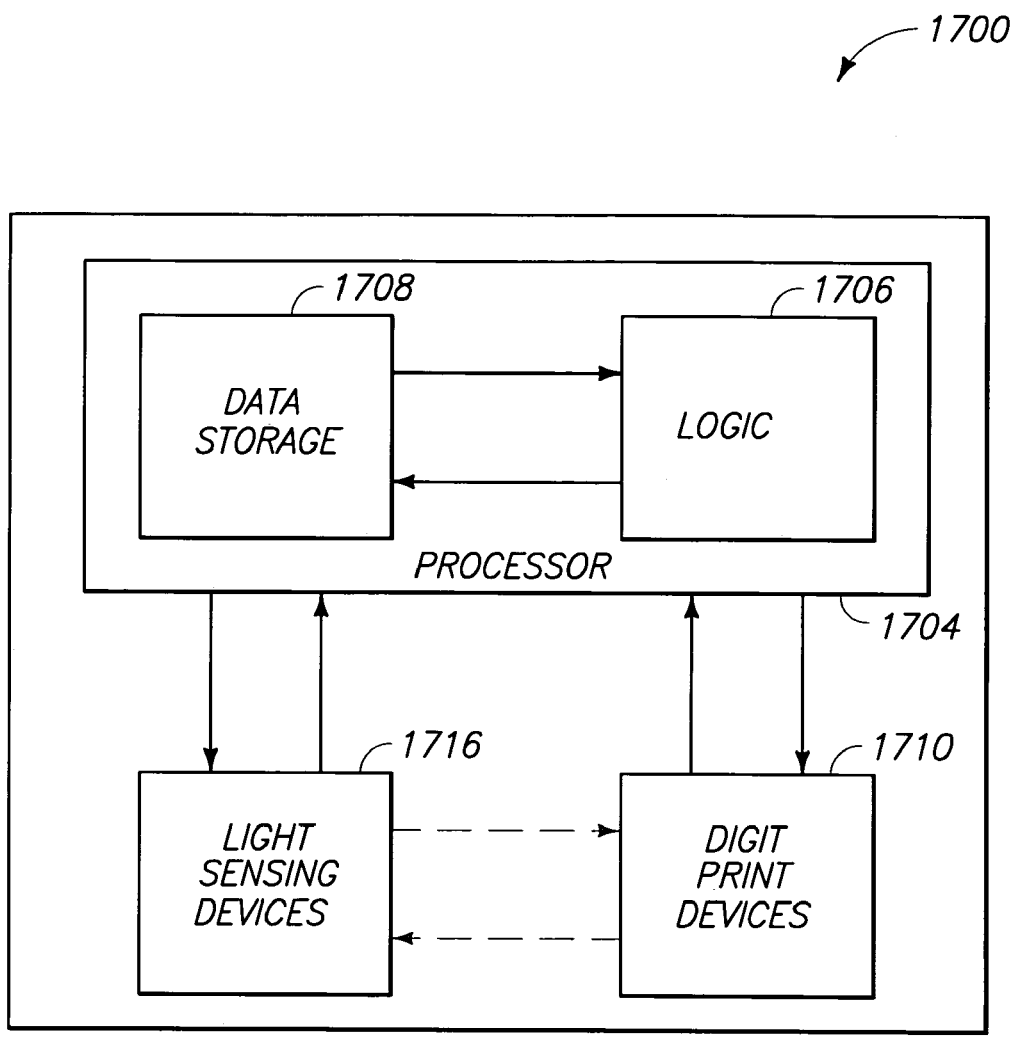

METHODS FOR MACHINE DETECTION OF AT LEAST ONE ASPECT OF AN OBJECT, METHODS FOR MACHINE IDENTIFICATION OF A PERSON, AND METHODS OF FORMING ELECTRONIC SYSTEMS

RELATED PATENT DATA

This patent resulted from a continuation application of U.S. patent application Ser. No. 10/386,619, which was filed Mar. 11, 2003 now U.S. Pat. No. 6,845,034.

TECHNICAL FIELD

The invention pertains to electronic systems. In particular aspects, the invention pertains to constructions for detecting at least one property of an object, and in further aspects the invention pertains to assemblies for identifying persons.

BACKGROUND OF THE INVENTION

SOI technology differs from traditional bulk semiconductor technologies in that the active semiconductor material of SOI technologies is typically much thinner than that utilized in bulk technologies. The active semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs thus have limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353–356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567–570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563–566; Jeon, J. H. et al., "A New Poly-Si TFT with Selectively Doped Channel Fabricated by Novel Excimer Laser Annealing", IEDM Tech. Digest, 2000, pp. 213–216; Kim, C. H. et al., "A New High-Performance Poly-Si TFT by Simple Excimer Laser Annealing on Selectively Floating a Si Layer", IEDM Tech. Digest, 2001, pp. 753–756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209–212; and Hara, A. et al., "High Performance Poly-Si TFTs on a Glass by a Stable Scanning CW Laser Lateral Crystallization", IEDM Tech. Digest, 2001, pp. 747–750). Such techniques have allowed relatively defect-free large crystals to be grown, with resulting TFTs shown to exhibit carrier mobility over 300 $cm^2$/V-second.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-induced-Lateral-Crystallization", IEDM Tech. Digest, 1999, p. 293–296; and Gu, J. et al., "High Performance Sub-100 nm Si TFT by Pattern-Controlled Crystallization of Thin Channel Layer and High Temperature Annealing", DRC Conference Digest, 2002, pp. 49–50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickel-induced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59–60; Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14; Huang, L. J. et al., "Carrier Mobility Enhancement in Strained Si-on-Insulator Fabricated by Wafer Bonding", VLSI Tech. Digest, 2001, pp. 57–58; and Mizuno, T. et al., "High Performance CMOS Operation of Strained-SOI MOSFETs Using Thin Film SiGe-on-Insulator Substrate", VLSI Tech. Digest, 2002, p. 106–107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60–80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, 00. 98–99; and Huang, L. J. et al., "Carrier Mobility Enhancement in Strained Si-on-Insulator Fabricated by Wafer Bonding", VLSI Tech. Digest, 2001, pp. 57–58).

Performance enhancements of standard field effect transistor devices are becoming limited with progressive lithographic scaling in conventional applications. Accordingly, strained-latticechanneled-field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

SUMMARY OF THE INVENTION

In one aspect, the invention includes electronic systems in which a processor is in data communication with a signal generator. The processor includes a device having an active region extending into a crystalline layer comprising silicon and germanium. In particular aspects, the device can be a data storage device, and in other aspects the device can be a logic device. The active region within the crystalline layer can be predominately or entirely within a single crystal of the crystalline layer.

In particular aspects, the invention includes electronic systems configured for detecting one or more properties of an object. The detected properties can include a pattern of light received from the object (such as light reflected from the object), and/or a surface topography of the object.

In further aspects, the invention can include assemblies for identifying persons. Such assemblies can include at least one light sensing unit for detecting light reflecting from a person, and can further include at least one structure for detecting a surface topography of a digit. The assembly can further comprise a processor which receives data signals from the light sensing unit and the topography detecting structure. The processor can include a device having an active region which extends into a crystalline layer comprising silicon and germanium.

BRIEF DESCRIPTION OF THE DRAWINGS

Preferred embodiments of the invention are described below with reference to the following accompanying drawings.

FIG. 20 is a diagrammatic, cross-sectional view along the line 20—20 of FIG. 19, illustrating an exemplary memory device of the present invention.

FIG. 21 is a cross-sectional view along the line 21—21 of FIG. 19, illustrating another view of the exemplary memory device.

FIG. 37 illustrates a circuit schematic of an exemplary two-NOR cross-coupled latch (flip-flop) logic construction according to an aspect of the present invention.

FIG. 38 is a diagrammatic, fragmentary, top view of an exemplary two-NOR cross-coupled latch (flip-flop) logic construction according to an aspect of the present invention.

FIG. 39 is a diagrammatic view of an electronic assembly in accordance with an aspect of the present invention.

FIG. 40 is a diagrammatic view of an electronic assembly which can be utilized for identifying features of objects in accordance with exemplary methodology of the present invention.

FIG. 41 is a diagrammatic, cross-sectional fragmentary view of an exemplary arrangement of device components which can be utilized in an assembly configured for identification of persons in accordance with exemplary aspects of the present invention.

DETAILED DESCRIPTION OF THE PREFERRED EMBODIMENTS

The invention pertains to various data storage devices, logic devices, and electronic systems comprising data storage devices and logic devices. Prior to the discussion of the exemplary data storage devices, logic devices and electronic systems, a processing sequence for forming and utilizing preferred Si/Ge materials is described with reference to FIGS. 1–9.

Figure 1:
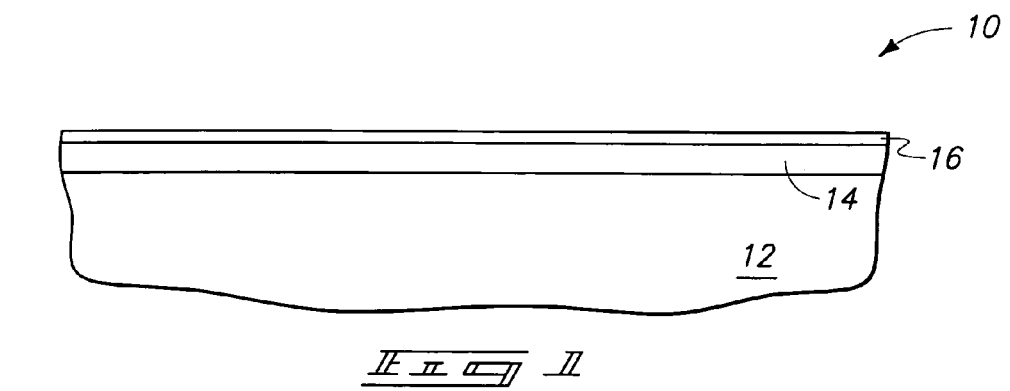
FIG. 1 is a diagrammatic, cross-sectional view of a fragment of a semiconductor construction shown at a preliminary stage of an exemplary process of the present invention.

Referring to FIG. 1, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. In the shown construction, insulator layer 14 is in physical contact with base 12. It is to be understood, however, that there can be intervening materials and layers provided between base 12 and layer 14 in other aspects of the invention (not shown). For example, a chemically passive thermally stable material, such as silicon nitride ($Si_3N_4$), can be incorporated between base 12 and layer 14. Layer 14 can have a thickness of, for example, from about 200 nanometers to about 500 nanometers, and can be referred to as a buffer layer.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/cm$^3$ to about $10^{20}$ atoms/cm$^3$. The dopant can be either n-type or p-type, or a combination of n-type and p-type.

The silicon utilized in layer 16 can be either polycrystalline silicon or amorphous silicon at the processing stage of FIG. 1. It can be advantageous to utilize amorphous silicon in that it is typically easier to deposit a uniform layer of amorphous silicon than to deposit a uniform layer of polycrystalline silicon.

Figure 2:
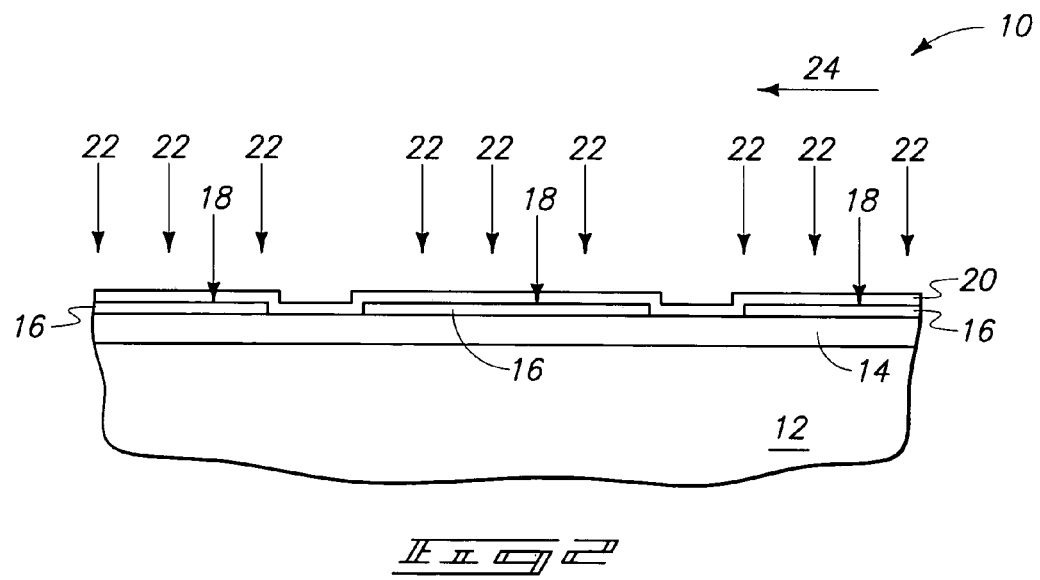
FIG. 2 is a view of the FIG. 1 fragment shown at a processing stage subsequent to that of FIG. 1.

Referring to FIG. 2, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18. The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Figure 3:
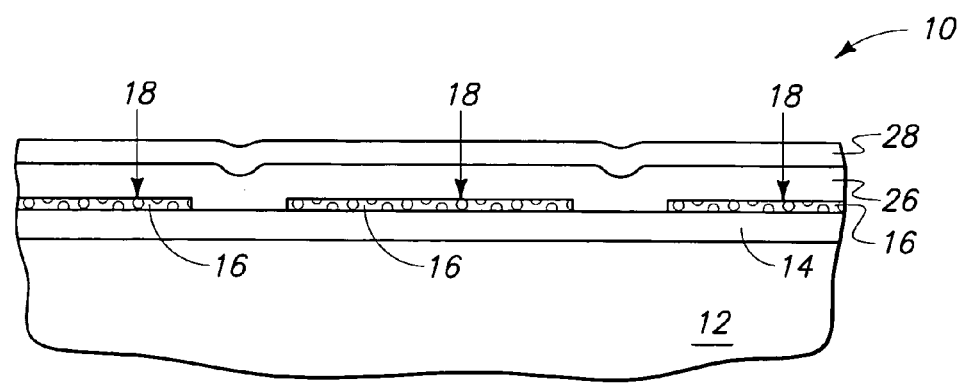
FIG. 3 is a view of the FIG. 1 fragment shown at a processing stage subsequent to that of FIG. 2.

Referring to FIG. 3, islands 18 are illustrated after voids have been formed therein. Additionally, small crystals (not shown) have also been formed within islands 18 as discussed above.

Capping layer 20 (FIG. 2) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 26 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Figure 4:
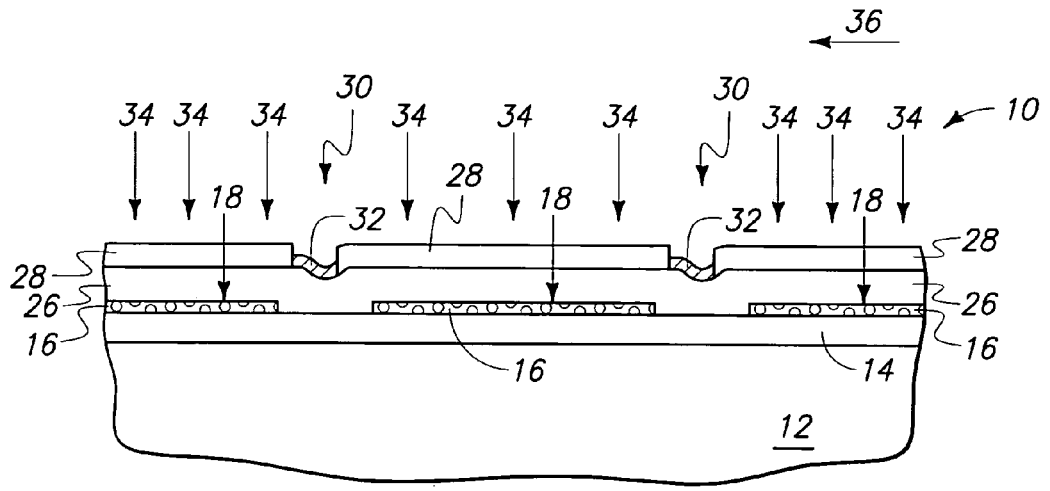
FIG. 4 is a view of the FIG. 1 fragment shown at a processing stage subsequent to that of FIG. 3.

Referring to FIG. 4, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 4) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of the nanovoids; but leaving at least some of the seed crystals within layer 16 that had been formed-with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 2.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si—Ge layer 26 (which improves carrier mobility); (2) stress-relief of Si—Ge layer 26; and (3) enhancement of recrystallization of Si—Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26. The annealing option can be dependent on the thermal stability of the material selected for substrate 12.

Figure 5:
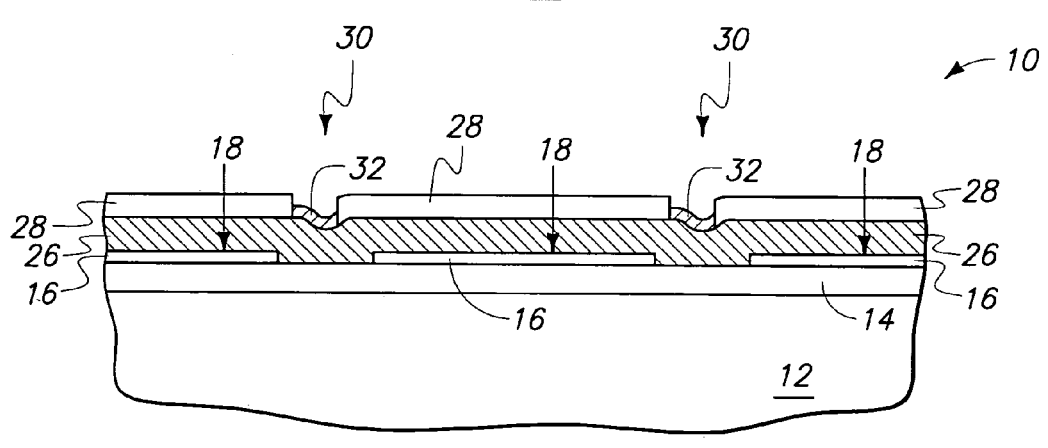
FIG. 5 is a view of the FIG. 1 fragment shown at a processing stage subsequent to that of FIG. 4.

FIG. 5 shows construction 10 after the processing described above with reference to FIG. 4. Specifically, the voids that had been in material 16 are absent due to the oxidation of material 16. Also, semiconductive material 26 has been transformed into a crystalline material (illustrated diagrammatically by the cross-hatching of material 26 in FIG. 5). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

The shown metal layers 32 are effectively in a one-to-one relationship with islands 18, and such one-to-one correspondence of crystals to islands can occur during the MILC. Specifically, single crystals can be generated relative to each of islands 18 during the MILC process described with reference to FIG. 4. It is also noted, however, that although the metal layers 32 are shown in a one-to-one relationship with the islands in the cross-sectional views of FIGS. 4 and 5, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Figure 6:
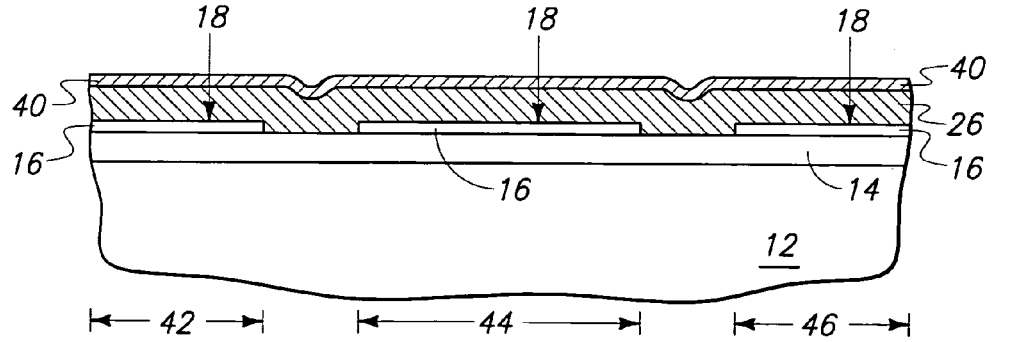
FIG. 6 is a view of the FIG. 1 fragment shown at a processing stage subsequent to that of FIG. 5.

Referring to FIG. 6, layers 28 and 32 (FIG. 5) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57–58; and Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across the majority of a given active region, and preferably so that only one single crystal extends across the entirety of a given active region. In other words, active region 42 will preferably comprise a single crystal of material 26, active region 44 will comprise a single crystal of the material, and active region 46 will comprise a single crystal of the material, with the single crystals being separate and discrete relative to one another.

Figure 7:
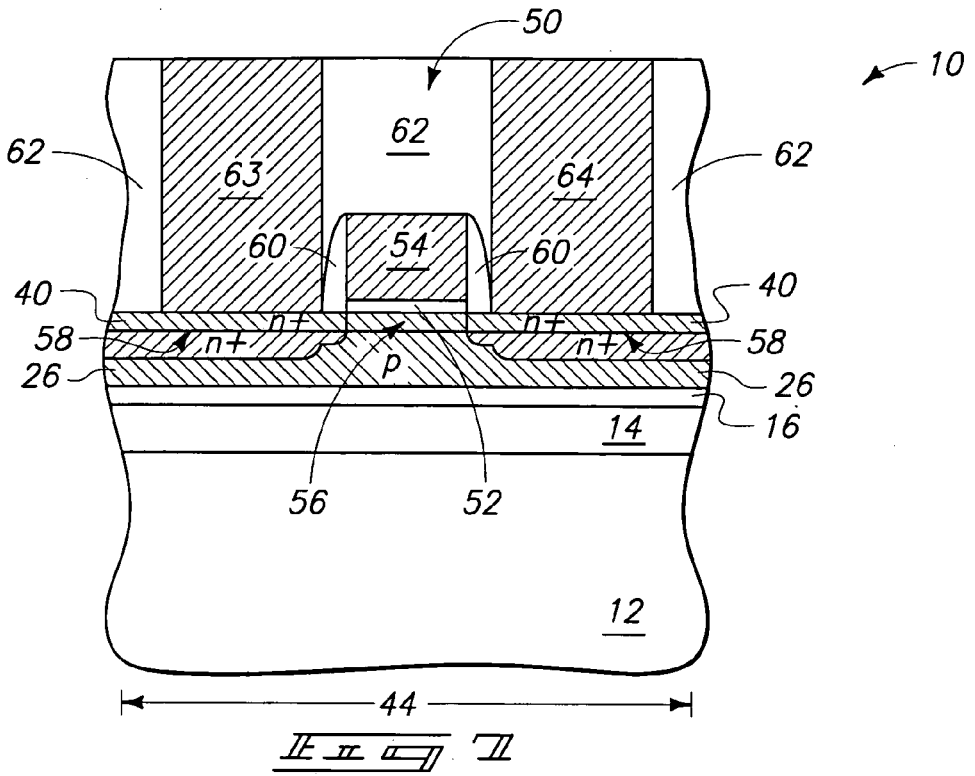
FIG. 7 is an expanded region of the FIG. 6 fragment shown at a processing stage subsequent to that of FIG. 6 in accordance with an exemplary embodiment of the present invention, and shows an n-channel device.

FIG. 7 shows an expanded view of active region 44 at a processing stage subsequent to that of FIG. 6, and specifically shows a field effect transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n$^+$ concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the majority of the portion of the active region within crystalline material 26 is associated with only one single crystal of material 26. More preferably an entirety of the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 7 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress).

As mentioned above, strained lattice 40 can comprise other materials alternatively to, or additionally to, silicon. The strained lattice can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium for an NFET device.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

Figure 8:
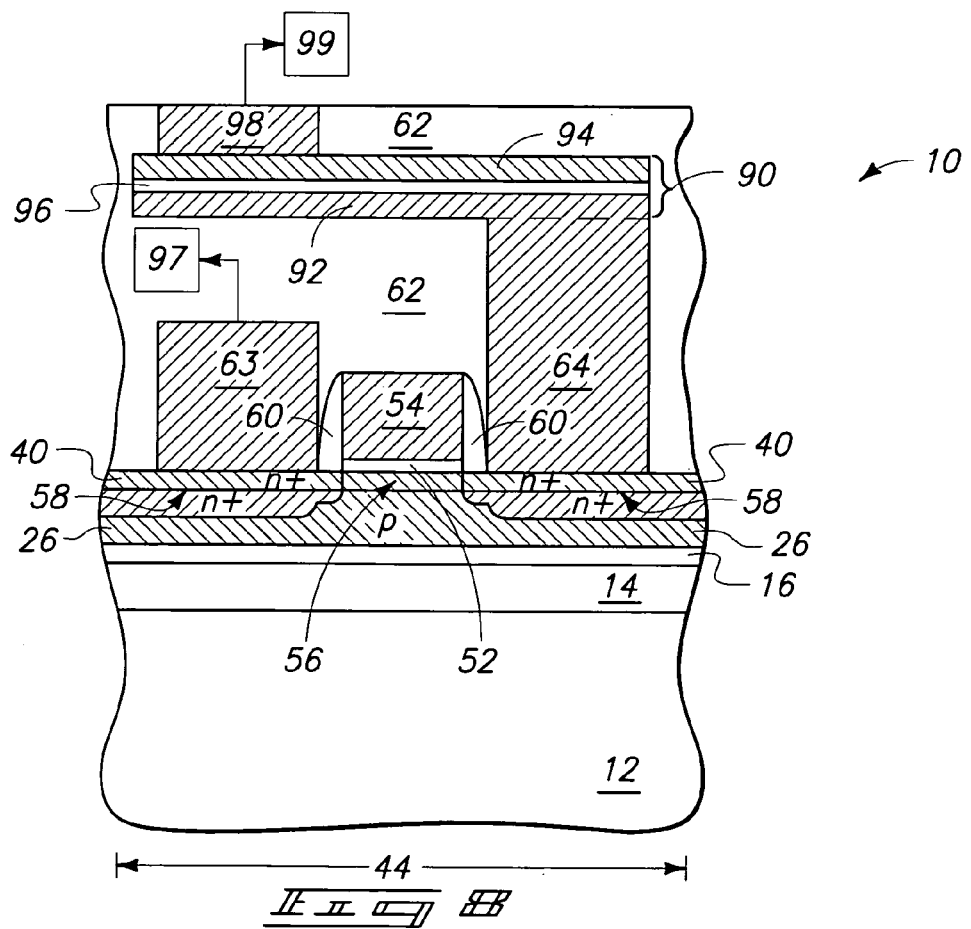
FIG. 8 is a view of the FIG. 7 fragment shown at a processing stage subsequent to that of FIG. 7.

FIG. 8 shows construction 10 at a processing stage subsequent to that of FIG. 7, and shows a capacitor structure 90 formed over and in electrical contact with conductive interconnect 64. The shown capacitor structure extends across gate 54 and interconnect 63.

Capacitor construction 90 comprises a first capacitor electrode 92, a second capacitor electrode 94, and a dielectric material 96 between capacitor electrodes 92 and 94. Capacitor electrodes 92 and 94 can comprise any appropriate conductive material, including, for example, conductively-doped silicon. In particular aspects, electrodes 92 and 94 will each comprise n-type doped silicon, such as, for example, polycrystalline silicon doped to a concentration of at least about $10^{21}$ atoms/cm$^3$ with n-type dopant. In a particular aspect of the invention, electrode 92, conductive interconnect 64 and the source/drain region 58 electrically connected with interconnect 64 comprise, or consist of, n-type doped semiconductive material. Accordingly, n-type doped semiconductive material extends from the source/drain region, through the interconnect, and through the capacitor electrode.

Dielectric material 96 can comprise any suitable material, or combination of materials. Exemplary materials suitable for dielectric 106 are high dielectric constant materials including, for example, silicon nitride, aluminum oxide, $TiO_2$, $Ta_2O_5$, $ZrO_2$, etc.

The conductive interconnect 63 is in electrical connection with a bitline 97. Top capacitor electrode 94 is shown in electrical connection with an interconnect 98, which in turn connects with a reference voltage 99, which can, in particular aspects, be ground. The construction of FIG. 8 can be considered a DRAM cell, and such can be incorporated into an electronic system (such as, for example, a computer system) as a memory device.

Figure 9:
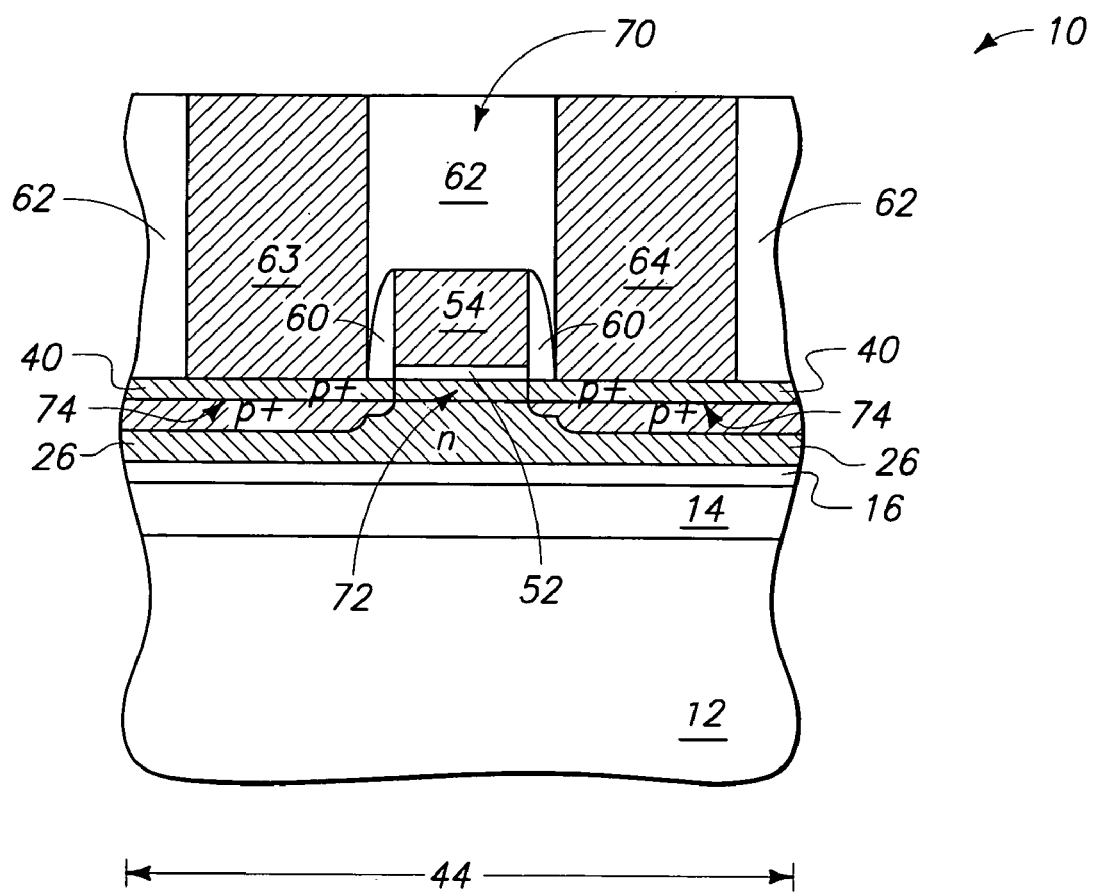
FIG. 9 is a view of an expanded region of FIG. 6 shown at a processing stage subsequent to that of FIG. 6 in accordance with an alternative embodiment relative to that of FIG. 7, and shows a p-channel device.

FIG. 9 shows construction 10 at a processing stage subsequent to that of FIG. 6 and alternative to that described previously with reference to FIG. 7. In referring to FIG. 9, similar numbering will be used as is used above in describing FIG. 7, where appropriate.

A transistor construction 70 is shown in FIG. 9, and such construction differs from the construction 50 described above with reference to FIG. 7 in that construction 70 is a p-type field effect transistor (PFET) rather than the NFET of FIG. 7. Transistor device 70 comprises an n-type doped channel region 72 and p$^+$-doped source/drain regions 74. In other words, the channel region and source/drain regions of transistor device 70 are oppositely doped relative to the channel region and source/drain regions described above with reference to the NFET device 50 of FIG. 7.

The strained crystalline lattice material 40 of the PFET device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

Devices similar to the transistor devices discussed above (NFET device 50 of FIG. 7, and PFET device 70 of FIG. 9) can be utilized in numerous constructions. Exemplary constructions are described in the FIGS. 10–38 that follow.

Figure 10:
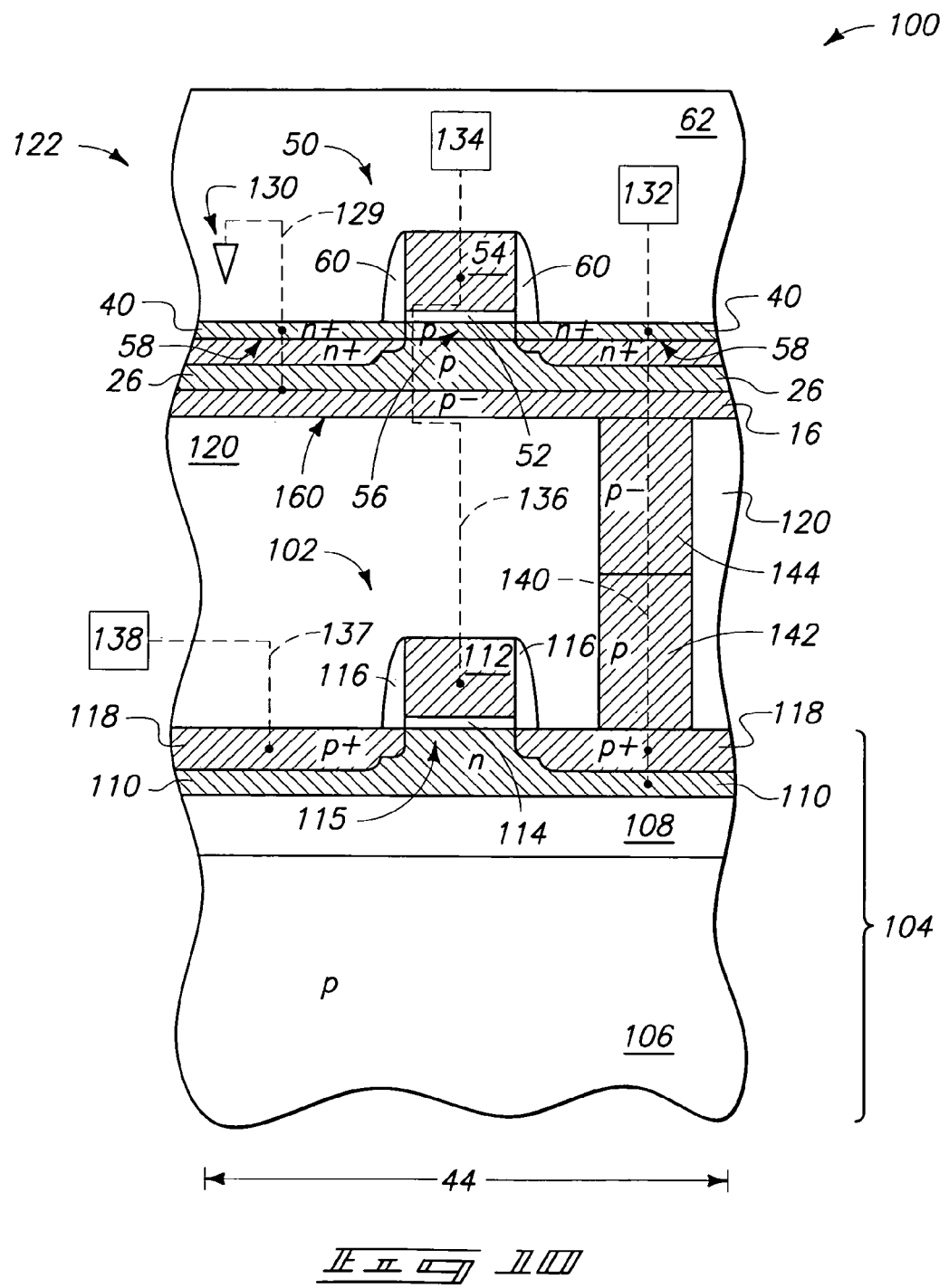
FIG. 10 is a diagrammatic, cross-sectional view of a semiconductor fragment illustrating an exemplary CMOS inverter construction in accordance with an aspect of the present invention.

Referring to FIG. 10, a CMOS inverter construction 100 is illustrated. The inverter comprises a first transistor device 102, and a second transistor device 50 stacked over the first transistor device. In the shown construction, the upper transistor is an NFET device and the lower transistor is a PFET device; but it is to be understood that the order of the devices can be reversed in other aspects of the invention (not shown).

Transistor device 102 is shown supported by a substrate 104 comprising three discrete materials. A first material of the substrate is a p-type doped semiconductive material mass 106, such as, for example, p-type doped monocrystalline silicon. The monocrystalline silicon can be, for example, in the form of a bulk silicon wafer.

The second portion of substrate 104 is an insulative material 108 formed over mass 106. Material 108 can comprise, for example, silicon dioxide.

The third portion of substrate 104 is a layer 110 of semiconductive material. Such material can comprise, for example, silicon, or a combination of silicon and germanium. Material 110 can correspond to a thin film of semiconductive material, and accordingly layers 110 and 108 can be considered to correspond to a semiconductor-on-insulator construction. Semiconductive material 110 is doped with n-type dopant.

Transistor device 102 comprises a transistor gate 112 over semiconductive material 110, and separated from semiconductive material 110 by a dielectric material 114. Gate 112 can comprise any suitable construction, and in particular aspects will comprise one or more of conductively-doped silicon, metal, and metal compounds (such as, for example, metal silicides). Dielectric material 114 can comprise, for example, silicon dioxide.

Sidewall spacers 116 are formed along sidewalls of gate 112, and can comprise, for example, one or both of silicon dioxide and silicon nitride.

Source/drain regions 118 extend into semiconductive material 110. Accordingly, in the shown embodiment source/drain regions 118 can be considered to extend into a thin film of an SOI construction. A channel region 115 is within n-type doped semiconductive material 110, and between source/drain regions 118.

An insulative material 120 is provided over device 102, and over substrate 104. Material 120 can comprise any suitable material, including, for example, borophosphosilicate glass (BPSG) and/or silicon dioxide.

A construction 122 comprising an NFET device 50 (of the type described above with reference to FIG. 7) is formed over insulative material 120. More specifically, construction 122 includes layers 16, 26 and 40, together with transistor gate 54. Layer 16 is preferably electrically conductive, and in the shown application is p-type doped. Layer 16 can consist essentially of, or consist of, a silicon seed material together with an appropriate dopant. It is noted that in the discussion of FIGS. 1–5 it was indicated that material 16 could be oxidized during formation of crystalline materials thereover. In embodiments of the type shown in FIG. 10 it can be preferred that material 16 not be appreciably oxidized during the processing of FIGS. 1–5, but instead remain almost entirely as a non-oxidized form of silicon.

In particular aspects of the invention, layer 16 can be formed by epitaxial growth from a crystalline semiconductive material 144 (discussed below). Accordingly, several steps of the process described in FIGS. 2–6 for forming seed layer 16 can be replaced with an epitaxial growth of the seed layer. The seed layer 16 can be doped with an appropriate dopant utilizing, for example, an implant of the dopant.

Layers 26 and 40 can correspond to a relaxed crystalline lattice material and a strained crystalline lattice material, respectively, as discussed previously with reference to FIGS. 1–7. The material 26 can comprise, consist essentially of, or consist of appropriately doped silicon/germanium; and the layer 40 can comprise, consist essentially of, or consist of appropriately doped silicon, or can comprise, consist essentially of, or consist of appropriately doped silicon/germanium.

Layers 16, 26 and 40 can be considered to be crystalline layers supported over substrate 104. In particular aspects, all of layers 16, 26 and 40 are crystalline, and can be considered to together define a crystalline structure.

N-type doped source/drain regions 58 extend into layers 26 and 40. In the shown construction, source/drain regions 58 of NFET device 50 are directly over and aligned with source/drain regions 118 of PFET device 102, and gate 54 of NFET device 50 is directly over and aligned with gate 112 of PFET device 102.

The inverter construction 100 of FIG. 10 can function as a basic CMOS. Specifically, transistor device 102 corresponds to a PFET device and transistor device 50 corresponds to an NFET device. One of source/drain regions 58 of the NFET device is electrically connected with ground 130 (through an interconnect 129 shown in dashed line) and the other is electrically connected with an output 132 (through an interconnect 140 shown in dashed line). The ground interconnect 129 also connects to the NFET body node 16/26 as shown. Gate 54 of the NFET device is electrically connected with an input 134, and is also electrically tied to gate 112 of the PFET device through an interconnect 136 (shown in dashed line). One of source/drain regions 118 of device 102 is connected with $V_{DD}$ 138 (through an interconnect 137 shown in dashed line), and the other source/drain region 118 as well as the n-type body 110 of the PFET are electrically connected with a source/drain region 58 of device 50 through interconnect 140.

Interconnect 136 is illustrated extending around layers 16, 26 and 40 of construction 122. Interconnect 136 does note physically connect layers 16, 26 and 40. Interconnect 136 connects the extensions of gates 112 and 54 in the non-active regions into or out of the page (the non-active regions are not shown in the cross-sectional view of FIG. 10). Such can be accomplished by conventional interconnect/via technology.

Interconnect 140 is shown schematically to connect the electrical nodes of the n-type body of the bottom PFET, one of the source/drain p+ nodes 118 of the bottom PFET, and one of the n+ nodes 40/58 of the source/drain of the top NFET. It is to be understood that the two p-type doped regions 142/144 resistively connect one of the source/drain nodes of the bottom PFET to the p-type body 16/26/56 of the top NFET.

Regions 142 and 144 can be considered to be separate portions of a p-type doped vertical layer (i.e., vertically extending layer), or can be considered to be separate vertical layers. Portion 142 is shown to be more heavily doped than is portion 144.

In the shown aspect of the invention, layer 16 comprises a p-type doped semiconductive material, such as, for example, p-type doped silicon. Also, it is noted that layer 16 is preferably either entirely one single crystal, or if layer 16 is polycrystalline, individual crystals are preferably as large as the preferred individual crystals of layers 26 and 40. One or both of the p-type doped semiconductor materials 16 and 26 can be more heavily doped than one or both of the vertical layers 142 and 144 between layer 16 and source/drain region 118; or one or both of the materials 16 and 26 can be comparably doped to one or both of layers 142 and 144 of the vertically extending pillar.

Figure 11:
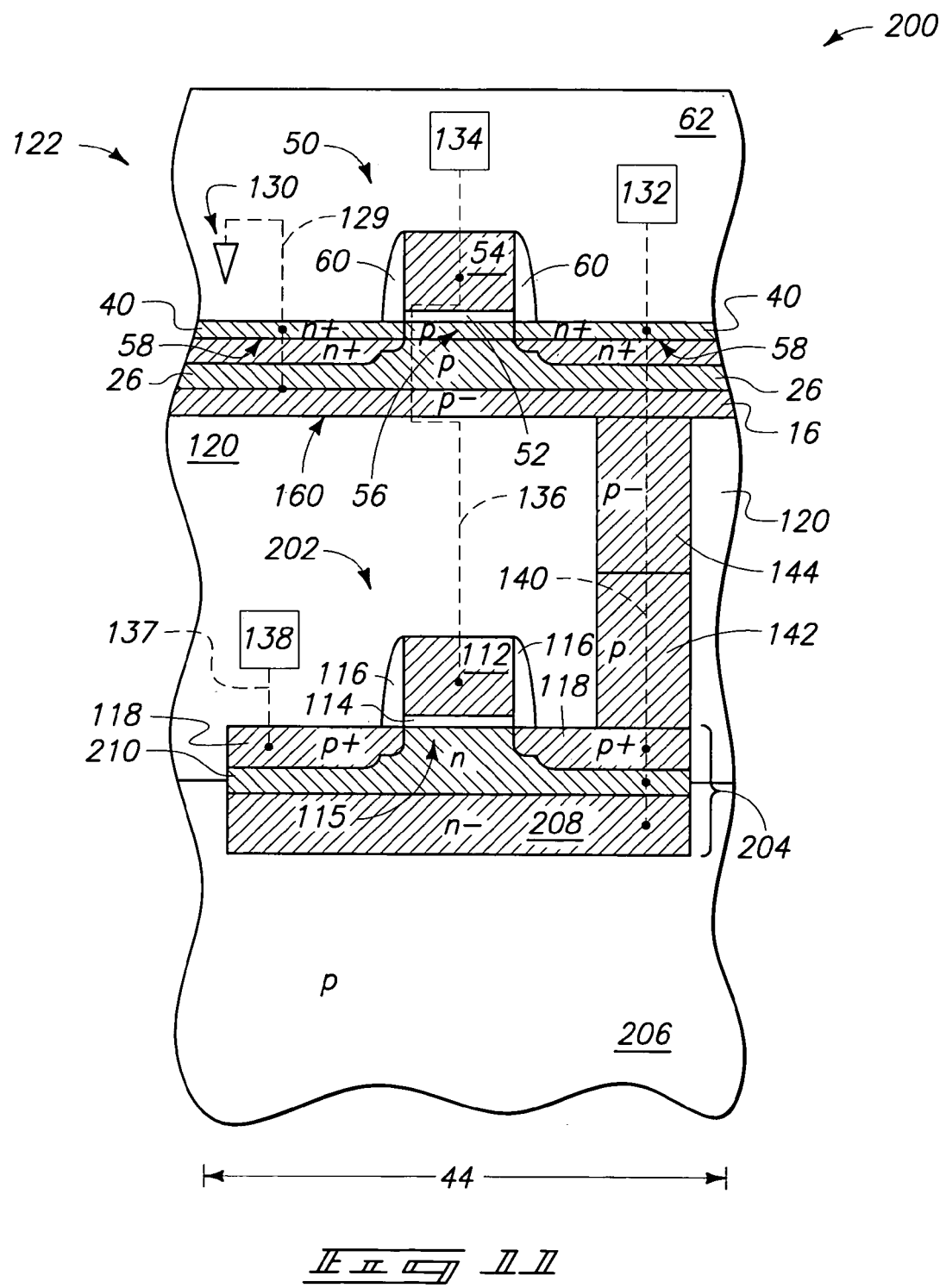
FIG. 11 is a diagrammatic, cross-sectional view of a semiconductor fragment illustrating another exemplary CMOS inverter construction.

FIG. 11 illustrates an alternative embodiment inverter relative to that described above with reference to FIG. 10. Many components of the FIG. 11 inverter are identical to those described above with reference FIG. 10. Identical numbering will be utilized in describing the embodiment of FIG. 11 relative to that used above in describing the embodiment of FIG. 10, where appropriate.

FIG. 11 illustrates an inverter structure 200 which is similar to the structure 100 of FIG. 10 in that it comprises an NFET device stacked over a PFET device. The NFET device is labeled as a device 50, and corresponds identically to the device 50 described above with reference to FIG. 10.

Construction 200 differs from construction 100 (FIG. 10) in the configuration of the PFET device. Specifically, the PFET device of construction 200 is labeled as 202, and is supported by: a block 204 of semiconductive material extending into a p-type doped semiconductor substrate 206.

Substrate 206 can comprise, for example, bulk monocrystalline p-doped silicon.

Block 204 comprises a lower n-type doped region 208 which can comprise, consist essentially of, or consist of n-type doped silicon such as, for example, an n-type doped region formed as an ion-implanted well region over substrate 206.

Block 204 also comprises an upper n-type doped region 210 which is of higher n-type impurity doping level than is region 208, and in the shown construction is illustrated as being an n region. Material 210 can comprise, consist essentially of, or consist of n-type doped silicon/germanium, such as, for example, a single crystal-silicon germanium material epitaxially grown over layer 208.

Transistor device 202 comprises the gate 112 and source/drain regions 118 described previously with reference to FIG. 10. However, source/drain regions 118 are formed within the material 210 of block 204 in construction 200, rather than being formed within the thin film 110 of semiconductive material described with reference to FIG. 10. Source/drain regions 118 of device 202 therefore can, in particular aspects, be considered to extend into the silicon/germanium material 210 associated with block 204.

The material 210 is preferably a single crystal material, but it is to be understood that the material 210 can also be polycrystalline.

Figure 12:
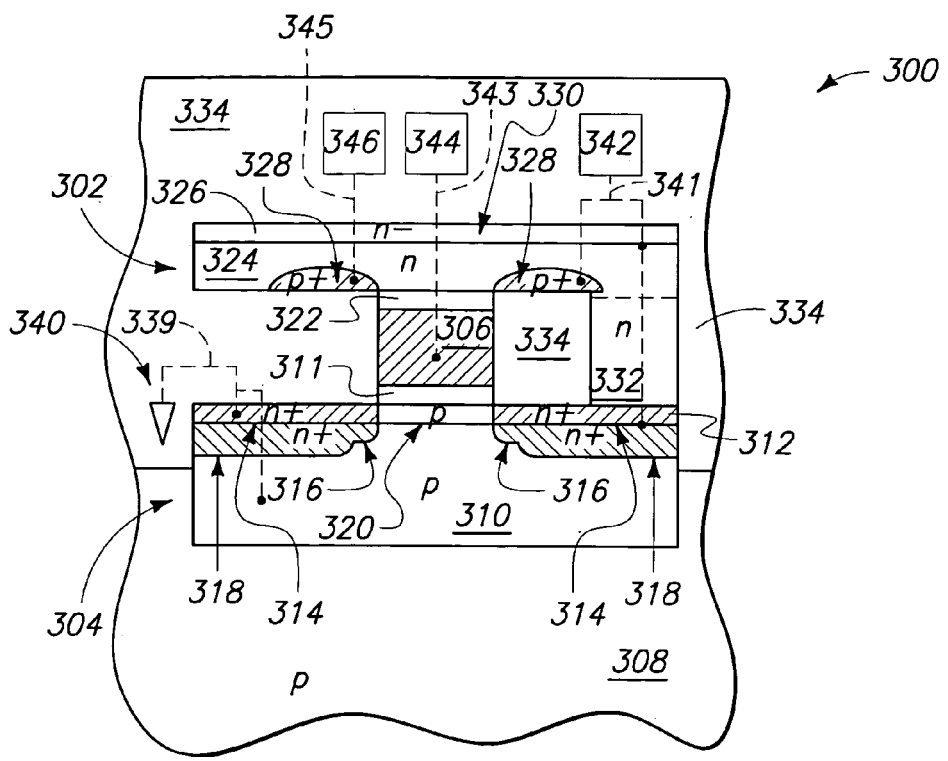
FIG. 12 is a diagrammatic, cross-sectional view of a semiconductor fragment illustrating another exemplary CMOS inverter construction in accordance with an aspect of the present invention.

Another exemplary CMOS inverter construction 300 is shown in FIG. 12. Construction 300 includes a PFET device 302 stacked over an NFET device 304. The PFET and NFET device share a transistor gate 306.

NFET device 304 is formed over a bulk substrate 308. Substrate 308 can comprise, for example, a monocrystalline silicon wafer lightly-doped with a background p-type dopant.

A block 310 of p-type doped semiconductive material extends into substrate 308. Block 310 can comprise, for example, silicon/germanium, with the germanium being present to a concentration of from about 10 atomic % to about 60 atomic %. The silicon/germanium of material 310 can have a relaxed crystalline lattice in particular aspects of the invention. Material 310 can be referred to as a first layer in the description which follows.

A second layer 312 is over first layer 310. Second layer 312 comprises an appropriately-doped semiconductive material, and in particular applications will comprise a strained crystalline lattice. Layer 312 can, for example, comprise doped silicon/germanium having a strained crystalline lattice, with the germanium concentration being from about 10 atomic % to about 60 atomic %.

Gate 306 is over layer 312, and separated from layer 312 by a dielectric material 311. The dielectric material can comprise, for example, silicon dioxide.

Gate 306 can comprise any appropriate conductive material, including, for example, conductively-doped semiconductor materials (such as conductively-doped silicon), metals, and metal-containing compositions. In particular aspects, gate 306 will comprise a stack of materials, such as, for example, a stack comprising conductively-doped silicon and appropriate metal-containing compositions.

Source/drain regions 314 extend into layers 312 and 310. The source/drain regions are heavily doped with n-type dopant. In particular aspects, sidewall spacers (not shown) can be formed along sidewalls of gate 306.

The shown source/drain regions 314 have a bottom periphery indicating that the regions include shallow portions 316 and deeper portions 318. The shallow portions 316 can correspond to, for example, lightly doped diffusion regions.

NFET device 304 comprises a p-type doped region beneath gate 306 and between source/drain regions 314. Such p-type doped region corresponds to a channel region 320 extending between source/drain regions 314.

An active region of NFET device 304 can be considered to include source/drain regions 314 and the channel region between the source/drain regions. Such active region can, as shown, include a portion which extends across layer 312, and another portion extending into layer 310. Preferably, the majority of the active region within portion 310 is contained in a single crystal, and more preferably the entirety of the active region within portion 310 is contained in a single crystal. Accordingly, the shown layer 310 is preferably monocrystalline or polycrystalline with very large individual crystals. It can be further preferred that the majority or even entirety of the active region within layer 312 also be contained within a single crystal, and accordingly it can be preferred that layer 312 also be monocrystalline or polycrystalline with very large individual crystals. Further, layer 312 can be formed by epitaxial growth over layer 310, and accordingly layers 312 and 310 can both be considered to be part of the same crystalline structure. The entirety of the shown active region can thus be contained within only one single crystal that comprises both of layers 310 and 312.

A dielectric material 322 is formed over gate 306. Dielectric material 322 can comprise, for example, silicon dioxide.

A layer 324 is formed over dielectric material 322. Layer 324 can be referred to as a third layer to distinguish layer 324 from first layer 310 and second layer 312. Layer 324 can comprise, for example, a crystalline semiconductive material, such as, for example, crystalline Si/Ge. In particular aspects, layer 324 will be monocrystalline, and will comprise appropriately-doped silicon/germanium. The germanium content can be, for example, from about 10 atomic % to about 60 atomic %. In other aspects, layer 324 can be polycrystalline; and in some aspects layer 324 can be polycrystalline and have individual grains large enough so that an entirety of a portion of an active region of PFET device 302 within layer 324 is within a single grain.

A fourth layer 326 is formed over layer 324. Layer 326 can comprise, consist essentially of, or consist of appropriately-doped semiconductive material, such as, for example, appropriately-doped silicon. In the shown embodiment, layers 324 and 326 are n-type doped (with layer 326 being more lightly doped than layer 324), and layer 324 is incorporated into the PFET device 302.

Heavily-doped p-type source/drain regions 328 extend into layer 304. Source/drain regions 328 can be formed by, for example, an appropriate implant into layer 324. Layer 324 is n-type doped between source/drain regions 328, and comprises a channel region 330 that extends between source/drain regions 328.

A conductive pillar 332 extends from source/drain region 314 to layer 324, and accordingly electrically connects a source/drain region 314 with substrate 324. Electrically conductive material 332 can comprise, for example, n-type doped semiconductive material, as shown.

An insulative material 334 is provided over substrate 308, and surrounds the inverter comprising NFET device 304 and PFET device 302. Insulative material 334 can comprise, consist essentially of, or consist of any appropriate insulative material, such as, for example, borophosphosilicate glass (BPSG), and/or silicon dioxide.

The inverter construction 300 of FIG. 12 can function as a basic CMOS One of the source/drain regions 314 of the NFET device and the body 310 are electrically connected with ground 340 through interconnect 339 (shown in dashed line) and the other source/drain region of the NFET is electrically connected with an output 342 through interconnect 341 (shown in dashed line). Gate 306 is electrically connected with an input 344 through interconnect 343 (shown in dashed line). One of the source/drain regions 328 of PFET device 302 is connected with $V_{DD}$ 346 through interconnect 345 (shown in dashed line), while the other is electrically connected to output 342 through interconnect 341. The n-body of the PFET is also connected to the output interconnect 341.

Figure 13:
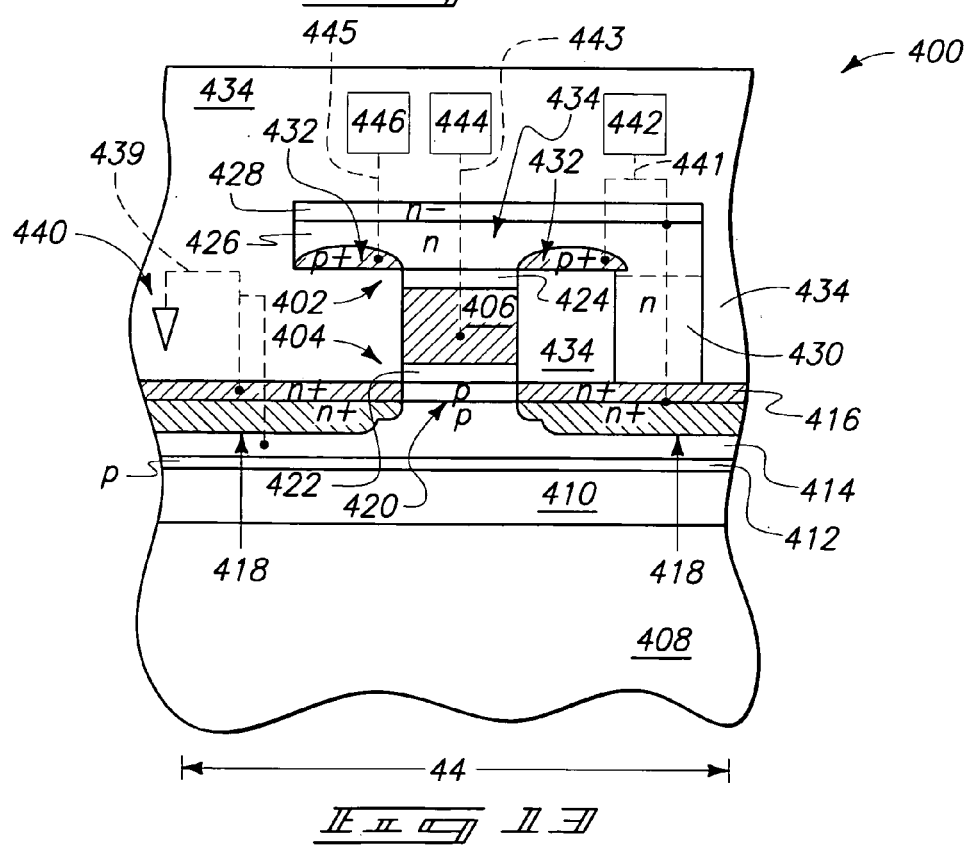
FIG. 13 is a diagrammatic, cross-sectional view of a semiconductor fragment illustrating another exemplary CMOS inverter construction.

FIG. 13 illustrates an alternative embodiment inverter relative to that described above with reference to FIG. 12. Specifically, FIG. 13 illustrates an inverter construction 400 comprising a PFET device 402 stacked over an NFET device 404. The PFET and NFET devices share a common gate 406.

Construction 400 comprises a substrate 408 and an insulator layer 410 over the substrate. Substrate 408 and insulator 410 can comprise, for example, the various materials described above with reference to substrate 12 and insulator 14 of FIG. 1.

A first layer 412, second layer 414 and third layer 416 are formed over insulator 410. Layers 412, 414 and 416 can correspond to, for example, identical constructions as layers 16, 26 and 40, respectively, of FIG. 7.

Layers 412, 414 and 416 can be initially doped with a p-type dopant. Subsequently, n-type dopant can be implanted into the layers to form heavily-doped source/drain regions 418.

A channel region 420 extends between source/drain regions 418, and under gate 406. An active region of the NFET device comprises source/drain regions 418 and channel region 420. Such active region includes a portion within layer 416, and another portion within layer 414. Preferably, the portion of the active region within layer 414 is predominately or even entirely contained within a single crystal of layer 414. A portion of the active region within layer 416 is preferably predominately or entirely within a single crystal of layer 416.

A dielectric material 422 is formed over layer 416, and is provided between layer 416 and gate 406. Dielectric material 422 can comprise, for example, silicon dioxide.

Sidewall spacers (not shown) can be provided along sidewalls of gate 406.

A second dielectric material 424 is provided over gate 406. Dielectric material 424 can comprise, for example, silicon dioxide.

A layer 426 of semiconductive material is provided over dielectric material 424, and a layer 428 of semiconductive material is provided over layer 426. Layer 426 can comprise, for example, appropriately-doped silicon/germanium, and layer 428 can comprise, for example, appropriately-doped silicon. Accordingly, layers 426 and 428 comprise constructions identical to those described with reference to layers 324 and 326 of FIG. 12.

A semiconductive material pillar 430 extends from layer 416 to layer 426.

P-type doped source/drain regions 432 extend into layer 426.

A channel region 434 extends between source/drain regions 432, and above gate 406.

An active region of the PFET device 402 includes source/drain regions 432 and channel region 434. In particular embodiments, such active region is predominately or even entirely contained within a single crystal of silicon/germanium layer 426.

The inverter of construction 400 can function as a basic CMOS. One of the source/drain regions 418 of the NFET device is electrically connected with ground 440 through interconnect 439 (shown in dashed line) while the other is electrically connected with an output 442 through interconnect 441 (shown in dashed line). Substrate 414 can also be connected to the ground interconnect 439, as shown. Gate 406 is electrically connected with an input 444 through interconnect 443 (shown in dashed line). One of the PFET source/drain regions 432 is electrically connected with the output interconnect 441, and the other is connected with $V_{DD}$ 446 through interconnect 445 (shown in dashed line). The n-doped body of the PFET is also connected to the output interconnect 441.

Figure 14:
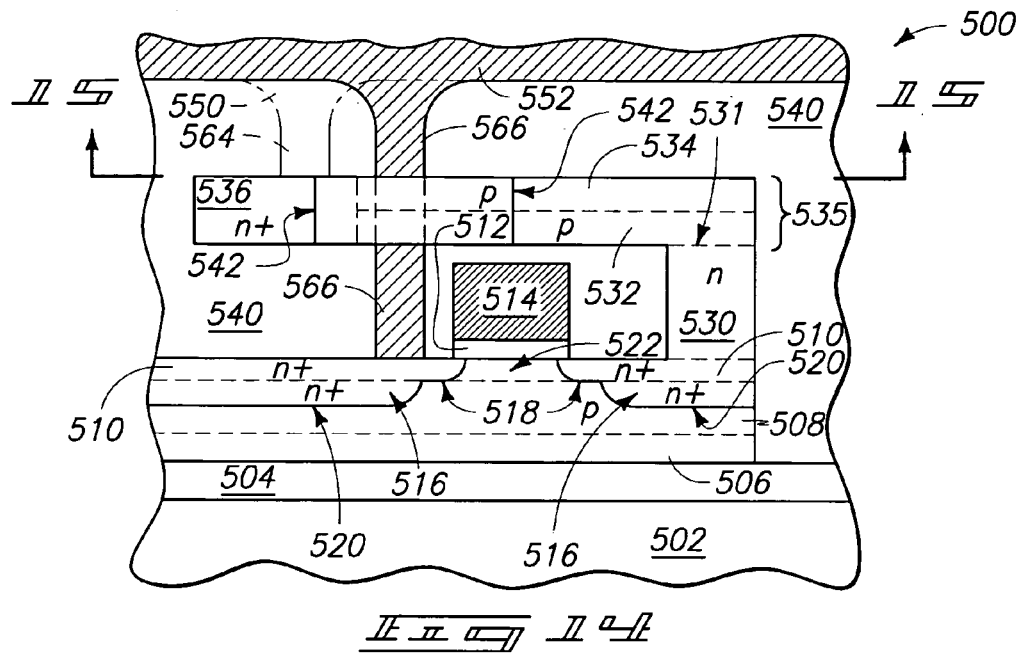
FIG. 14 is a diagrammatic, cross-sectional view of a semiconductor fragment illustrating an exemplary semiconductor construction comprising a transistor and resistor.
Figure 15:
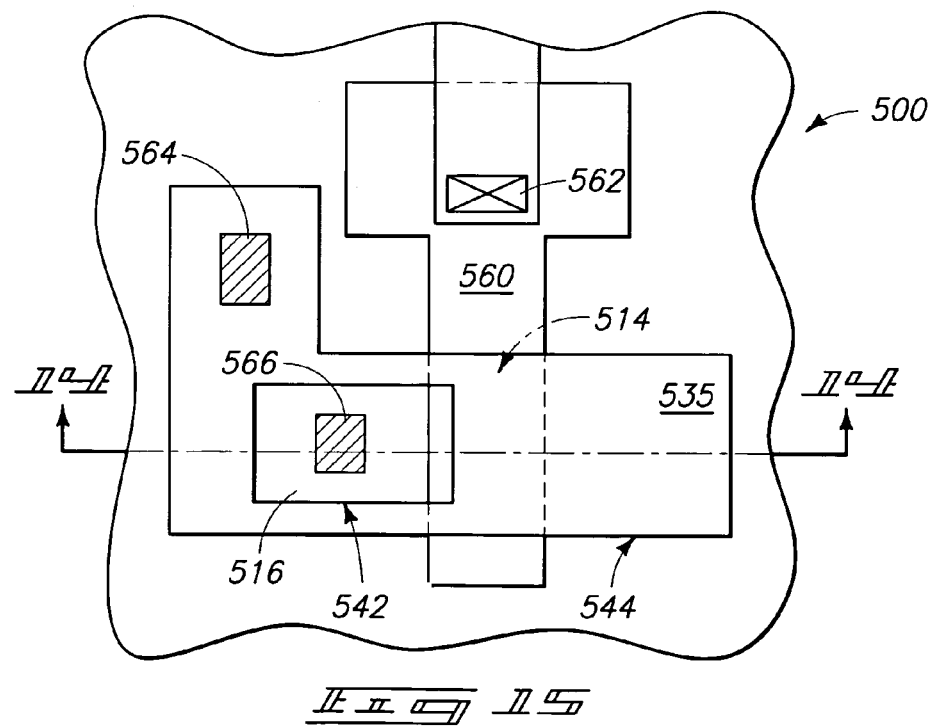
FIG. 15 is a top cross-sectional view along the line 15—15 of the construction comprising the FIG. 14 fragment. The FIG. 14 cross-section is along the line 14—14 of FIG. 15.

FIGS. 14 and 15 show a semiconductor construction 500 comprising a transistor/resistor assembly that can be incorporated into various aspects of the invention. Construction 500 includes a substrate 502 having an insulative layer 504 formed thereover. Substrate 502 and insulative layer 504 can comprise, for example, the materials described previously with reference to substrate 12 and insulator layer 14, respectively.

A first crystalline layer 506, second crystalline layer 508, and third crystalline layer 510 are formed over insulative material 504. Layers 506, 508 and 510 can correspond to a silicon seed layer, relaxed crystalline lattice layer, and strained crystalline lattice layer, respectively. In particular aspects, layers 506, 508 and 510 can comprise materials described previously for layers 16, 26 and 40, respectively.

A dielectric material 512 is over layer 510, and a transistor gate 514 is over dielectric material 512. Dielectric material 512 can comprise, consist essentially of, or consist of silicon dioxide. Transistor gate 514 can comprise, for example, one or more of metal and conductively-doped silicon; and can, for example, comprise materials described previously with reference to transistor gate 54.

A pair of source/drain regions 516 extend through strained crystalline lattice layer 510 and into relaxed crystalline lattice layer 508. The source/drain regions comprise a shallow portion 518, and a deeper portion 520.

A channel region 522 extends beneath gate 514, and between source/drain regions 516. An NFET transistor device comprises gate 514, source/drain regions 516 and channel region 522. Although the shown transistor device is an NFET device, it is to be understood that the invention encompasses other aspects (not shown) in which the transistor device is a PFET device.

Source/drain regions 516 and channel region 522 define an active region of the transistor device. For reasons described previously, it can be advantageous to have a majority, and preferably the entirety, of the portion of the active region within layer 508 contained within a single crystal of the crystalline material of layer 508; and it can also be advantageous to have the majority or entirety of the portion of the active region within layer 510 contained within a single crystal of the material 510.

The crystalline materials of layers 506, 508 and 510 can be monocrystalline in order that an entirety of the active region within such crystalline materials is within single crystals of the materials. Alternatively, the materials can be polycrystalline, with individual single crystals being large enough to accommodate an entirety of the portion of the active region extending within the various materials. In particular aspects, layers 508 and 510 will be extensions of a crystalline lattice defined by material 506. In such aspects, an entirety of the active region of the transistor device will preferably extend within only a single crystal encompassing materials 506, 508 and 510.

A conductive pillar 530 is formed in electrical connection with one of the source/drain regions 516. In the shown embodiment, pillar 530 comprises n-type doped silicon, and is formed in physical contact with an upper surface of layer 510.

A pair of crystalline materials 532 and 534 are formed over pillar 530. In the shown aspect of the invention, pillar 530 comprises an upper surface 531, and layer 532 is formed physically against such upper surface.

An electrical node 536 is formed at a location distant from conductive pillar 530, and crystalline materials 532 and 534 extend between node 136 and pillar 530. Crystalline materials 532 and 534 together define a resistor 535 extending between a first electrical node defined by pillar 530, and a second electrical node defined by the shown node 536.

Crystalline materials 532 and 534 may or may not comprise different compositions from one another. Crystalline material 532 can comprise, consist essentially of, or consist of p-type doped silicon; and crystalline material 534 can comprise, consist essentially of, or consist of p-type doped silicon/germanium. Alternatively, the two layers can be replaced with a single layer of either p-doped silicon or p-doped silicon/germanium.

An insulative material (or mass) 540 is over gate 514, and resistor 535 is separated from gate 514 by the insulative material.

Construction 500 includes a contact 566 extending from a source/drain region 516, through an opening in resistor 535 (the opening has a periphery 542), and to an interconnect 552 which electrically connects with ground (not shown). Construction 500 also includes a contact 564 (shown in phantom view in FIG. 14 as it is behind the cross-section of FIG. 14). Contact 564 extends to node 536. An interconnect 550 (shown in phantom view in the cross-section of FIG. 14) extends between contact 564 and $V_{DD}$ (not shown in FIG. 14). In particular aspects, node 536 can be considered to be part of the electrical connection to $V_{DD}$.

FIG. 15 illustrates a top view of construction 500, with insulative mass 540 not being shown in FIG. 15 to aid in clarity of the illustration. Gate 514 is part of a conductive line 560, which is connected thorough an electrical stud 562 to other circuitry.

Resistor 535 is shown comprising a "L" shape having an opening extending therethrough for passage of contact 566. Resistor 535 is shown to comprise an outer surface 544, and an inner surface 542. The inner surface 542 defines the periphery of the opening around the contact 566.

Figure 16:
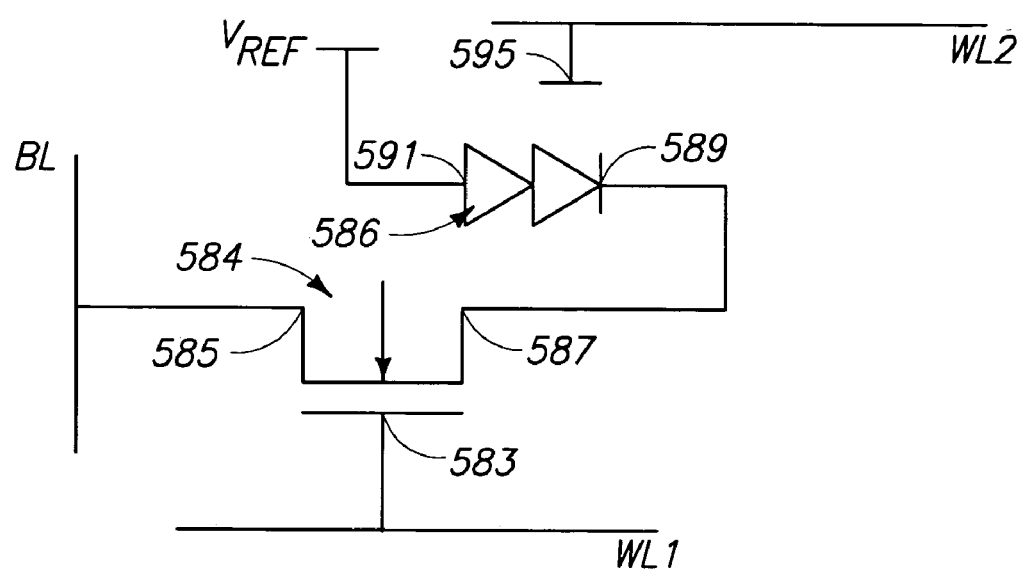
FIG. 16 illustrates a circuit schematic of an exemplary GLTRAM cell according to an aspect of the present invention.

FIG. 16 illustrates a circuit schematic of an exemplary gated lateral thyristor-containing random access memory (GLTRAM) cell 582 which can be incorporated into various embodiments of the invention. Cell 582 includes an access transistor 584 and a thyristor 586. Access transistor 584 can be, for example, an NFET transistor. Thyristor 586 is illustrated as a p+/n/p/n+ thyristor (specifically, it is illustrated as two diodes in the shown schematic diagram). One definition of a thyristor is a semiconductor device for high power switching. Thyristors have also been referred to as semiconductor-controlled rectifiers (SCR). One of ordinary skill in the art can appreciate upon reading and comprehending this disclosure that the present subject matter is not limited to a particular type of semiconductor doping.

A first wordline (WL1) is connected to a gate 583 of access transistor 584. A bitline (BL) is connected to a first source/drain diffusion region 585 (hereinafter referred to as a drain region to simplify the disclosure) of the access transistor 584. A second source/drain region 587 (hereinafter referred to as a source region to simplify the disclosure) of the access transistor 584 is connected to a first end 589 of the thyristor 586. A second end 591 of the thyristor is connected to a voltage ($V_{REF}$). The reference voltage is typically around 0.8 to 1.0 volts, and programming pulses on the bitlines and the wordlines are typically about 2.0 volts. For a p+/n/p/n+ thyristor, the first end 589 comprises the n+ region of the thyristor and is referred to as a cathode; and the second end 591 comprises the p+ region of the thyristor and is referred to as an anode.

A thyristor gate 595 is connected to a second wordline (WL2). The gate 595 assists with switching the thyristor 586; and specifically gates the p/n+ diode part of the thyristor 586 with the fringe field extending into the n region of the thyristor. For the p+/n/p/n+ thyristor, the thyristor gate 595 provides a field to the thyristor around the p region. Such field can significantly increase the turn-off speed of the thyristor and allows a low-voltage turn-on of the thyristor. Additionally, standby leakage power can be reduced.

The second diffusion (source) region 587 functions as a storage node for the memory cell 582. A charge stored at the source region 587 is read by turning on the access transistor 584 (providing a first wordline pulse) and sensing the bitline. A write-one operation is performed by providing a first wordline pulse to turn on the access transistor 584 and provide a current path between the thyristor 586 and the bitline (BL), which is held at a low potential, and providing a second wordline pulse to assist with a low-voltage turn on of the thyristor 586. In this state, the thyristor is "on" and the reference potential is transferred from the anode to the cathode of the thyristor to store "one". A write-zero operation is performed by providing a bitline pulse of sufficient potential to reverse bias the thyristor 586, providing a first wordline pulse to turn on the access transistor, providing a current path between the bitline (BL) and the thyristor 586, and providing a second wordline pulse to increase the turn-off speed of the thyristor 586. The thyristor 586 is reverse biased to a sufficient voltage for a sufficient time period to allow the charge carriers to recombine.

According to various embodiments, thyristor 586 is a lateral p+/n/p/n+ thyristor integrated on top of the access transistor 583. Accordingly, source 587 can be a raised source which functions as a cathode node for the thyristor 586.

Figure 17:
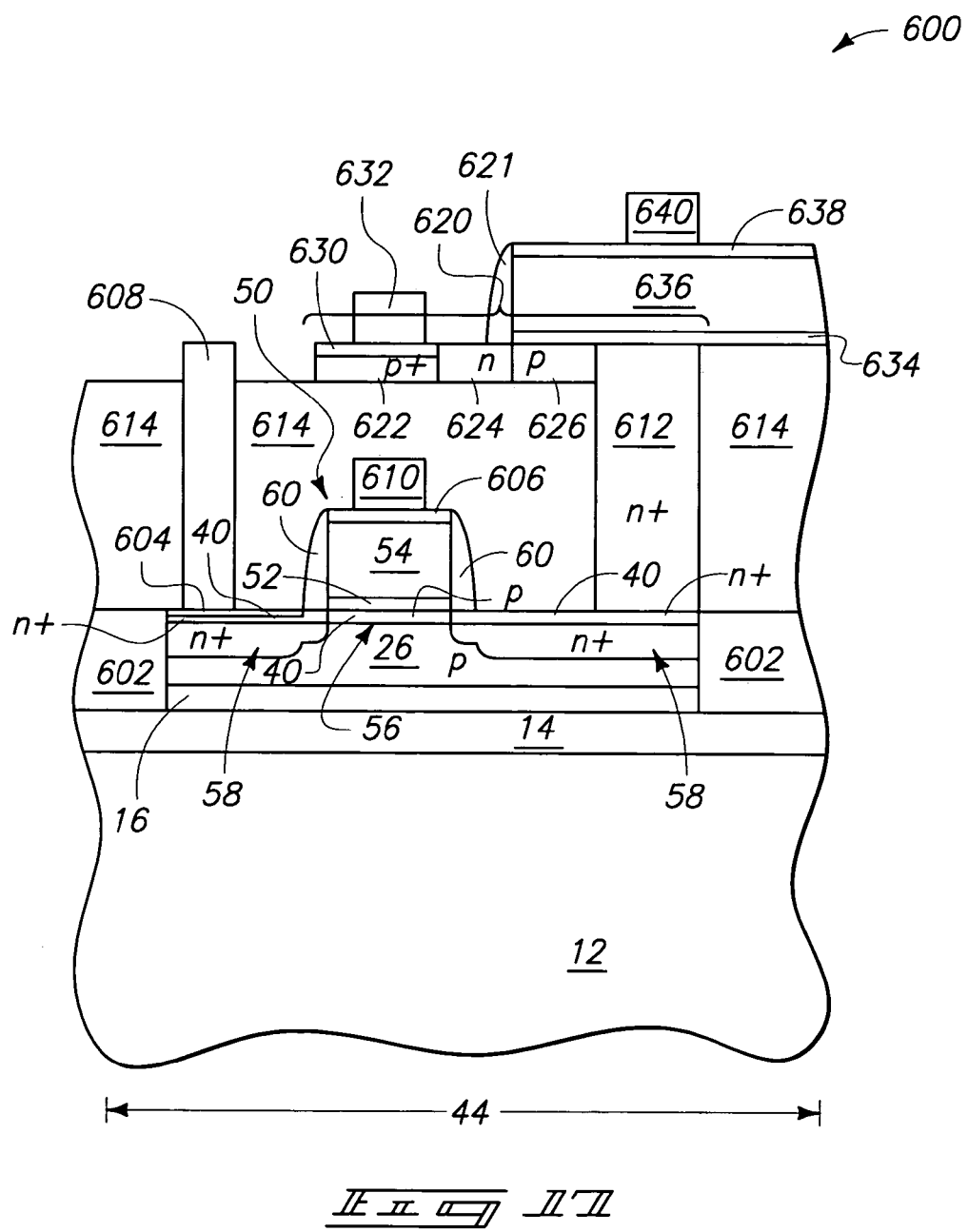
FIG. 17 is a diagrammatic, fragmentary, cross-sectional view of a GLTRAM cell according to an exemplary aspect of the present invention.

FIG. 17 illustrates a cross-sectional view of an exemplary GLTRAM cell 600 formed in accordance with an aspect of the present invention. In referring to cell 600, the numbering utilized above in describing FIGS. 1–9 will be used, where appropriate.

Cell 600 comprises a base substrate 12 having in insulative material 14 formed thereover.

Layers 16, 26, and 40 are formed over insulative material 14.

Source/drain regions 58 extend into layers 40 and 26, and in the shown exemplary construction the source/drain regions are n+ doped. Accordingly, the illustrated transistor device is an NFET device. It is noted that source/drain regions 58 of FIG. 17 are similar to the source/drain regions 58 of FIG. 7, and are conductively-doped as were the source/drain regions of FIG. 7. However, the source/drain regions of FIG. 17 are not shown with cross-hatching. None of the conductive materials of FIG. 17 are shown with cross-hatching in an effort to simplify the drawing. The discussion herein will, however, identify the materials of FIG. 17 which are electrically conductive.

A transistor gate 54 is over crystalline material 40, and separated from the crystalline material by a suitable dielectric material 52.

Sidewall spacers 60 are along sidewalls of gate 54.

A channel region 56 is beneath gate 54 and between the source/drain regions 58. Channel region 56 is doped with a p-type dopant. The NFET device comprising gate 54 is labeled as device 50. Such NFET device has an active region extending into layers 26 and 40. Preferably, the portion of the action region within layer 26 will be predominately, and more preferably entirely, contained within a single crystalline grain of the material of layer 26, and also the portion of the active layer within layer 40 will be contained predominately or entirely within a single crystalline grain of the material of layer 40.

A pair of isolation regions 602 are shown at edges of layers 16, 26 and 40. Isolation regions 602 can comprise, for example, silicon dioxide, and can correspond to shallow trench isolation regions. Isolation regions 602 electrically isolate an active region of NFET device 50 from adjacent circuitry (not shown).

The illustrated source/drain region 58 on the left of gate 54 can be referred to as a drain region, and the source/drain region 58 on the right of gate 54 can be referred to as a source region. The drain region is silicided (as evidenced by silicide region 604). Also, gate 54 can comprise an upper silicon surface (such as a polysilicon surface) and such surface is silicided in the shown exemplary construction (as evidenced by silicide region 606). Silicide regions 604 and 606 are electrically conductive regions. Silicide region 604 is utilized for forming electrical contact between a bitline 608 and the drain region. Silicide 606 is utilized for forming electrical contact between a wordline 610 and transistor gate 54. Bitline 608 can correspond to the bitline (BL) of FIG. 16 and wordline 610 can correspond to the line labeled WL1 in FIG. 16.

A conductive pedestal 612 extends over source region 58. Pedestal 612 can be considered to be a raised source region of NFET device 50. Pedestal 612 can comprise, consist essentially of, or consist of, for example, n+ doped silicon, such as, for example, n+ doped single crystal silicon or polycrystalline silicon (polysilicon). Raised source region 612 can be formed, for example, utilizing a selective epitaxy process, thereby forming a single crystal silicon pedestal.

An insulative mass 614 extends over layer 40, wordline 610 and gate 54. Mass 614 can comprise, consist essentially of, or consist of, for example, borophosphosilicate glass (BPSG), and/or silicon dioxide. Bitline 608 and raised source region 612 extend through insulative mass 614.

A laterally extending p+/n/p/n+ thyristor 620 includes raised source region 612 as a cathode. Thyristor 620 also includes a p+ region 622, an n region 624, and a p region 626 which are over insulative mass 614. Regions 622, 624 and 626 are elevationally above wordline 610 and transistor gate 54 in the exemplary shown embodiment. P+ region 622 and n region 624 are shown having portions directly above transistor gate 54.

P+ region 622 forms the anode of thyristor 620 and is silicided (as illustrated by silicide region 630). A reference voltage ($V_{REF}$) 632 is electrically connected with p+ region 622 through silicide region 630. Lateral thyristor 620 can be appropriately formed to provide a lower stored charged volume in the p region of the thyristor and to reduce carrier transit time for faster performance and better control of the turn-off characteristics of the thyristor.

A thyristor gate oxide 634 extends over a portion of thyristor 620, and a polysilicon thyristor gate 636 is formed on the thyristor gate oxide 634. The polysilicon thyristor gate 636 is silicided (as illustrated by the silicide region 638). A second wordline 640 is electrically connected to thyristor gate 636 through silicide 638. Wordline 640 can correspond to the wordline labeled as WL2 in FIG. 16. Gate-assisted switching of the thin, lateral thyristor formed in the exemplary shown embodiment can be more effective than gate-assisted switching of vertical thyristors. Although it can be advantageous to utilize laterally-extending thyristors in various aspects of the invention, it is to be understood that other types of thyristors, including vertically-extending thyristors, can be utilized in some aspects of the invention.

A thin film silicon layer is typically utilized to form regions 622, 624 and 626 of thyristor 620. Such thin film silicon is initially doped with n-type impurities at a doping level of $1 \times 10^{17}$ atoms/cm$^3$ or lower, which remains the doping level for the p+/n background level of the thyristor 620. All of the regions of the gates for the first and second wordlines are heavily doped with n-type impurities, although the gate for the thyristor could also be p-type if such is appropriate when taking into a consideration the work function differences association with such option.

Figure 18:
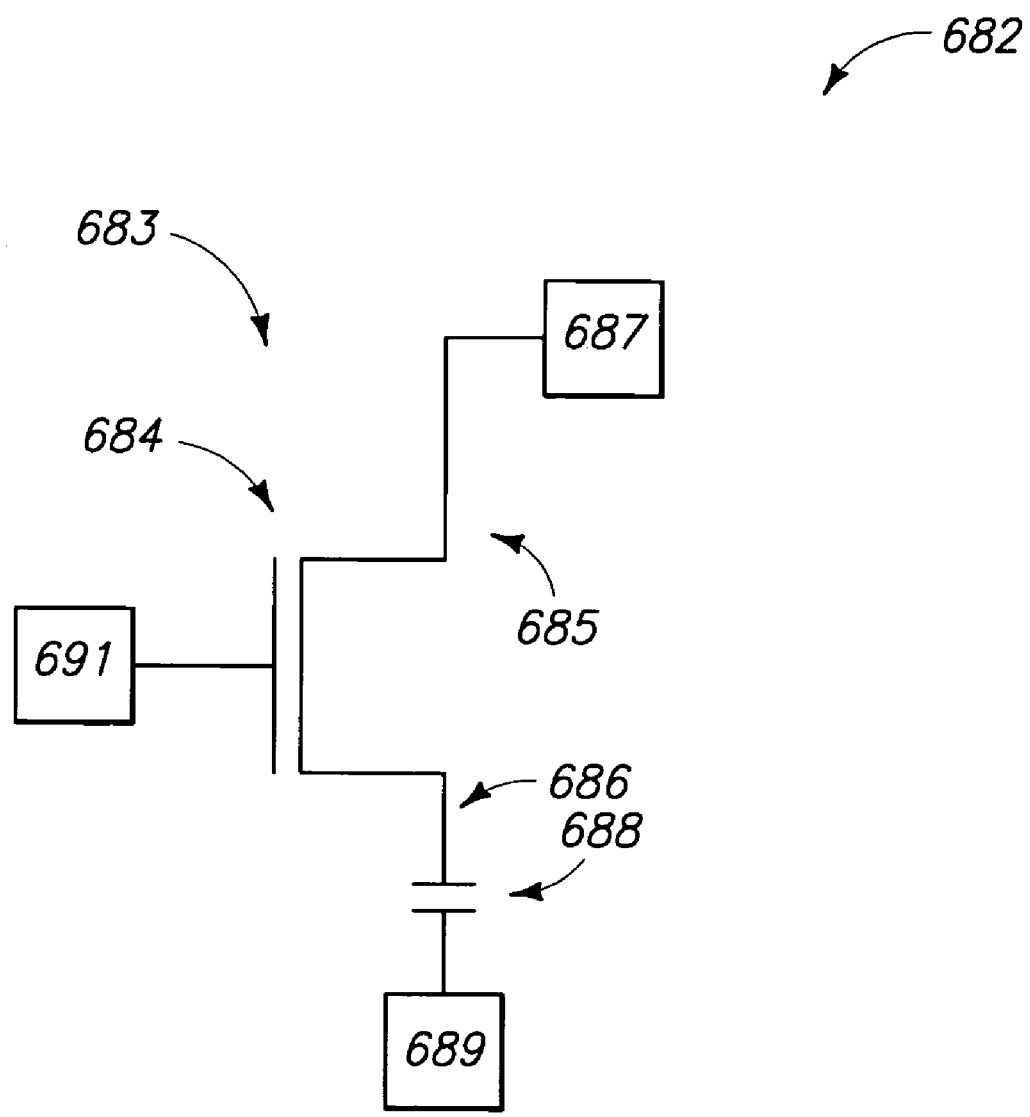
FIG. 18 is a schematic diagram of a DRAM cell comprising a transistor and capacitor.

FIG. 18 is a diagrammatic illustration of a DRAM memory cell 682. The memory cell includes a transistor 683 comprising a gate 684 and source/drain regions 685 and 686. One of the source/drain regions is electrically connected to a bitline 687 and the other is connected to a storage node of a capacitor 688. Capacitor 688 also includes a reference node which is electrically connected to a reference voltage ($V_{REF}$) 689 which can be, for example, ground. The gate of transistor device 684 is connected to a wordline 691.

In operation, data is stored at capacitor 688, and is written to, or read from, capacitor 688 by applying appropriate combinations of electrical signals to wordline 691 and bitline 687. The appropriate combinations of electrical signals will be recognized by persons of ordinary skill in the art.

Figure 19:
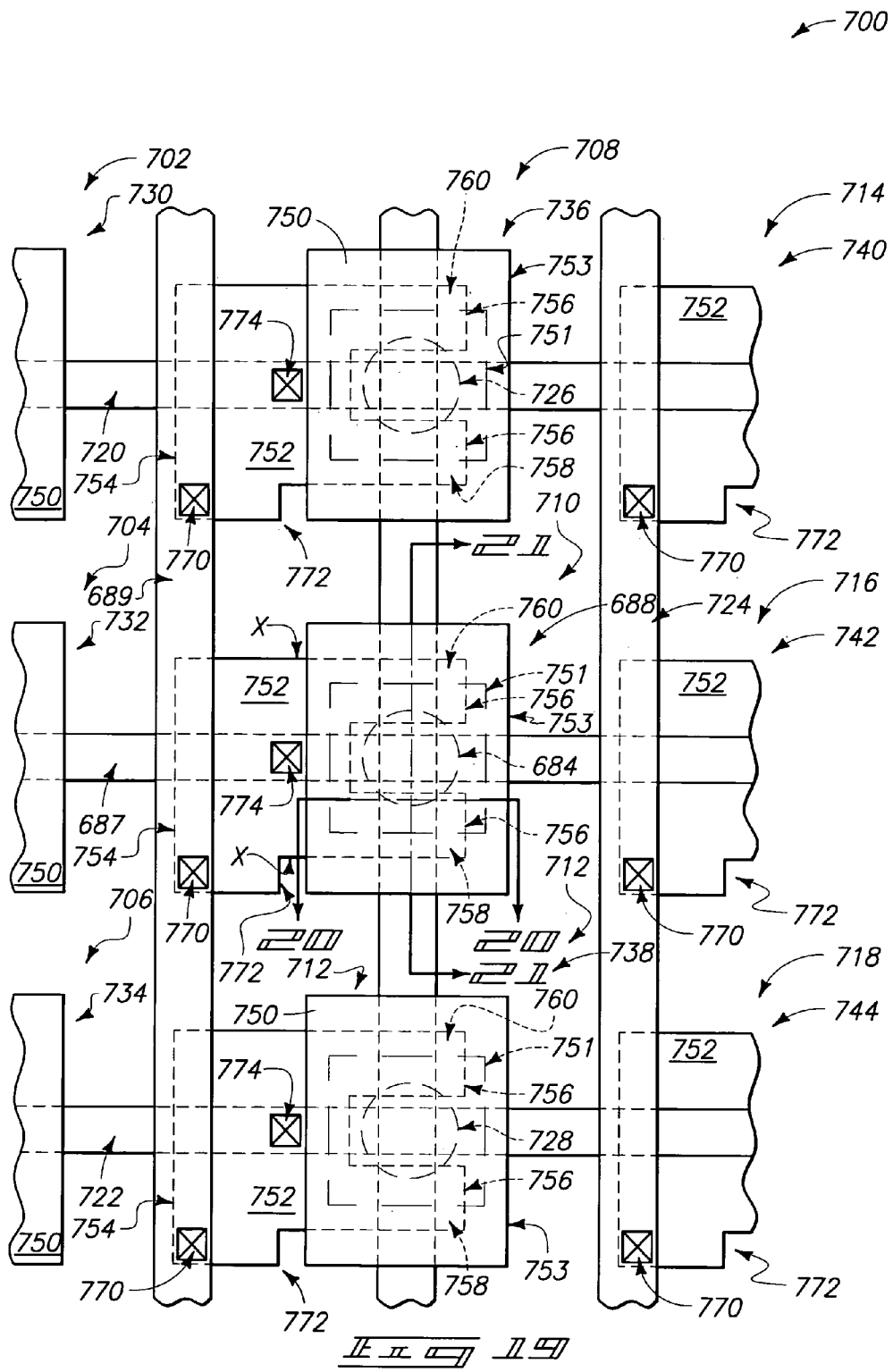
FIG. 19 is a diagrammatic, top view of a fragment of an exemplary memory array of the present invention.
Figure 22:
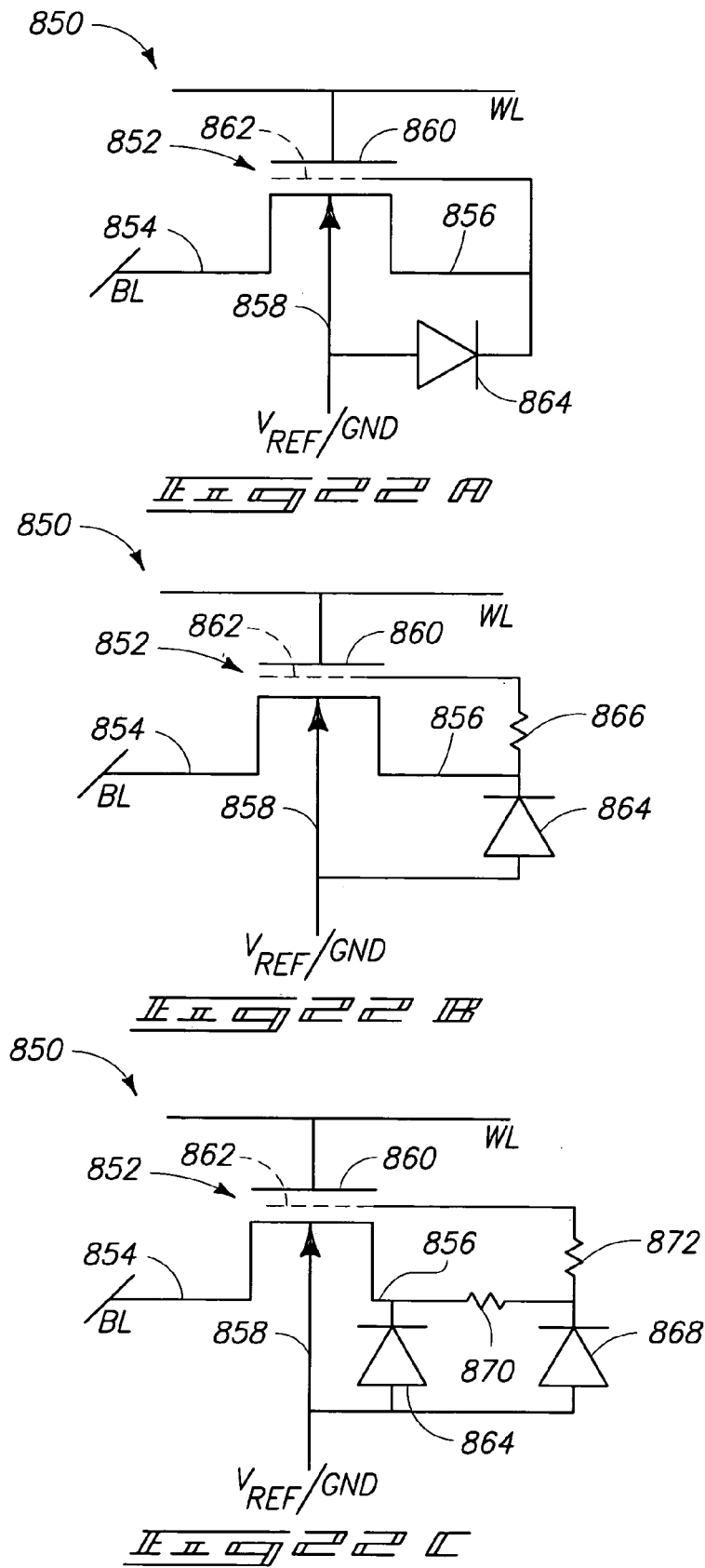
FIG. 22A is a schematic illustration of an exemplary NVRAM device according to an aspect of the present invention.
FIG. 22B is a schematic illustration of an exemplary NVRAM device according to an aspect of the present invention.
FIG. 22C is a schematic illustration of an exemplary NVRAM device according to an aspect of the present invention.

An exemplary memory cell is described with reference to FIGS. 19–21. FIG. 19 shows a top view of a memory array 700 comprising exemplary memory cells, and FIGS. 20 and 21 illustrate cross-sectional views of an exemplary memory cell of the array. In describing FIGS. 19–21, similar numbering will be used as was utilized above in describing FIGS. 1–9 and 18, where appropriate.

Referring to FIG. 19, memory array 700 comprises memory cells 702, 704, 706, 708, 710, 712, 714, 716 and 718. All of the memory cells are identical to one another. In the illustrated view, only memory cells 708, 710 and 712 are shown in their entirety, and fragments of memory cells 702, 704, 706, 714, 716 and 718 are shown.

Bitlines 720, 687 and 722 extend horizontally through the memory cells, with bitline 687 corresponding to the bitline described previously with reference to FIG. 18. A wordline 691 (corresponding to the wordline described previously with reference to FIG. 18) extends vertically through memory cells 708, 710 and 712. $V_{REF}$ lines (for example, ground lines) 689 and 724 extend vertically across the array, with the $V_{REF}$ line 689 corresponding to the line of FIG. 18. It is noted that various portions of the bitlines and wordline are shown in phantom (dashed-line) view in FIG. 19 to indicate that such lines are extending under other structures shown in the array. The $V_{REF}$ lines 689 and 724 do not have any phantom portions because such lines are the topmost layers in the illustrated exemplary array.

Transistor gates 726, 684 and 728 are illustrated diagrammatically by circles at various indicated locations along wordline 691, with transistor gate 684 corresponding to the transistor gate of FIG. 18.

Capacitor structures 730, 732, 734, 736, 688, 738, 740, 742 and 744 are associated with the memory cells 702, 704, 706, 708, 710, 712, 714, 716 and 718, respectively. The capacitor structure 688 corresponds to the capacitor structure of FIG. 18.

Each of the capacitor structures comprises a storage node 750 and a reference plate structure 752. The storage node comprises a portion 751 beneath the reference plate structure, and a portion 753 above the reference plate structure, as will be discussed in more detail with reference to FIGS. 20 and 21. The reference plate structure thus has a lateral periphery substantially surrounded by the storage node.

Each reference plate has two ends 754 and 756 (the ends are labeled only with respect to memory cells 708, 710 and 712 in the shown diagram). The reference plates split into a pair of separate prongs 758 and 760 at end 756, with such prongs joining to one another at end 754. It is to be understood that the invention encompasses other aspects (not shown) in which the reference plate structure does not split into prongs, or in which the reference plate structure splits into more than two prongs. The shown reference plates have a polygonal periphery, with the portion of the periphery encompassing the prongs including a crenel (i.e., the gap between the prongs) between a pair of merlons (i.e., the prongs).

A lateral periphery of a reference plate structure 752 is defined as a periphery extending around the plate in a direction labeled "X", between the ends (with "X" being shown only relative to memory cell 710). Storage node 750 extends around the majority (i.e., more than half) of the lateral periphery of separated prongs 758 and 760, and also extends over the end 756 of reference plate structure 752.

A plurality of contacts 770 are illustrated for connecting the reference plate structures 752 to $V_{REF}$. The reference plate structures 752 are shown having protrusions 772 surrounding the contact regions 770. In other words, the reference plate structures 752 have an "L" shape at end 754, with the bottom leg of the "L" shape extending to over contact region 770. Such provides a relatively wide location for making contact to the $V_{REF}$ lines, which can compensate for mask misalignment.

A series of contact regions 774 are provided to allow contact between the bitlines and source/drain regions of the transistor devices (source/drain regions are not shown in FIG. 19, but exemplary source/drain regions are illustrated in FIG. 20).

FIGS. 20 and 21 illustrate cross-sectional views through memory device 710. Such figures illustrate that the memory device 710 can be formed over the materials 12, 14, 16, 26 and 40 described previously with reference to FIGS. 1–8. Transistor device 684 can comprise the transistor gate 54, gate dielectric 52, and sidewall spacers 60 described previously with reference to FIGS. 7 and 8; and source/drain regions 685 and 688 (which correspond to the source/drain regions of FIG. 18) can be identical to the source/drain regions 58 described previously with reference to FIGS. 7 and 8. Accordingly, transistor device 684 can comprise an active region extending into crystalline materials 26 and 40. Preferably a majority or entirety of the portion of the active region within material 26 is within a single crystal of such material, and also preferably a majority or entirety of the portion of the active region within crystalline material 40 is within a single crystal of such material.

Although the source/drain regions 685 and 688 are illustrated as being n-type doped regions, it is to be understood that the regions could also be p-type doped regions.

Source/drain region 685 is diagrammatically illustrated as having a contact to bitline 687, and source/drain region 688 is illustrated as having a conductively-doped contact 64 extending to storage node 750. Conductive contact 64 can comprise any suitable conductive material, including, for example, metal, metal compounds, and/or conductively-doped silicon. Storage node 750 can also comprise any suitable conductive material, including, for example, metals, metal compounds and/or conductively-doped silicon.

In the shown embodiment, reference plate structure 752 comprises a single reference plate. It is to be understood, however, that the reference plate structure could comprise a stack of multiple reference plates, with the individual plates of the stack being separated from one another by dielectric material. The reference plate (or plates) can comprise any suitable conductive material including, for example, metal, metal compounds and/or conductively-doped silicon.

A dielectric material 106 extends around the reference plate, and storage node 750 is separated from the reference plate by the dielectric material 106. Dielectric material 106 can comprise any suitable dielectric material, and preferably comprises one or more high-k materials. The term high-k refers to materials having a dielectric constant greater than 3.9 (i.e., greater than the dielectric constant of silicon dioxide), with an exemplary high-k material being $Al_2O_3$.

FIG. 20 illustrates the end 756 of reference plate structure 752, and shows storage node 750 surrounding such end. Specifically, the storage node upper portion 753 is over the end, and the storage node lower portion 751 is below the end. The end thus projects into the storage node.

FIG. 21 illustrates prongs 758 and 760 of reference plate structure 752, and further illustrates the lateral periphery "X" surrounding such prongs. Additionally, FIG. 21 shows storage node 750 surrounding a majority of the lateral periphery "X" of the prongs 758 and 760. In the shown aspect of the invention, the storage extends into a region (or gap) 761 between the prongs.

The reference plate has top and bottom areas 765 and 767 (with the areas being the widest portions of the plate extending across regions of the storage node), and a lateral perimeter 769 connecting the top and bottom areas. An area capacitance can occur between the top and bottom areas and the storage node, and a perimeter (or lateral periphery, or fringe) capacitance can occur between the perimeter 769 and the storage node. The combination of the area and perimeter capacitances can allow a large amount of capacitance to be generated from a relatively small footprint of the reference plate and storage node, as compared to prior art devices.

In the shown embodiment, base material 12 has a substantially planar upper surface which extends primarily along a horizontal direction. The reference plate structure 752 is over transistor gate 54, is substantially planar, and also extends primarily along the horizontal direction. The reference plate structure has stepped shape, with the step extending from a first lower elevational level outside an edge of lower storage node portion 751 to a second higher elevational level over the lower storage node portion 751. The illustrated exemplary structure has an elevationally lowest portion of the reference plate on the step outside of the bottom portion 751 of the storage node, and such elevationally lowest portion of the reference plate is above the elevationally lowest surface of the bottom portion 751 of the storage node.

The electrically insulative material 62 described previously with reference to FIGS. 7 and 8 is shown extending around conductive materials of structure 710 to provide a matrix upon which the various structures are formed, as well as to electrically isolate adjacent structures from one another.

In particular aspects, the present invention utilizes non-volatile memory cells, such as non-volatile random access memory (NVRAM) cells. Exemplary non-volatile memory cells include a transistor with a floating plate and at least one built-in diode. Charge trapping centers are provided in the gate insulator stack by interfacing conducting metal-silicides with appropriate metal-oxides (and in various embodiments, by interfacing transition metal silicides with transition metal oxides) to achieve desired charge trapping and retention characteristics.

In CMOS technology, the built-in lateral n+/n−/p diode of the source-substrate part of the FET can be characterized to have relatively low reverse breakdown voltage and relatively high reverse leakage (approximately greater than or equal to $10^{-6}$ A/cm$^2$) with respect to a Schottky diode with negligible forward current up to a forward bias of 0.6 volt. In various embodiments, Schottky barrier heights for metal or metal silicide-silicon (p-type or n-type) are varied by selecting an appropriate metal or metal-silicide to be part of a low-barrier Schottky diode or part of a high-barrier Schottky diode. The Schottky diode is a majority carrier device, and as such has a relatively fast time constant. A Schottky diode can be fabricated to have a very low reverse leakage (for example, the reverse leakage can be much less than $1 \times 10^{-8}$ /cm$^2$), and to conduct a large forward current at negligible forward voltage drop (for example, approximately 0.6 to 0.7 volts).

Various aspects of the present invention can utilize characteristic differences of Schottky and lateral diodes to write and erase a memory cell. Additionally, nanolayers of metal/metal oxides (and in various embodiments, transition metal/metal oxides) are capable of being readily fabricated by atomic layer deposition (ALD) techniques. Exemplary aspects of the present invention utilize ALD techniques to create the gate insulator stack of a memory cell.

FIG. 22A is a schematic illustration of a NVRAM access memory according to an exemplary aspect of the present invention. The illustrated NVRAM cell 850 includes an NFET transistor 852. It is to be understood, however, that the present invention is not limited to NFET transistors. Transistor 852 includes a first diffusion region (for example, a drain) 854 connected to a bitline (BL) of the cell 850, a second diffusion region (for example, a source) 856 that functions as an extension of a storage node. A body 858 is formed by a substrate or a well. A gate 860 is connected to a wordline (WL) and a floating plate 862 as an integral part of the gate insulator stack of the NFET transistor 852.

The body region 858 is connected to a reference voltage ($V_{REF}$), such as ground (GND). In an NFET transistor 852, the body region 858 is a p-type semiconductor and the diffusion region 856 is an n+ semiconductor. The body region 858 and the second diffusion region 856 are designed to provide a built-in lateral p− n+ semiconductor junction diode 864.

The second diffusion region 856 is electrically connected to the floating plate 862 of the gate insulator stack. In various embodiments, and as will be shown in more detail below, a layer of conducting metal-silicide interfacing a trapping medium of metal oxide can form the floating plate 862 and the gate insulator stack, and such can contact the second diffusion region 856.

When the lateral junction diode 864 is reverse-biased, electrons accumulate on the floating plate 862, subsequently get trapped into the metal oxide, and cause memory cell 850 to be written. In various embodiments, memory cell 850 can be erased by injecting hot hole carriers and utilizing avalanche breakdown to neutralize trapped electrons. In some embodiments, memory cell 850 is erased by appropriately imposing a potential across the gate dielectric to remove the trapped electrons by tunneling from the trapping medium interfacing the floating plate either to the top electrode or to the substrate. In particular embodiments, the memory cell 850 is erased by forward biasing a Schottky diode, which is generally illustrated in FIG. 22C. As is described in more detail later in this disclosure, the Schottky diode is capable of being fabricated as a low forward voltage drop and a high current device to provide the cell with desired erase characteristics.

FIG. 22B is a schematic illustration of an exemplary NVRAM according to particular aspects of the present invention. The NVRAM includes a lateral semiconductor junction (p-n+) diode 864 extending from the body region 858 to the second diffusion region 856. An ohmic connection associated with the metal-silicide between the second diffusion region 856 and the floating plate 862 is illustrated as a resistor 866.

FIG. 22C is a schematic illustration of an exemplary NVRAM according to particular aspects of the present invention. Such NVRAM includes a Schottky diode 868 formed in parallel with the lateral semiconductor junction (p-n+) diode 864. The Schottky diode is formed between the metal silicide and the body region 858 by selectively interfacing metal-silicide with the p-type body 858. Resistor 870 illustrates the contact resistance of the interface between the second diffusion region 856 and the metal-silicide. Resistor 872 illustrates the ohmic connection to the floating plate 862 associated with the metal-silicide.

In particular embodiments, the NVRAM can incorporate a floating plate gate insulator stack for the transfer gate, and can provide particularly useful methods of trapping (also referred to herein as charging or writing) and de-trapping (also referred to herein as discharging or erasing) the floating plate 862 via a combination of built-in lateral and Schottky diodes 864 and 868 at a storage node 856 which is electrically tied to the floating gate 862. The trapping and de-trapping of the floating plate can also be referred to herein as programming. The entire memory cell 850 can be integrated within a single transistor, and such can be considered to be a one device configuration. During writing (high: "1") and erasing (low: "0") the parallel diodes 864 and 868 are respectively reverse and forward biased. Also, the reverse-biased n+−p lateral diode 864 is active during writing and supplies electrons that are trapped at the trapping medium of metal oxide interfacing floating plate 862, (the trapping media and plate 862 can together be referred to as a floating plate/trapping insulator stack). Such trapped electrons raise the threshold of the cell transistor 852. Thus, the reverse-biased lateral semiconductor junction diode 864 charges that floating plate/trapping insulator stack. During erasing, the forward-biased silicide Schottky diode 868 is active and supplies holes to neutralize the traps in the floating plate/trapping insulator stack, thereby lowering the threshold of the cell transistor 852.

Time constants associated with charge transfer and trapping/de-trapping can be very fast, and can result in programming speeds that are improved by many orders of magnitude relative to conventional devices. At the written "1" state, the threshold voltage ($V_T$) of the device (NFET) is raised due to electrons trapped in the floating plate/trapping insulator stack and the transistor is non-conducting. At the erase state (written "0"), the threshold voltage ($V_T$) is low and the device is conducting. Reading "1" or "0" is accomplished much the same way as standard SRAM or EPROM methodology, and can therefore be very fast.

The dynamics of trapped charge leakage (charge retention) can depend on the band gap of the materials selected for the floating plate insulator stack. Charge retention can be improved by many orders of magnitude over leakage mechanisms associated with the reverse-biased p–n junctions of DRAM devices. Charge transport to and from the charge centers during writing and erasing is typically by direct tunneling, and can be exponentially dependent on the potential across charge centers and the conducting plate. However, the field across the gate insulator stack during such operations is typically significantly lower than those of conventional non-volatile devices. As a result, endurance (number of write/erase operations) is expected to be comparable to conventional DRAM devices. Memory arrays using NVRAM devices of the present invention are expected to have speed/power which can be equal to or better than conventional DRAM, while storing data relatively permanently into the memory cells and providing substantial data non-volatility.

Figure 23:
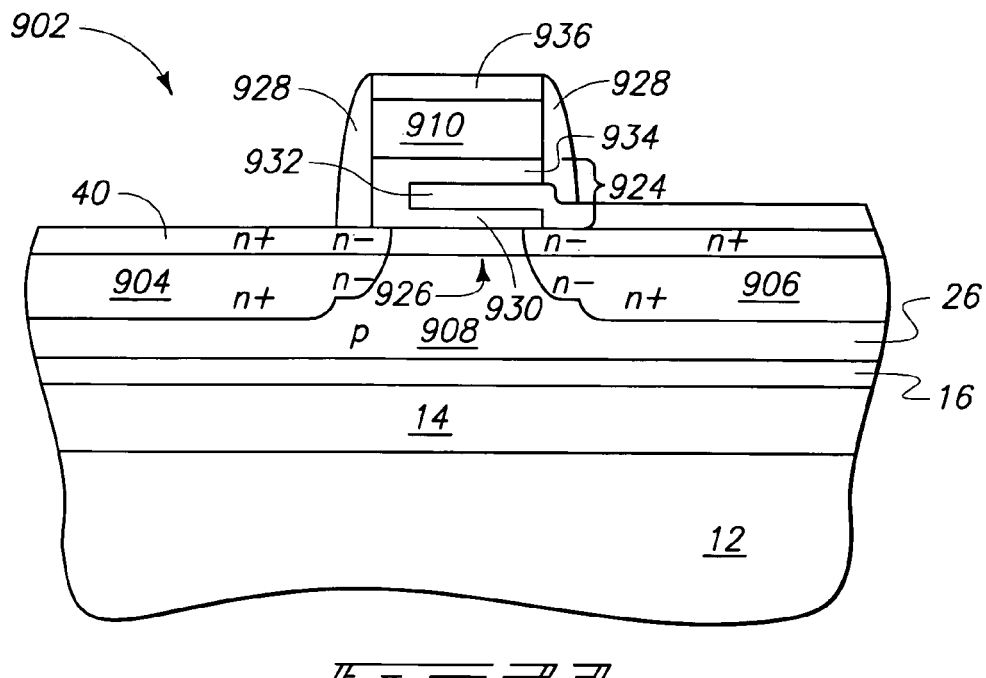
FIG. 23 illustrates a diagrammatic, cross-sectional view of an exemplary NVRAM device according to an aspect of the present invention.

FIG. 23 illustrates an exemplary NVRAM construction 902 in accordance with an aspect of the present invention. Construction 902 includes the semiconductor-on-insulator (SOI) features described previously with reference to FIGS. 1–6. Specifically, construction 902 comprises the semiconductor materials 26 and 40, and the insulator material 14. The layer 16, which was described above as being a silicon seed layer, is shown between layers 14 and 26. The construction of FIG. 23 can be formed at a processing step subsequent to that of FIG. 6. Accordingly, layer 16 can predominately, or even entirely, comprise oxidized silicon. In other aspects, the oxidation of layer 16 can be eliminated, so that layer 16 predominately or entirely comprises non-oxidized crystalline material, such as, for example, non-oxidized crystalline silicon.

Construction 902 comprises a body region 908 which can correspond to, for example, one of the active regions described previously with reference to FIG. 6 (with the active regions being shown as regions 42, 44 and 46 in FIG. 6). Accordingly, the majority, and preferably the entirety, of the portion of body region 908 extending into material 26 can be within a single crystal of material 26. Such can be accomplished by having an entirety of material 26 be monocrystalline, or by having material 26 be polycrystalline with very large crystals, in accordance with aspects discussed previously in this disclosure. Additionally, an entirety of the body region within strained lattice material 40 is preferably within a single crystal of the strained lattice material. Such can be accomplished by having the entirety of the strained lattice material be monocrystalline, or by having strained lattice material 40 be polycrystalline with very large crystals.

Body region 908 includes source/drain regions 904 and 906 which extend into the body region, and also includes a channel region 926 extending between the source/drain regions. Regions 904 and 906 can be referred to as first and second diffusion regions, respectively, in the discussion that follows. Alternatively, regions 904 and 906 can be referred to as drain and source regions, respectively, in the discussion that follows. It is noted that the source/drain regions of FIG. 23 are similar to the source/drain regions of FIG. 8, and are conductively-doped as were the source/drain regions of FIG. 8. However, the source/drain regions of FIG. 23 are not shown with cross-hatching. None of the conductive materials of FIG. 23 are shown with cross-hatching in an effort to simplify the drawings. The discussion herein will, however, identify the materials of FIG. 23 which are electrically conductive.

In the shown aspect of the invention, source/drain regions 904 and 906 are n-type doped regions, and channel region 926 is a p-type doped region. It is to be understood, however, that the invention encompasses other embodiments in which the source/drain regions are p-type doped regions and the channel region is an n-type doped region. In either event, source/drain regions of one conductivity type extend into the body, and the body further comprises a region oppositely doped to the conductivity-type of the source/drain regions, with such oppositely-doped region including a channel region extending between the source/drain regions.

A gate insulator stack 924 is over channel region 926, and a gate 910 is over the insulator stack 924. A silicide 936, such as cobalt or nickel silicide, is shown formed over gate 910. In particular aspects, gate 910 comprises conductively-doped polycrystalline silicon, and the silicide is formed physically against the polycrystalline silicon of the gate.

Spacers 928 are formed along sidewalls of a stack comprising gate insulator 924, gate 910 and silicide 936. Spacers 928 can comprise a suitable insulative material, such as, for example, silicon dioxide and/or silicon nitride. In particular aspects, the spacers comprise oxide-nitride-oxide (ONO) constructions.

In the shown construction, gate insulator stack 924 includes a first tunnel barrier layer 930 formed over channel region 926, a metal silicide layer 932 formed over tunnel barrier layer 930, and a second tunnel barrier layer 934 formed over layer 932. Tunnel barrier layers 930 and 934 can have the same composition as one another, and in the shown embodiment merge as a single structure. Metal silicide layer 932 functions as a floating plate formed over the tunnel barrier layer 930, and in the shown construction extends over second diffusion region 906 to electrically contact diffusion region 906. It is noted that the floating plate contacts only one of the first and second diffusion regions 904 and 906.

Although layer 932 is described as comprising a metal silicide, it is to be understood that layer 932 can comprise any suitably electrically conductive material. In particular aspects, layer 932 can comprise a silicide of a transition metal (and accordingly can be referred to as a transition metal silicide).

Various exemplary thickness and compositions of particular layers utilized in construction 902 are as follows. First tunnel barrier 930 can include, for example, a 3 nanometer to 5 nanometer thick layer of silicon dioxide; second tunnel barrier 934 can include a 3 nanometer to 5 nanometer thick layer of silicon dioxide, or alternatively a layer of aluminum oxide ($Al_2O_3$) with an equivalent oxide thickness ($T_{EQ. OX}$) of from about 3 nanometers to about 5 nanometers. Tunnel-blocking layers 930 and 934 are typically trap-free high band gap insulators which alleviate, and preferably prevent charge loss to a substrate comprising materials 12, 14, 16, 26 and 40, or to the gate. The tunnel-blocking layers can be other insulators besides, or in addition to $SiO_2$ and $Al_2O_3$, depending on the leakage specification and tolerance of the cell and the operational specifications (such as, Vdd, etc.)

It is noted that a diode (such as diode 864 of FIG. 22A) can hold a charge on floating plate 932 for a time that can be sufficiently long for various applications. However, such diode will typically have a leakage current. In particular aspects of the invention, floating plate 932 can be formed with relatively shallow traps to hold the charge. In embodiments such as those illustrated below in FIG. 24, the charge trapping centers can be created by interfacing conducting metal silicides with appropriate metal oxides (in particular embodiments, the metal oxides can be oxides of transition metals, and referred to as transition metal oxides) to achieve desired charge trapping and retention characteristics. More specifically, FIG. 24 illustrates an NVRAM transistor identical to that described above with reference to FIG. 23 in most respects, but comprising a modified gate insulator stack 924.

Figure 24:
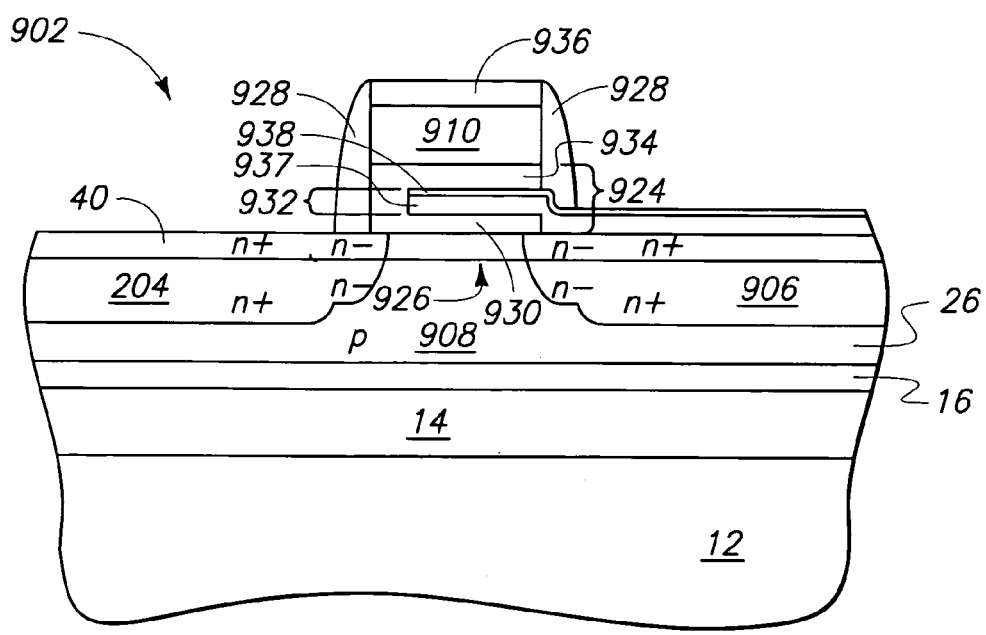
FIG. 24 illustrates a diagrammatic, cross-sectional view of another exemplary NVRAM device according to an aspect of the present invention.

The stack 924 of FIG. 24 includes compatible combinations of one or more metal silicides 937 and one or more metal oxides 938 in place of the metal silicide 932 discussed above with reference to FIG. 23. In other words, the floating plate of FIG. 24 comprises a combination of compatible metal suicides 937 and metal oxides 938.

Layers 937 and 938 can be referred to as floating plate charge center layers. Layer 937 can comprise a transition metal silicide, and will typically be from about 10 nanometers to about 30 nanometers thick. Layer 938 will typically comprise a transition metal oxide, and will typically be from about 1 nanometer to about 2 nanometers thick. The transition metal oxide (or oxides) can be deposited utilizing, for example, atomic layer deposition (ALD) techniques. Among the materials that can be utilized for layers 937 and 938 are combinations of $ZiSi_2$—$ZrO_2$; $TiSi_2$—$TiO_2$; and $HfSi_2$—$HfO_2$. However, it is to be understood that the invention is not limited to any particular combination, and other combinations besides those specifically disclosed are viable for meeting desired diode characteristics of the metal silicide and band gap characteristics of the metal oxide. Typically, transition metal suicides have relatively low Schottky barrier heights, have large forward current, and have relatively low reverse leakage characteristics. Also, transition metal oxides typically have approximately 3 ev to 5 ev of band gap, with nearly 1 ev of electron barrier height from the silicide to the dielectric conduction band. Such can provide a good balance of charge retention, as well as ease of charge transport to and from charge centers of the transition metal oxides.

It is noted that although the term "body" is utilized above to describe the entire active region of an NVRAM device, the term can also be utilized herein to refer specifically to only the portion of the NVRAM device that is oppositely doped to the source/drain regions. In other words, the term "body" can be utilized to refer to a portion of the active region which excludes the source/drain regions. For purposes of interpreting this disclosure and the claims that follow, the term "body" is to be understood to include the source/drain regions except when it is explicitly stated otherwise.

Figure 25:
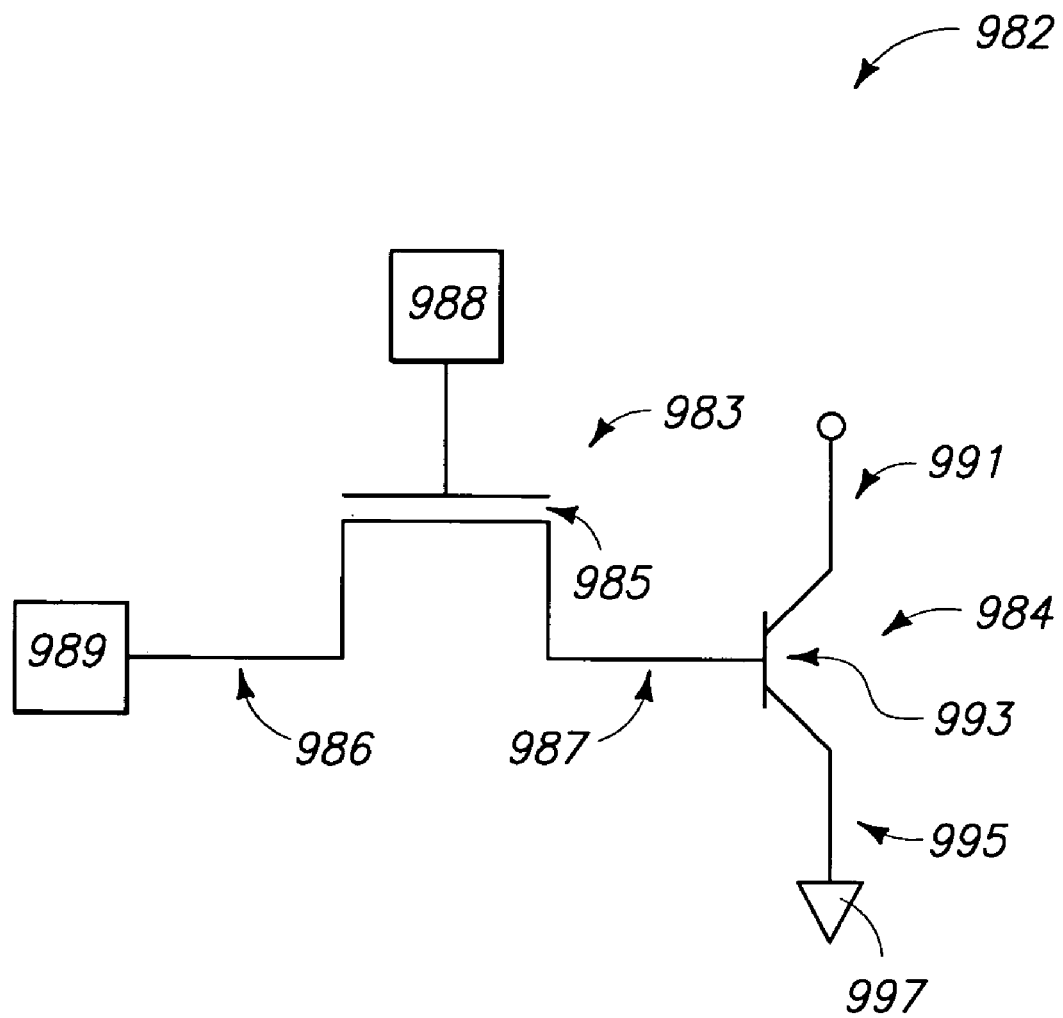
FIG. 25 illustrates a circuit schematic of an exemplary BIFETRAM cell according to an aspect of the present invention.

FIG. 25 is a circuit schematic of a memory cell construction 982 which can be utilized in various aspects of the present invention. Memory cell 982 comprises a field effect transistor 983 and a bipolar transistor 984. Field effect transistor 983 comprises a gate 985 and source/drain regions 986 and 987. Gate 985 is electrically connected to a wordline 988 and source/drain region 986 is electrically connected to a bitline 989.

Bipolar transistor 984 comprises a collector region 991, base region 993, and emitter region 995. Base region 993 is electrically connected to source/drain region 987 of field effect transistor 983, and emitter region 995 is electrically connected to ground 997.

Memory device 982 can be considered a static memory cell, and in particular aspects can be utilized as an SRAM device. Memory cell 982 can be can be referred to as a BIFETRAM device to emphasize that the device comprises and uses a bipolar transistor, and that operation of the device utilizes the RBC effect of the bipolar transistor in a similar manner to the description provided in "A New Static Memory Cell Based On Reverse Base Current (RBC) Effective Bipolar Transistor", K. Sakui et al., IEDM Technical Digest, 1988, pages 44–47, which is referred to herein as Sakui et. al.

In various embodiments, the bipolar transistor 984 is a lateral n/p/n transistor (and in particular aspects can be a n+/p/n+ transistor or a n+/p−/n+transistor) integrated on top of the access transistor 983. Accordingly, the PFET source is vertically integrated to form the base of the lateral n/p/n bipolar transistor (such will be described in more detail below).

Figure 26:
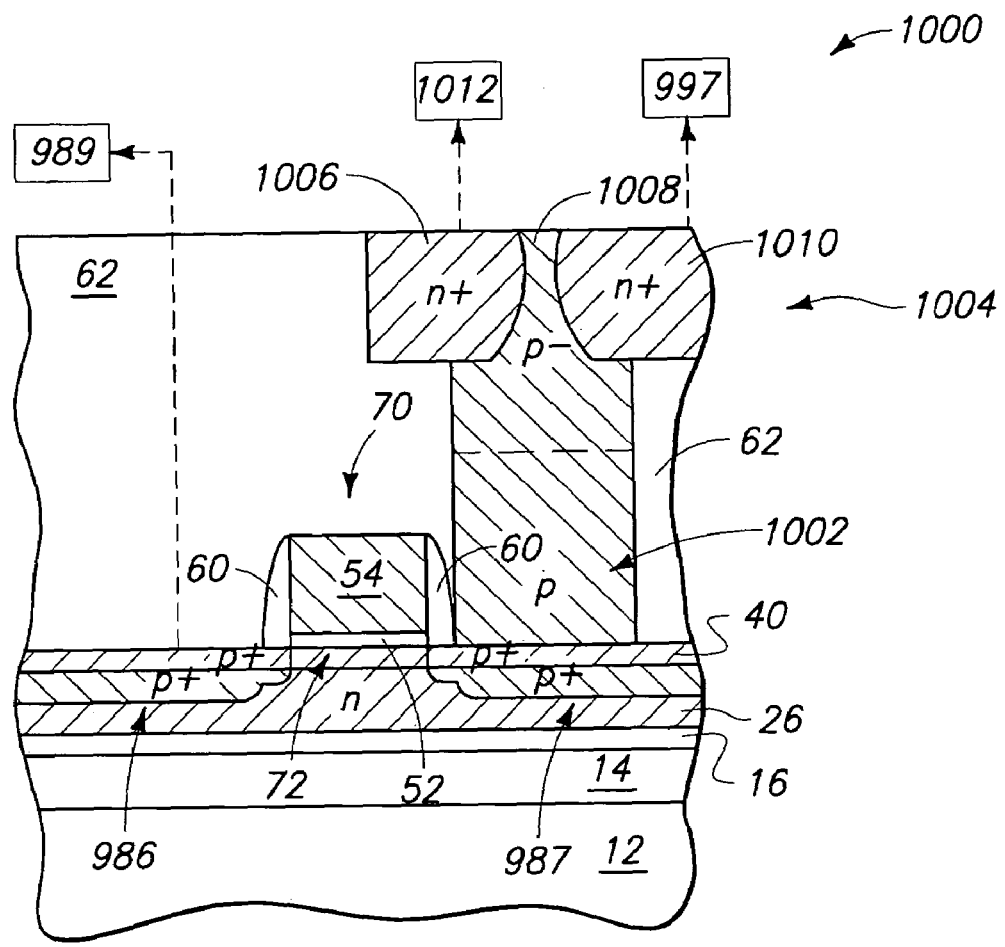
FIG. 26 is a diagrammatic, fragmentary, cross-sectional view of a BIFETRAM cell according to an exemplary aspect of the present invention.

FIG. 26 is a cross-sectional view of an exemplary BIFETRAM construction 1000 in accordance with an aspect of the present invention. In referring to construction 1000, similar numbering will be used as was used above in describing the constructions of FIG. 1–9, where appropriate.

Construction 1000 comprises the base 12 and insulative material 14 described previously with reference to FIGS. 1–9.

The layers 16, 26 and 40 described previously with reference to FIGS. 2–10 are formed over insulative material 14.

A field effect transistor device 70 is formed over and within layers 26 and 40. Device 70 includes a conductive gate 54, which is separated from layer 40 by an insulative material 52. Sidewall spacers 60 extend along sidewalls of gate 54. Source/drain regions 986 and 987 extend into materials 26 and 40 proximate gate 54, and are separated from one another by a channel region 72. Field effect transistor 70 has an identical construction to the transistor described previously with reference to FIG. 9. It is noted that the source/drain regions of FIG. 9 are labeled as 74, whereas those of FIG. 26 are labeled as 986 and 987. The numbering of FIG. 26 is chosen to indicate that the source/drain regions of FIG. 26 can correspond to the source/drain regions 986 and 987 shown in the circuit diagram of FIG. 25.

Transistor device 70 can have an active region which extends within layers 26 and 40, and which comprises source/drain regions 986 and 987. Preferably, the portion of the active region within crystalline material 26 will be predominately, and more preferably entirely, contained within a single crystal of material 26, and the portion of the active region within material 40 will be predominately or entirely contained within a single crystal of material 40.

Source/drain region 986 is electrically connected to a bitline 989, which can correspond to the bitline 989 described with reference to FIG. 25. Contact associated with bitline 989 to source/drain regions 986 of adjacent cells can be shared to improve cell density (not shown).

Source/drain region 987 is electrically connected to a pillar 1002 of conductive material. In the shown embodiment, pillar 1002 comprises conductively-doped semiconductive material, and specifically comprises p-type doped semiconductive material. The semiconductive material of pillar 1002 can comprise, consist essentially of, or consist of, for example, silicon and/or Si/Ge. The pillar extends and integrates to the base region of a bipolar transistor device 1004 which comprises an n-type doped collector region 1006, a p-type doped base region 1008, and an n-type doped emitter region 1010. In the shown exemplary embodiment, base region 1008 is doped to a (p−) dopant level and a portion of the pillar beneath the base region is doped to a (p) dopant level. Such can be accomplished by forming pillar 1002 and base 1008 of non-doped semiconductive material over conductively-doped source/region 987, and subsequently out-diffusing dopant from source/drain region 987 into pillar 1002 and base 1008. A gradient of dopant concentration is thus formed through pillar 1002 to base 1008, with a lower portion of the pillar being doped to a (p) concentration and the upper portion of the pillar and base being doped to a (p−) concentration.

Collector region 1006 and emitter region 1010 are shown doped to n+ concentrations. Such can be accomplished by forming a layer of semiconductive material in the configuration of bipolar transistor device 1004, and subsequently implanting n type dopant into regions 1006 and 1010 to form the collector and emitter regions of the bipolar transistor device.

Collector region 1006 is in electrical contact with $V_{DD}$ 1012, and emitter region 1010 is in electrical contact with ground 997. The emitter region 1010 and the contact 997 associated with it could be shared between adjacent cells (not shown) to improve cell density.

Insulative material 62 is formed over and around various components of construction 1000 to support bipolar device 1004 over field effect transistor device 70.

In operation, the bipolar transistor of construction 1000 can have a negative resistance effect as well as a reverse base current effect similar to a bulk bipolar device. The bipolar device of construction 200 can be similar to conventional bipolar devices, yet have superior performance by using a very small relative size of the body (base portion 1008) relative to the rest of the device to allow a volume of charge storage to be small compared to conventional devices. The bipolar device can be utilized as a switch, with field effect transistor gate 70 enabling the switch to be turned off and on quickly.

Figure 27:
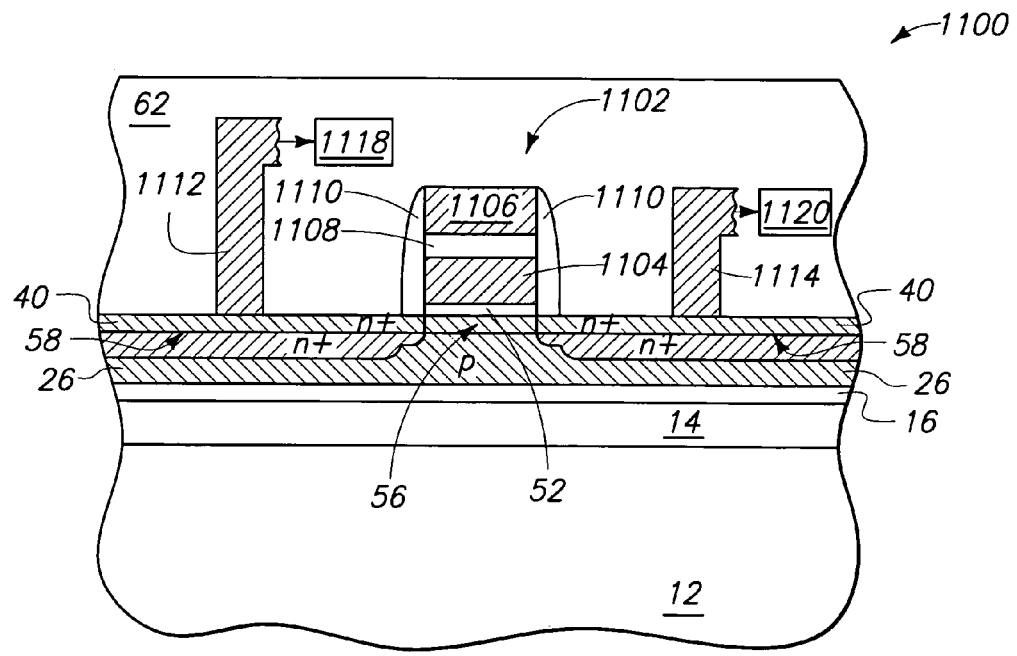
FIG. 27 is a diagrammatic, cross-sectional view of a fragment of a semiconductor construction comprising an exemplary non-volatile device in accordance with an aspect of the present invention.
Figure 28:
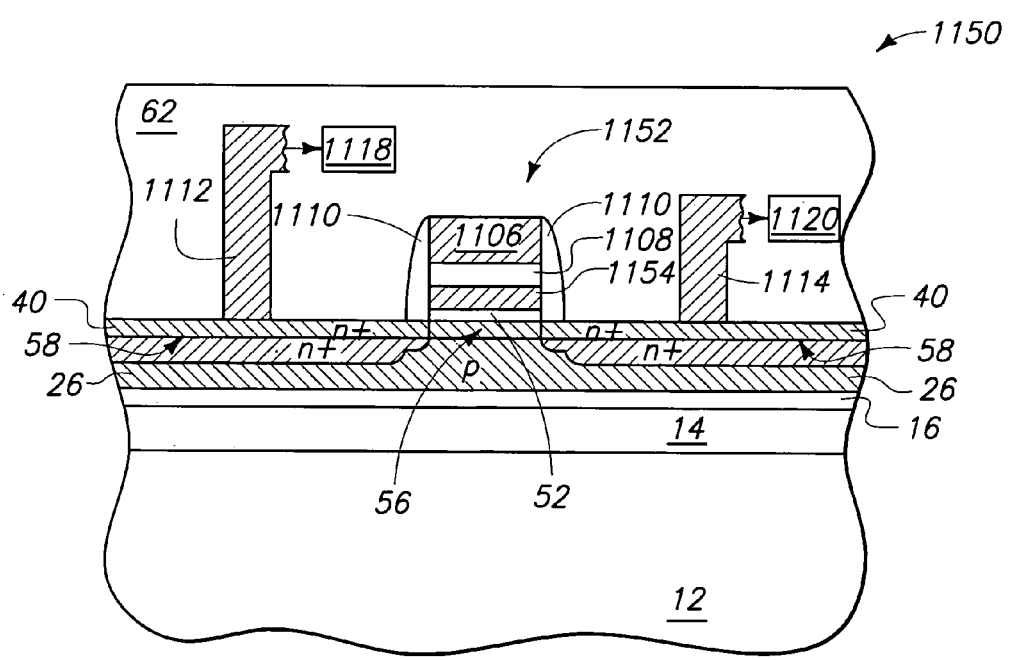
FIG. 28 is a diagrammatic, cross-sectional view of a fragment of a semiconductor construction comprising an exemplary non-volatile device in accordance with another aspect of the present invention.

FIGS. 27 and 28 illustrate exemplary non-volatile devices which can be formed in accordance with exemplary aspects of the present invention. Referring initially to FIG. 27, a construction 1100 includes the substrate 12, insulative material 14, layer 16, layer 26 and layer 40 discussed previously with reference to FIGS. 1–7. Construction 1100 also comprises a non-volatile memory device 1102 comprising a floating gate 1104 and a control gate 1106. Floating gate 1104 can comprise, for example, one or more of conductively-doped silicon, metal, and metal compounds. Control gate 1106 is typically in electrical connection with a wordline, and can be a portion of the wordline.

Floating gate 1104 is surrounded by one or more insulative materials, and holds charges to create well-defined bi-stable thresholds for the transistor to provide non-volatility. Floating gate 1104 typically comprises a thickness (i.e., a height in the shown view) of about 1500 Å. Suitable materials for utilization in floating gate 1104 are conductively-doped semiconductor materials, and in particular aspects gate 1104 can comprise, consist essentially of, or consist of conductively-doped silicon (either in amorphous or polycrystalline form).

Floating gate 1104 is separated from material 40 by an insulative material 52 which can, for example, comprise gate oxide. Insulative material 52 can comprise other materials in addition to, or alternatively to, silicon dioxide, such as, for example, silicon nitride.

Floating gate 1104 is separated from control gate 1106 by insulative material 1108. Material 1108 can comprise any suitable insulative material, or combination of materials. In particular aspects, material 1108 will comprise a layer of silicon nitride sandwiched between a pair of silicon dioxide layers (a so-called ONO material).

A pair of sidewall spacers 1110 extend along sidewalls of floating gate 1104, control gate 1106, and insulative materials 52 and 1108. Spacers 1110 can comprise any appropriate insulative material, such as, for example, one or both of silicon oxide and silicon nitride. In particular aspects, spacers 1110 can comprise an ONO construction.

In a typical construction, material 52 is silicon dioxide (with a typical thickness of about 50 Å), material 1108 is ONO (with a typical thickness of about 100 Å) and spacers 1110 are ONO.

Memory device 1102 includes source/drain regions 58 extending into materials 40 and 26. Source/drain regions 58 can comprise identical constructions to those described above with reference to FIG. 7. Additionally, source/drain regions 58 can be encompassed by an active region of memory device 1102, with such active region preferably having the preferred characteristics described above with reference to FIG. 6. In other words, a majority, and typically an entirety, of the active region extending within material 26 is preferably within a single crystal of material 26, and a majority or entirety of the active region extending within material 40 is preferably within a single crystal of material 40.

A first conductive interconnect 1112 extends to one of the source/drain regions 58, and a second conductive interconnect 1114 extends to the other of the source/drain regions. Conductive interconnect 1112 extends to a bitline 1118. Interconnect 1114 extends to an appropriate electrical node 1120. Node 1120 is typically held to a desired reference potential, such as ground.

An insulative material 62 extends around structure 1102, as well as around interconnects 1112 and 1114. Insulative material 62 can comprise any suitable material, including, for example, oxide, oxide/nitride and/or BPSG.

The non-volatile floating gate FET device of FIG. 27 can have two stable thresholds. In the low threshold conductive state (state "0"), electronic charge in the floating gate is minimal and consequently an appropriate positive potential on the control gate (wordline) will turn the transistor on and will conduct current between the drain (bitline) and source (reference potential). In the high threshold nonconductive state (state "1"), electronic charge in the floating gate is maximal and consequently the positive potential is not sufficient to turn the transistor on. Therefore, no current flows between the drain (bitline) and source (reference potential). The device state ("1" or "0") remains permanent until altered by programming. Programming (known as "writing" or "erasing") of the device is accomplished by imposing appropriate high potential between the control gate and the substrate while bitline and reference potentials are made to float.

FIG. 28 illustrates a construction 1150 showing another aspect of the invention. In referring to FIG. 28, similar numbering will be utilized as was used above in describing FIG. 27.

Construction 1150 comprises a non-volatile floating plate device 1152 which is similar to the device 1102 described above with reference to FIG. 27 in many respects. A difference between construction 1150 and construction 1100 of FIG. 27 is that the floating gate of FIG. 27 is replaced by a floating plate charge trapping material 1154. Floating plate 1154 can have thickness of less than 150 Å, and typically has a thickness of less than or equal to about 50 Å. Floating gate 1104 of FIG. 10 and floating plate 1154 are both charge trapping media (or elements) surrounded by electrically insulative material. However in contrast to the floating gate 1104, floating plate 1154 is an insulative material containing charge trapping centers. In particular aspects, material 1154 can comprise an appropriate silicon rich insulator (such as silicon rich nitride or silicon rich oxide). The term "silicon rich", indicates that the amount of silicon is greater than the amount typically stoichiometrically present. Thus, silicon rich oxide can comprise, consist essentially of, or consist of silicon and oxygen, and has an atomic ratio of silicon to oxygen that is greater than 1:2 (with 1:2 being the ratio stoichiometrically present in silicon dioxide). Silicon rich nitride can comprise, consist essentially of, or consist of silicon and nitrogen, and has an atomic ratio of silicon to nitrogen that is greater than 3:4 (with 3:4 being the ratio stoichiometrically present in $Si_3N_4$). The actual amount of silicon enrichment can be determined from a refractive index of the silicon rich material. A typical silicon rich nitride will have an index of refraction of greater than 2.10, and frequently greater than 2.35; and a typical silicon rich oxide will have an index of refraction greater than 1.85. The term "silicon enriched" can be used as a synonym for the term "silicon rich".

The insulative materials 52, 1108 and 1110 of FIG. 28 can be identical to those of FIG. 27. Accordingly material 52 can comprise $SiO_2$, and materials 1108 and 1110 can comprise ONO. It can, however, be advantageous to utilize high k dielectric materials for material 1108 of the FIG. 28 structure due to the charge trapping characteristics of such materials. Accordingly the material 1108 of FIG. 28 can comprises alumina, zirconia, or other high k materials.

The floating plate device of FIG. 28 can be better than that of FIG. 27 for particular applications, in that the floating plate device can program at a significantly lower voltage than a floating gate device, and exhibit superior endurance (number of write/erase cycles) as compared to a floating gate device.

The non-volatile devices of FIGS. 27 and 28 can be, for example, EPROM devices, EEPROM devices, field programmable gate array devices (FPGA devices) and/or flash devices. Utilization of Si/Ge layer 26 can improve performance of the devices relative to prior art devices having source/drain regions extending into materials consisting of conductively-doped silicon. The performance of the devices can be further enhanced by utilizing a layer 26 having a relaxed crystalline lattice in combination with a layer 40 having a strained crystalline lattice for reasons similar to those discussed above with reference to FIGS. 1–9.

Figure 29:
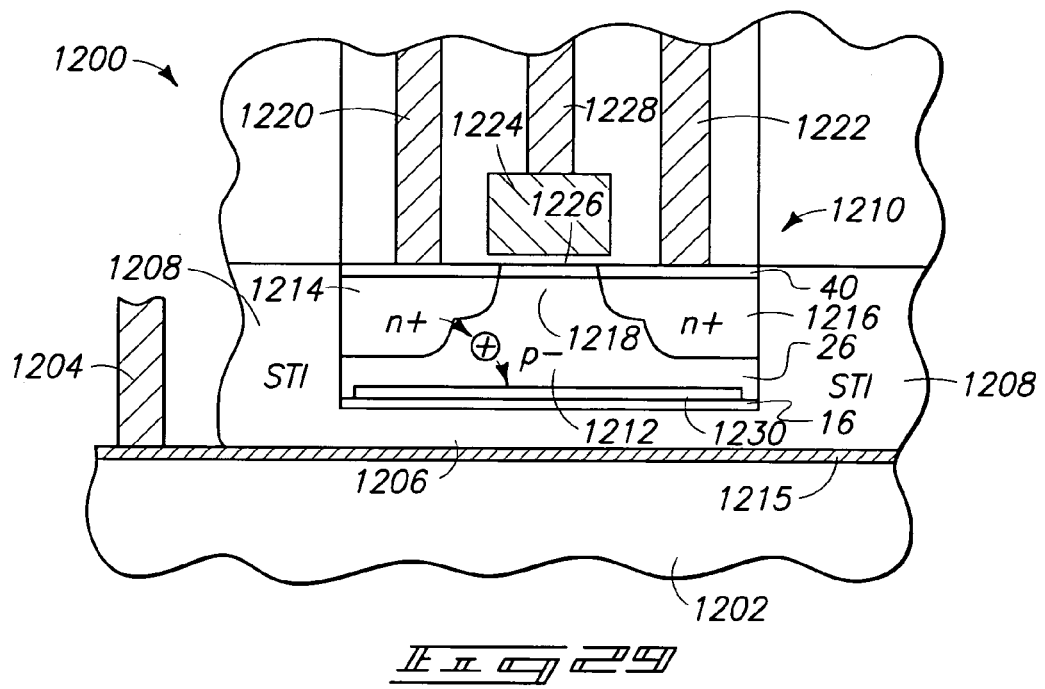
FIG. 29 illustrates an n-channel one transistor SOI non-volatile memory cell according to an aspect of the present subject matter.

FIG. 29 illustrates an n-channel one transistor SOI non-volatile memory cell according to an aspect of the present subject matter. The memory cell 1200 is formed on a substrate 1202 having a conductive upper surface 1215. Substrate 1202 can comprise materials of the type described previously with respect to FIGS. 1–9, and can therefore comprise one or more of semiconductor material, glass, aluminum oxide, silicon dioxide, metal and plastic. In particular applications, substrate 1202 can comprise a silicon wafer. The conductive overlayer 1215 is integrated on the top surface of substrate 1202. A substrate contact 1204 connects with conductive material 1215, and through material 1215 electrically connects and couples to all memory cells. If substrate 1202 comprises an electrically conductive upper surface, overlayer 1215 can be omitted and contact 1204 can be connected directly to the upper surface of substrate 1202. Although only one contact 1204 is shown, it is to be understood that there could be two or more contacts in various aspects of the invention.

The memory cell 1200 is isolated from the substrate 1202 via a buried insulator, such as a buried oxide (BOX) layer 1206, and from other devices (now shown) via shallow trench isolation (STI) regions 1208. Layer 1206 can comprise the same materials as the layer 14 of FIGS. 1–9.

A partially depleted SOI (PD-SOI) NFET 1210 is illustrated. The transistor 1210 includes a floating body region 1212, a first diffusion region 1214, and a second diffusion region 1216. A channel region 1218 is formed in the body region 1212 between the first and second diffusion regions 1214 and 1216. With respect to the illustrated n-channel FET, the body region 1212 is doped with p-type impurities, and the first and second diffusion regions 1214 and 1216 are doped with n+ impurities. The illustrated memory cell 1200 includes a bitline contact or drain contact 1220 connected to the first diffusion region 1214, and a source line contact 1222 connected to the second diffusion region 1216. A gate 1224, such as a polysilicon gate, is separated from the channel region 1218 by a gate insulator region 1226. The illustrated memory cell 1200 includes a wordline contact or gate contact 1228 connected to the gate 1224. The diffusion regions and body region are not shown with cross-hatching in FIG. 29 in an effort to simplify the drawings, but is to be understood that such regions would be similar to the cross-hatched diffusion and active regions described with reference to FIGS. 7–9, Transistor 1210 is formed over the layers 16, 26 and 40 described previously with respect to FIGS. 1–9. The diffusion regions (or source/drain regions) 1214 and 1216 extend into materials 40 and 26. Diffusion regions 1214 and 1216 can comprise identical constructions to those described above with reference to FIG. 7. Additionally, diffusion regions 1214 and 1216 can be encompassed by an active region of transistor device 1210, with such active region preferably having the preferred characteristics described above with reference to FIG. 6. In other words, a majority, and preferably an entirety, of the active region extending within material 26 is preferably within a single crystal of material 26, and a majority or entirety of the active region extending within material 40 is preferably within a single crystal of material 40.

Unlike conventional FET devices, the body region 1212 of the illustrated FET device includes a charge trapping region 1230. Relatively simple fabrication techniques can be used to incorporate the charge trapping region in the body region. However, as one of ordinary skill in the art will understand upon reading and comprehending this disclosure, the incorporation of the charge trapping region 1230 significantly improves scalability and functionality without complex fabrication techniques. Charge trapping region 130 provides the nonvolatility of the memory cell.

The location of the charge trapping region 1230 in the body region 1212 can be varied. In various embodiments, the location the charge trapping region 1230 is on or near the BOX-body interface. In other embodiments, the charge trapping region 1230 is located elsewhere in the body region 1212 at a sufficient depth such that it will not interfere with transistor channel conductance. For example, various embodiments of the present subject matter position the charge trapping region 1230 in the body region 1212 at a depth below 200 Å–300 Å (20–30 nm) from the surface where the charge flows. In the shown aspect of the invention, charge trapping region 1230 is above an upper surface of layer 16, within Ge/Si layer 26, and below layer 40. In other words, charge trapping layer 1230 is entirely contained within layer 26. It is to be understood, however, that in other aspects (not shown) charge trapping layer 1230 can extend into either layer 16 or 40. Layer 1230 can be entirely contained in one of layers 16 or 40, or can be contained in a combination of layers 16/26 or a combination of layers 26/40. Further, layer 1230 can extend at an angle relative to surfaces of layers 16, 26 and 40 so that layer 1230 may traverse all of the layers 16, 26 and 40.

The charge trapping region 1230 provides localized quantum wells that are initially neutral. These neutral wells attract charges and maintain the charge species. Thus, charge traps are distinguished from recombination centers, which have been proposed in a body region to assist with the recombination of charges. Unlike the charge trapping regions, a recombination center provides a charged localized quantum well. The charged well attracts opposite charges which recombine to facilitate charge neutrality.

One of ordinary skill in the art will understand, upon reading and comprehending this disclosure, that the charge trapping region is capable of being tailored to provide the device with desired characteristics. For example, various embodiments of the present subject matter are designed to repeatedly trap and de-trap charges in the charge trapping region so as to form a non-volatile random access memory. Various embodiments provide a charge trapping region with deep traps, and are designed to form a non-volatile, write once, read only memory.

In various embodiments, the charge trapping function of the charge trapping region 1230 is provided by a charge trapping layer. According to various embodiments, the charge trapping layer includes a silicon-rich-insulator (SRI) layer, such as a silicon-rich-nitride (SRN), silicon rich oxynitride or silicon-rich-oxide (SRO) layer, for example. In various aspects, appropriate compositions of oxynitrides, transition metal-oxides, metal silicides and composites or laminates can be used to form charge trapping layers; and accordingly the charge trapping layers can, for example, comprise, consist essentially of, or consist of silicon oxynitrides, transition metal oxide and/or metal silicide. Nanovoids also can be used to form charge trapping layers. These examples are not intended to be an exhaustive list of the number of ways to form charge trapping layers that can be used according to the present subject matter.

Positive charges (holes) are generated in the PD-SOI NFET due to impact ionization at the drain edge and alter the floating body potential. In this embodiment a part of these charges is trapped by the charge trapping region 1230 (e.g. SRN layer) in the body region 1212. The trapped charges affect the threshold voltage ($V_T$), and thus the channel conductance, of the PD-SOI-FET. According to various embodiments, the source current ($I_S$) of the PD-SOI-FET is used to determine if charges are trapped in the body region, and thus is used to determine the logic state of the memory cell.

Figure 30:
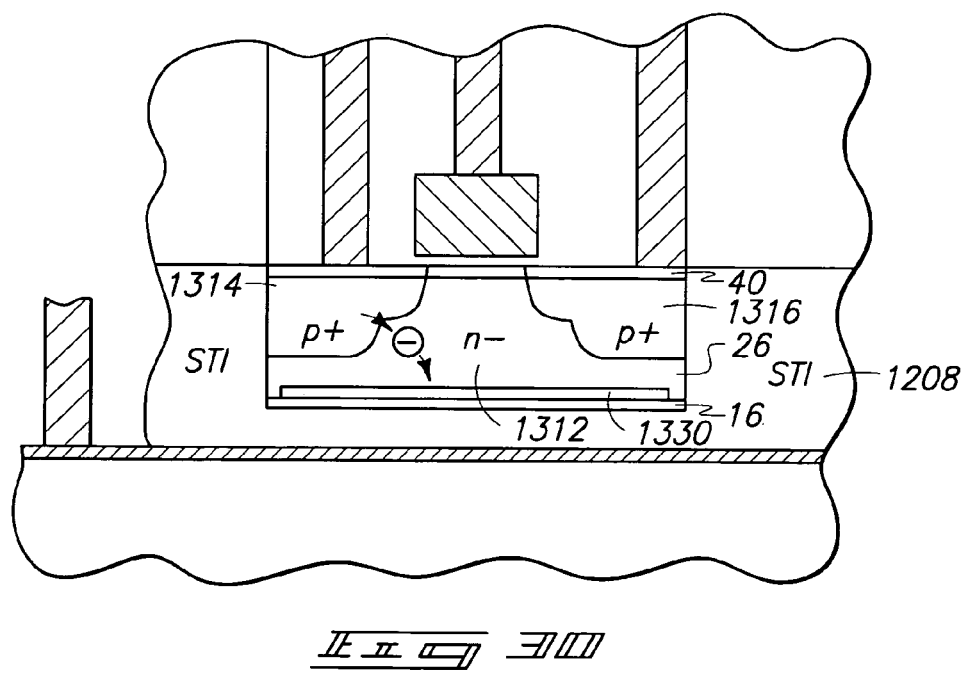
FIG. 30 illustrates a p-channel one transistor SOI non-volatile memory cell according to an aspect of the present subject matter.

FIG. 30 illustrates a p-channel one transistor SOI nonvolatile memory cell according to various embodiments of the present subject matter. One of ordinary skill in the art, upon reading and comprehending this disclosure, will understand the structural similarities between the PD-SOI-PFET device and the PD-SOI-NFET device. Some of these structural similarities are not addressed again here for the purpose of simplifying the disclosure.

With respect to the illustrated PD-SOI-PFET, the body region 1312 is doped with n-type impurities, and the first and second diffusion regions 1314 and 1316 are doped with p+ impurities. Negative charges (electrons) are generated in the PD-SOI-PFET at the drain edge and alter the floating body potential. A part of these charges is trapped by the charge trapping region 1330 (e.g. SRN layer) in the body region 1312. The trapped charges affect the threshold voltage ($V_T$), and thus the channel conductance, of the PD-SOI-PFET in a similar fashion to the PD-SOI-NFET. According to various embodiments, the source current ($I_S$) of the PD-SOI-PFET is used to determine if charges are trapped in the body region, and thus is used to determine the logic state of the memory cell.

The transistor of FIG. 30 is, like that of FIG. 29, formed over the layers 16, 26 and 40 described previously. The diffusion regions (or source/drain regions) 1314 and 1316 extend into materials 40 and 26. Diffusion regions 1314 and 1316 can comprise identical constructions to those described above with reference to FIG. 9. Additionally, diffusion regions 1314 and 1316 can be encompassed by an active region of transistor device of FIG. 30, with such active region preferably having the preferred characteristics described above with reference to FIG. 6. In other words, a majority, and typically an entirety, of the active region extending within material 26 is preferably within a single crystal of material 26, and a majority or entirety of the active region extending within material 40 is preferably within a single crystal of material 40. Further, material 26 preferably comprises Si/Ge having a relaxed crystalline lattice, and material 40 preferably comprises one or both of Si and Ge in the form of a crystalline material having a strained crystalline lattice. Materials 26 and 40 can be either polycrystalline or monocrystalline, in accordance with aspects of the invention described above with reference to FIGS. 1–9.

Charge trapping region 1330 can be, like the above-described charge trapping layer 1230, entirely contained within one of layers 16, 26 and 40; or can be contained within various combinations of layers 16, 26 and 40.

The devices described above can be utilized to form novel assemblies. For instance, exemplary logic device assemblies incorporating some of the methodology from above are described in FIGS. 31–38.

Figure 31:
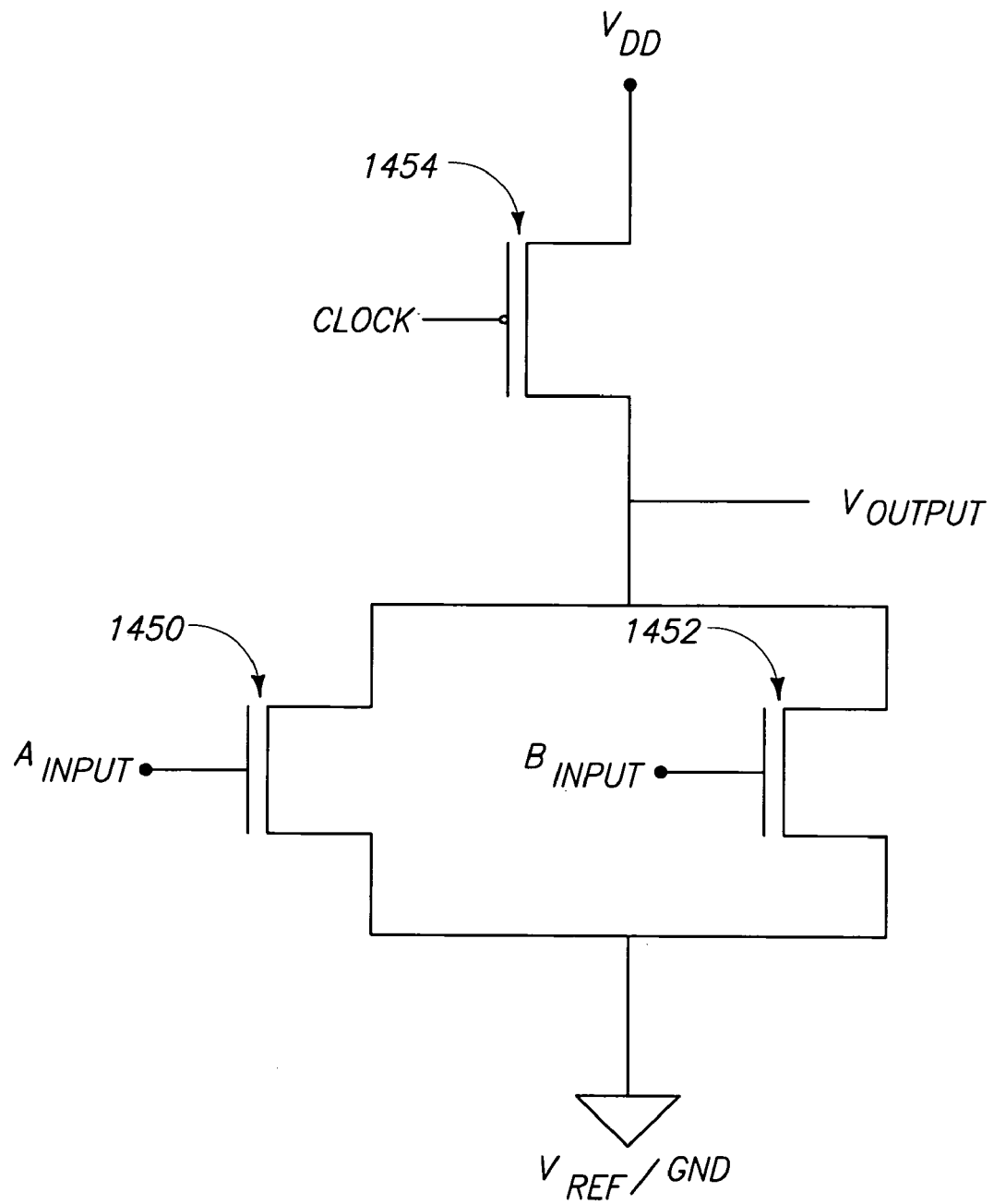
FIG. 31 illustrates a circuit schematic of an exemplary NOR logic construction according to an aspect of the present invention.

Referring initially to FIG. 31, such illustrates a circuit schematic of a two-input NOR logic construction. The construction includes a pair of NFET transistors 1450 and 1452 connected in parallel providing the two inputs, and also includes a PFET transistor 1454 in series with the NFET pair to provide clocking. A first input "A" is provided to a gate of NFET device 1450, and a second input "B" is provided to the transistor gate of NFET device 1452. Additionally, a clock input is provided to the gate of PFET device 1454. The NFET devices connect with one source/drain of the PFET device by the logic output node, and are between the PFET device (connected between $V_{DD}$ and the logic output) and $V_{REF}$/GND. The other source/drain of the PFET device connects to $V_{DD}$.

Figure 32:
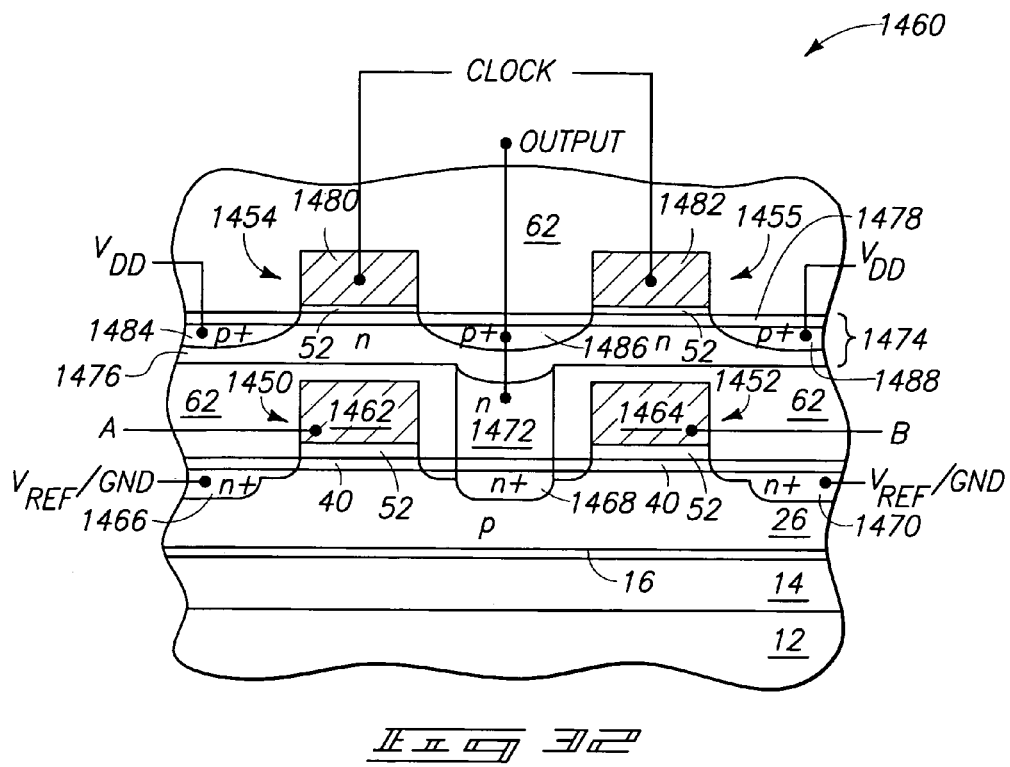
FIG. 32 is a fragmentary, diagrammatic cross-sectional side view of an exemplary NOR logic construction according to an aspect of the present invention.

FIG. 32 is a cross-sectional view of an exemplary construction corresponding to the circuit described above with reference to FIG. 31. The construction of FIG. 32 is referred to generally as 1460. In referring to construction 1460, similar numbering will be used as was utilized above in describing the constructions of FIGS. 1–9, where appropriate. In the specific construct of FIG. 32, the PFET device of FIG. 31 is split into two "half-width" PFET devices 1454 and 1455 connected in parallel to provide the logical equivalent of the whole PFET device of FIG. 31. Such can allow layout density and symmetry of the NOR logic building block to be achieved, as well as improve performance and wireability. One aspect of the potential improvement in performance obtained by utilizing methodologies of the present invention, is that such methodologies can reduce the amount and complexity of wiring. Such reduction can remove interconnect delay and other delays associated with wiring, which can translate into enhanced speed.

Construction 1460 includes substrate 12, insulative material 14, and layers 16, 26 and 40 of the above-described constructions of FIGS. 1–9.

Construction 1460 further includes a pair of NFET devices 1450 and 1452. The NFET devices comprise gates 1462 and 1464, respectively, over layer 40 and separated from layer 40 by gate oxide 52.

NFET device 1450 comprises source/drain regions 1466 and 1468 extending into layers 26 and 40, and NFET device 1464 comprises source/drain regions 1468 and 1470 extending into layers 26 and 40. Source/drain region 1468 is common to devices 1450 and 1452, and can be considered a shared source/drain region. As source/drain region 1468 is shared between devices 1450 and 1452, the devices have overlapping active regions. The overlapping active regions include the source/drain regions, and channel regions beneath gates 1462 and 1464 and extending between the source/drain regions. In particular aspects, a majority, and typically an entirety, of the overlapping active regions within layer 26 is contained within a single crystal of layer 26, and a majority or entirety of the overlapping active regions within layer 40 is contained within a single crystal of layer 40. Layers 26 and 40 can, as discussed above with reference to the embodiments of FIGS. 1–9, comprise polycrystalline or monocrystalline materials.

NFET constructions 1450 and 1452 are similar to the NFET construction 50 described with reference to FIG. 7, and can be formed utilizing methodology analogous to that described previously for forming the construction of FIG. 7. It is noted that the layers 26 and 40 are shown with cross-hatching in FIG. 7 to indicate that such layers are conductive, whereas the layers 26 and 40 are not shown with cross-hatching in FIG. 32. The cross-hatching is not shown in FIG. 32 in order to simplify the drawing, but it is to be understood that the layers 26 and 40 of FIG. 32 are similarly conductive to the layers 26 and 40 described above with reference to FIG. 7.

A conductive pedestal 1472 extends upwardly from shared source/drain region 1468. Pedestal 1472 is in electrical connection with source/drain region 1468, and in particular aspects comprises n-type doped semiconductive material, such as, for example, n-type doped silicon or n-type doped silicon/germanium. Pedestal 1472 joins a construction 1474 which supports PFET devices 1454 and 1455, and acts as a substrate for the "half-width" devices. Construction 1474 comprises a layer 1476 of semiconductive material. Layer 1476 can comprise, consist essentially of, or consist of, for example, n-type doped silicon. In other aspects, layer 1476 can comprise, consist essentially of, or consist of n-type doped silicon/germanium, with the germanium being present to a concentration of from about 10 atom % to about 60 atom %. In one aspect of the invention, pedestal 1472 is formed by epitaxial growth over crystalline material of layer 40, and subsequently layer 1476 is formed by epitaxial growth from pedestal 1472.

A layer 1478 is formed over layer 1476. Layer 1478 can comprise, for example, appropriately-doped silicon or appropriately-doped silicon/germanium. In some aspects, layer 1476 can comprise a relaxed crystalline lattice and layer 1478 can comprise a strained crystalline lattice. Accordingly, layers 1476 and 1478 can comprise identical constructions to those of the layers 26 and 40, respectively, in some of the above-described embodiments of the invention.

PFET constructions 1454 and 1455 comprise gates 1480 and 1482, respectively, with such gates being separated from layer 40 by pad oxide 52.

PFET device 1454 comprises p-type doped diffusion regions 1484 and 1486 extending into layers 26 and 40; and PFET construction 1455 comprises source/drain regions 1486 and 1488 extending into layers 26 and 40. Source/drain region 1486 is common to PFET devices 1454 and 1455, and accordingly can be considered to be shared between the devices, thus forming a parallel pair of "half-width" PFET devices. Devices 1454 and 1455 have overlapping active regions, and in particular aspects, the majority or even the entirety of the overlapping active regions within layer 1476 can be contained within a single crystal of the material of layer 1476, and a majority or entirety of the overlapping active regions within layer 1478 can be contained within a single crystal of the material of layer 1478.

PFET constructions 1454 and 1455 are similar to the PFET construction 70 described with reference to FIG. 9, and can be formed utilizing methodology analogous to that described previously for forming the construction of FIG. 9. It is noted that the layers 26 and 40 are shown with cross-hatching in FIG. 9 to indicate that such layers are conductive, whereas the layers 1476 and 1478 are not shown with cross-hatching in FIG. 32. The cross-hatching is not shown in FIG. 11 in order to simplify the drawing, but it is to be understood that the layers 1476 and 1478 of FIG. 11 are similarly conductive to the layers 26 and 40 described above with reference to FIG. 9.

An insulative material 62 extends around various of the shown structures to electrically isolate and/or support the structures. Material 62 can comprise, for example, BPSG, $SiO_2$, and/or silicon nitride.

A clock circuit is electrically connected with gates 1480 and 1482, and $V_{DD}$ is in electrical connection with source/drain regions 1484 and 1488. Further, $V_{REF}$ is in electrical connection with source/drain regions 1466 and 1470 of NFET transistor devices 1450 and 1452. Inputs "A" and "B" are in electrical connection with NFET gates 1462 and 1464, respectively. An output is in electrical connection with shared PFET source/drain region 1486, as well as with the n-type doped semiconductive material of pedestal 1472.

Figure 33:
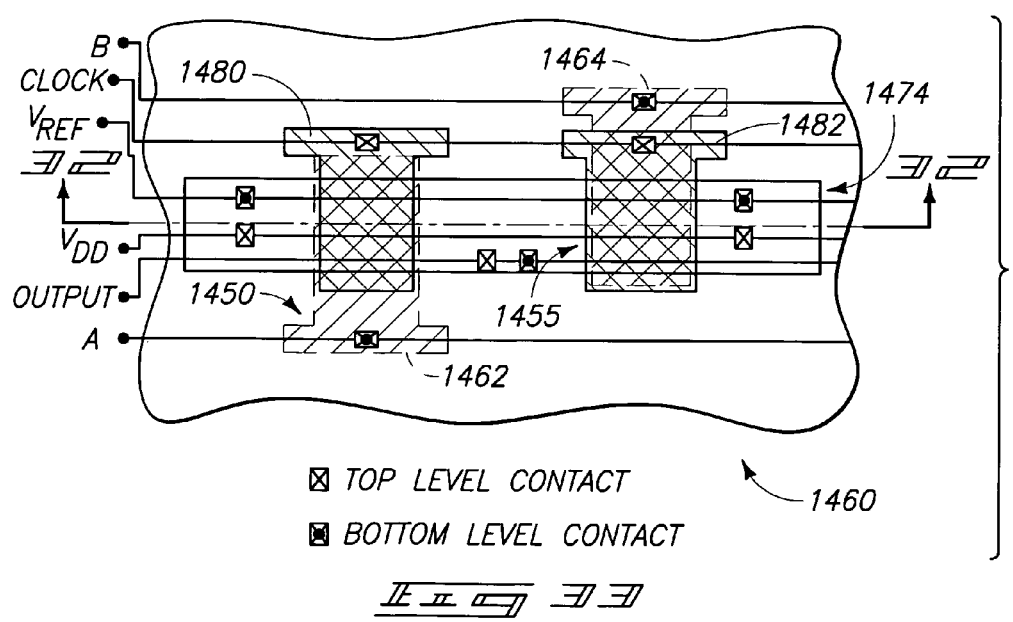
FIG. 33 is a diagrammatic top view of the exemplary NOR logic construction of FIG. 32, with the cross-section of FIG. 32 being along the line 32—32 of FIG. 33.

It is to be understood that various features are shown diagrammatically in FIG. 32 in an effort to simplify the figure. For instance, sidewall spacers would typically be formed along sidewalls of gates 1462, 1464, 1480 and 1482. Such sidewall spacers are not shown in the diagrammatic illustration of FIG. 32. Also, gates 1462 and 1464 would typically comprise multiple layers of conductive materials, with one of the layers being n-type doped silicon; and gates 1480 and 1482 would typically comprise multiple layers of conductive materials, with one of the layers being p-type doped silicon. The multiple layers are not shown in the gates. Also, it is noted that a lower layer corresponding to a silicon seed layer (analogous to the layer 16 described in the embodiments of FIGS. 1–9), can be formed in the construction 1474, although such layer is not present in the shown embodiment FIG. 33 is a diagrammatic top view of the construction 1460 and shows the overlap of the PFET gates 1480 and 1482 relative to elevationally lower NFET gates 1462 and 1464. FIG. 33 also shows the orientations of various wiring layers relative to all appropriate nodes of NFET devices 1450 and 1452, and PFET devices 1454 and 1455. It is to be noted that all nodes including the inputs A and B, the output, the $V_{DD}$, and the $V_{REF}$ can all be provided along the same wiring level to demonstrate the dense wireability of such logic construct.

Figure 34:
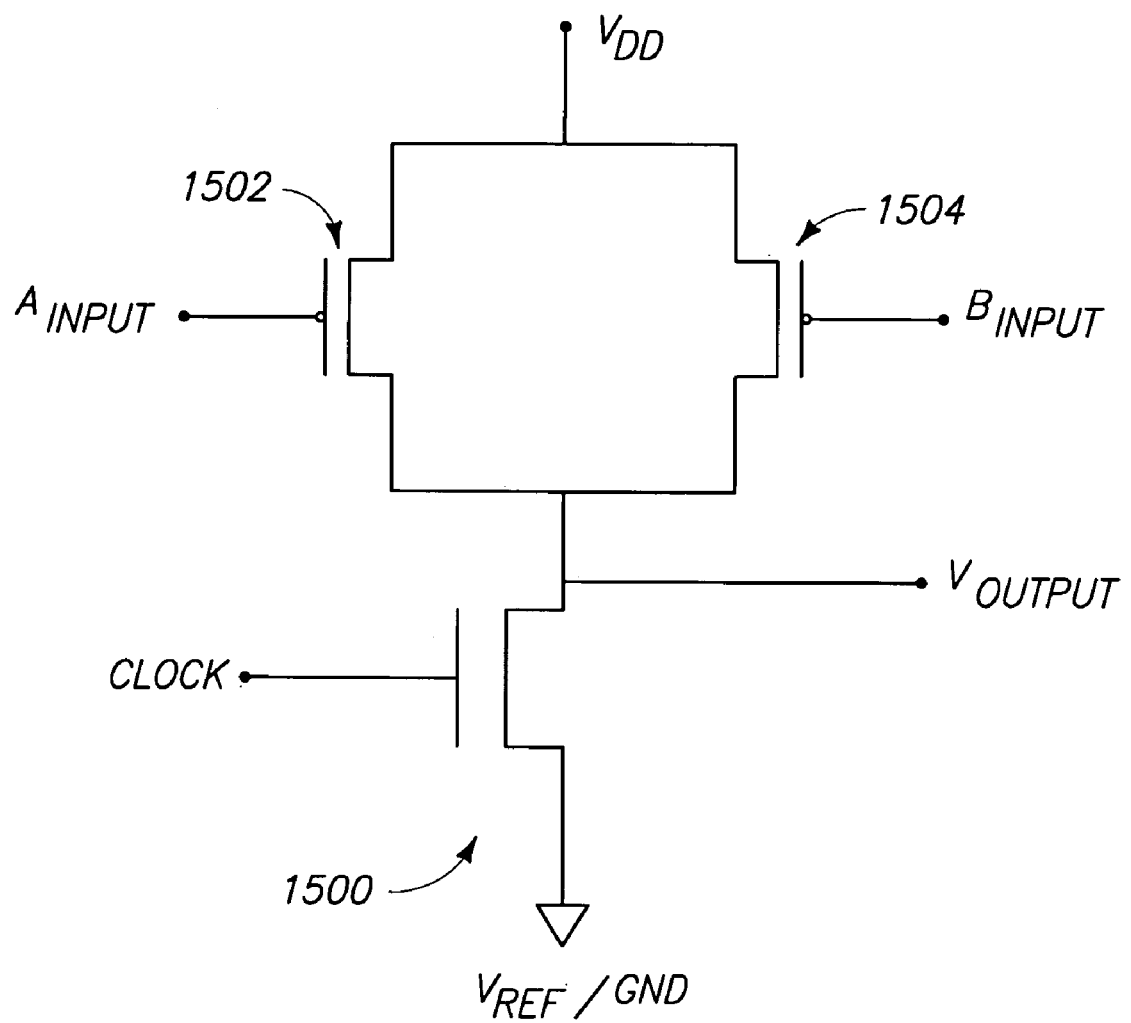
FIG. 34 illustrates a circuit schematic of an exemplary NAND logic construction according to an aspect of the present invention.

Referring next to FIG. 34, such illustrates a circuit schematic of an exemplary two-input NAND logic gate in accordance with an aspect of the present invention. The logic gate comprises a pair of PFET transistor devices 1502 and 1504 connected in parallel to provide the two inputs (A and B), and an NFET device 1500 to provide the clock input and to discharge the output potential node to ground when clocked. Source/drain regions of PFET devices 1502 and 1504 are in electrical connection with $V_{DD}$ and $V_{output}$. NFET device 1500 has a source/drain region in electrical connection with $V_{output}$, and also has a source/drain region in electrical connection with the $V_{REF}$/GND. The NAND construction comprises the parallel PFET input pairs connected between the $V_{DD}$ node and the logic output, with the NFET in series between the output and ground.

Figure 35:
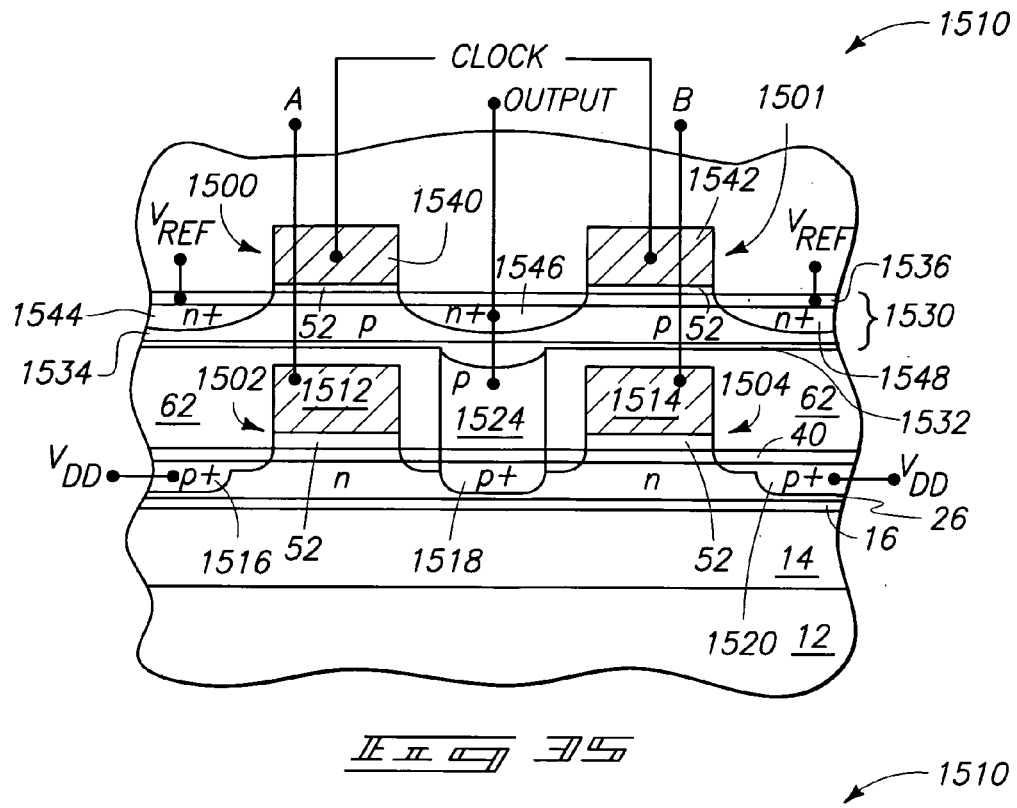
FIG. 35 is a fragmentary, diagrammatic cross-sectional side view of an exemplary NAND logic construction according to an aspect of the present invention.

FIG. 35 is a cross-sectional view of a construction 1510 comprising the two-input NAND described with reference to FIG. 34. In referring to construction 1510, similar numbering will be used as was used above in describing FIGS. 1–9, where appropriate.

In the specific construct of FIG. 35, the NFET device of the NAND circuit of FIG. 34 is split into two "half-width" NFET devices (1500 and 1501), connected in parallel to provide the logical equivalent of the whole NFET of FIG. 34. Such can allow layout density and symmetry of the NAND building block to be achieved.

Construction 1510 comprises substrate 12, insulative material 14, and layers 16, 26 and 40. PFET devices 1502 and 1504 comprise gates 1512 and 1514, respectively, over layer 40. Gates 1512 and 1514 are separated from layer 40 by gate oxide 52.

PFET device 1502 further comprises source/drain regions 1516 and 1518 extending into layers 40 and 26; and device 1504 comprises source/drain regions 1518 and 1520 extending into layers 26 and 40. Source/drain region 1518 is shared between devices 1502 and 1504. Devices 1502 and 1504 therefore have overlapping active regions. In particular aspects, the majority or entirety of the overlapping active regions within layer 26 can be within a single crystal of the material of layer 26, and the majority or entirety of the overlapping active regions within layer 40 can be within a single crystal of the material of layer 40. The individual PFET constructions can be identical to the PFET construction 70 described with reference to FIG. 9, and accordingly layer 26 can comprise a relaxed crystalline lattice, and layer 40 can comprise a strained crystalline lattice.

A conductive pedestal 1524 extends upwardly from source/drain region 1518 to a structure 1530. Pedestal 1524 can comprise, for example, a conductively-doped semiconductive material, and the shown exemplary pedestal is a p-type doped material. The semiconductive material of pedestal 1524 can be, for example, silicon or silicon/germanium. Pedestal 1524 can be formed by epitaxial growth from layer 40, and accordingly can comprise a crystalline matrix.

Structure 1530 comprises layers 1532, 1534 and 1536. Layers 1532, 1534 and 1536 can comprise identical constructions to the layers 16, 26 and 40 described previously, and accordingly can comprise silicon seed crystals, silicon/germanium in a relaxed crystalline lattice, and silicon or silicon/germanium in a strained crystalline lattice, respectively. Layers 1532, 1534 and 1536 can be formed over conductive pedestal 1524 by epitaxial growth from a crystalline material within pedestal 1524.

NFET devices 1500 and 1501 are supported by structure 1530. NFET device 1500 comprises a gate 1540, and NFET device 1501 comprises a gate 1542. NFET device 1540 further comprises source/drain regions 1544 and 1546 extending into layers 1534 and 1536; and NFET device 1501 comprises source/drain regions 1546 and 1548 extending into layers 1534 and 1536. Source/drain region 1546 is shared between devices 1500 and 1501, and accordingly devices 1500 and 1501 comprise overlapping active regions. In particular aspects, a majority or entirety of the overlapping active regions within layer 1534 is contained within a single crystal of Si/Ge material within layer 1534, and a majority or entirety of the overlapping active regions within layer 1536 is contained within a single crystal of a strained crystalline material of layer 1536.

A clock circuit is in electrical connection with gates 1540 and 1542 of the NFET devices, and inputs "A" and "B" are in electrical connection with the gates 1512 and 1514 of the PFET devices. The source/drain regions 1544 and 1548 of the NFET devices are in electrical connection with $V_{REF}$, while the shared source/drain region 1546 is in electrical connection with an output of the logic construction. It is noted that the output is also in electrical connection with the p-type doped semiconductor material of pedestal 1524. Source/drain regions 1516 and 1520 of the PFET devices are in electrical connection with $V_{DD}$.

Figure 36:
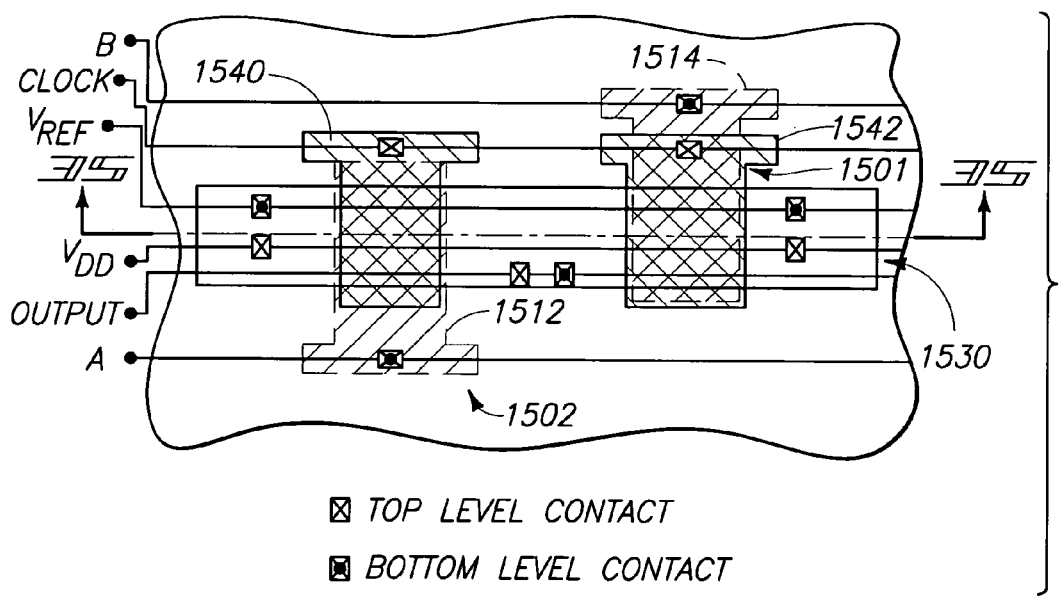
FIG. 36 is a diagrammatic top view of the exemplary NAND logic construction of FIG. 35, with the cross-section of FIG. 35 being along the line 35—35 of FIG. 36.
Figure 44:
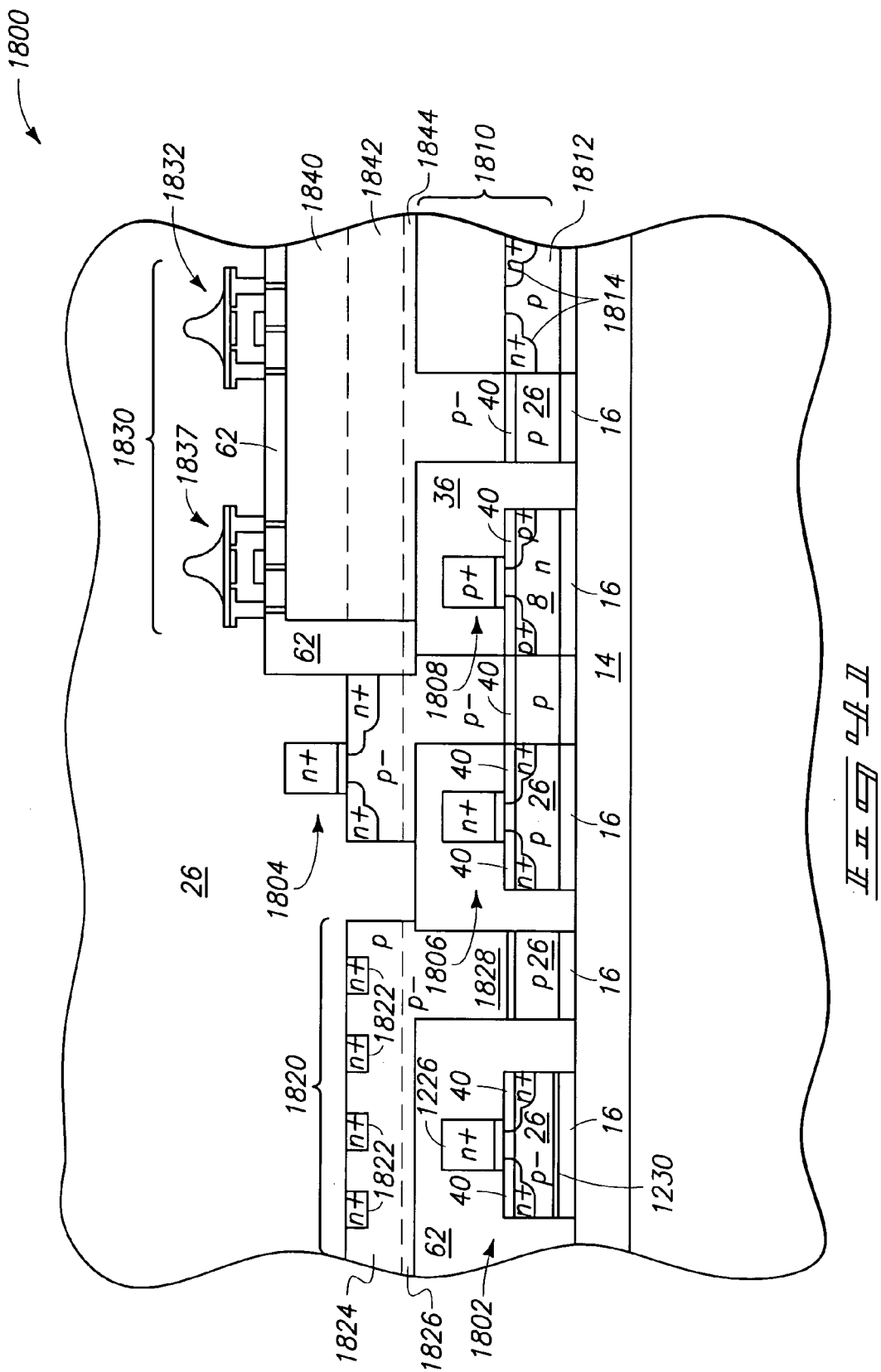

FIG. 36 is a diagrammatic top view of the construction 1510, and illustrates the overlap of NFET devices 1500 and 1501 relative to the elevationally lower PFET devices 1502 and 1504. FIG. 15 also represents the orientations of various first level metal wiring interconnect layers relative to all appropriate nodes of PFET devices 1502 and 1504 as well of the NFET devices 1500 and 1501. It should be noted that interconnections for all nodes are provided by only one level of metal wiring to demonstrate the dense wireability achievable with such logic construct. Such dense wireability can translate into enhanced performance of the devices by reducing interconnect associated delays.

Referring to FIG. 37, a schematic diagram of a 2-NOR cross-coupled latch (also referred to as a flip-flop) is illustrated as an example of a higher level logic building block. The device comprises two inputs ($A_1$ and $B_1$). The FIG. 37 device can be formed as a combination of devices of the type described in FIG. 31. The flip-flop of FIG. 37 is formed from a pair of NOR circuits of FIG. 31 by cross-coupling the second NFET input gates ($A_2$ and $B_2$) of each NOR circuit.

FIG. 38 illustrates a top view of a construction 1590 with a compact two-level metal wireability scheme corresponding to the flip-flop of FIG. 37, and shows that such construction can be formed over a relatively small footprint of a substrate by stacking PFET and NFET devices relative to one another.

The flip-flop of FIG. 38 demonstrates twelve metal-one ($M_1$) wiring levels horizontally and five metal-two ($M_2$) levels vertically for interconnecting all appropriate nodes of the latch for full functionality and wireability. It should be noted that $M_1$ wiring channels are grouped into six wiring channels to route $V_{DD}$, ground and clock signals. It should also be noted that the three metal-two ($M_2$) wiring channels bring $V_{DD}$, ground and clock signal levels to $M_1$ via $M_2$-to-$M_1$ contacts, while two other $M_2$ wiring channels are used for $A_2$ and $B_2$ cross-coupling and to bring out the output levels A and B. The scheme, thereby, demonstrates a highly efficient and compact wireability of a higher level logic block, such as a latch.

The design of FIGS. 37 and 38 is a two-input clocked NOR logic cell for device width (W) over length (L) ratio of 10:1. Since PFET gates are in parallel mode, the devices effectively supply twice (W/L equivalent of nearly 20:1) the current. Consequently, such design can approximately balance the mobility ratios of electrons and holes, even though the electrons can have nearly two-times the mobility of the holes. The stacked configuration can therefore allow dense logic cells to be formed. The stacked configuration can also allow wiring channels interconnecting devices to utilize only one level of metal interconnect (as shown in FIG. 33). The dense NAND logic cell layout of FIGS. 35–36 is similar to the NOR cell of FIGS. 32–33, but utilizes stacked top devices which are NFET, while the bottom input devices are PFETs. The stacked approach of FIGS. 32–33 and 35–36 can be utilized to develop various random logic cell libraries, including, for example, the cross-coupled dense flip-flop of FIGS. 37 and 38.

There are numerous advantages to utilizing only a single level of wiring in forming logic devices, including, for example, conservation of semiconductor device real estate, reduction of the number of process steps and masking levels utilized in forming logic devices, and reduction of interconnect delays.

Applications for memory cells and logic constructions can include electronic systems for use in memory modules, device drivers, power modules, communication modems, processor modules, and application-specific modules, and may include multilayer, multichip modules. Such devices and circuitry can further be a subcomponent of a variety of electronic systems, such as a clock, a television, a cell phone, a personal computer, an automobile, an industrial control system, an aircraft, and others.

The various technologies discussed above in FIGS. 1–38 offer numerous possibilities for electronic device applications. The components can be incorporated into various system-on-chip and system-on-module assemblies. Such assemblies can incorporate integrated data storage (memory) devices and logic devices into functional relationships with one another. Exemplary devices can include receivers, transmitters, modulators, detectors, wave-guides, actuators, sensors, switches etc. In particular applications, the receivers can be optical receivers, and the transmitters can be optical transmitters. In further applications, the actuators, sensors and switches can comprise microelectromechanical systems (MEMS) micromachined in silicon or other semiconductive materials. The various devices can be utilized in digital systems and/or analog systems, and further can be incorporated into radio frequency systems. Further, the devices can be either passive or active if incorporated into radio frequency components such as, for example, radio frequency identification devices (RFIDs).

An exemplary application of the various devices is to incorporate one or more of the devices into a smart identity/data device (SID) which can be utilized for identifying properties or objects, and in particular aspects can be utilized for identifying persons. The device can be formed on any of various substrates, including, for example, alumina ($Al_2O_3$), or any of the various other substrates described above with reference to the substrate 12 of FIG. 1. The various devices formed over the substrate can be stacked, and/or can comprise a set of inter-connected functionally-unique "planar" devices. In particular aspects, three sets of functional devices can be incorporated into a SID. Such devices can include CMOS technology based memory and logic to provide storage and updated data containing the functionality typically associated with DRAM, ROM, and/or FLASH, together with associated logic; active pixel array devices for obtaining a photographic image, with such devices containing, for example, N+/P photodiodes and associated sensing and amplifying devices together with microlens and color filters or with an integrated color pixel (ICP) approach, which can be done without color filter arrays; and finally an artificial fingerprint device which can utilize either polysilicon thin films transistor technology or MEMs fingerprint sensor arrays.

Various of the devices described with reference to FIGS. 1–38 can be incorporated into a SID. For instance, the GLTRAM devices can be incorporated therein, as can NVRAM devices, and/or the various transistor and non-volatile devices. The various devices can be fabricated and stacked on top of a device subset, and/or can be interconnected in "planar" configurations (described with reference to FIG. 41 below).

An exemplary electronic system 1600 which can incorporate one or more of the devices described with reference to FIGS. 1–38 is schematically shown in FIG. 39. Electronic system 1600 comprises a signal generator 1602 in data communication with a processor 1604 which contains data storage 1606 and logic 1608. The signal generator can be configured to receive an input and send a data signal in response thereto to the processor 1604. In such aspects, the signal generator can comprise, for example, an antenna, a light sensing unit for detecting light received from an object (such as, for example, light reflected from a person), or a structure utilized for identifying topography of an object (such as, for example, a device utilized for identifying a print of a person's digit, such as, for example, a fingerprint). Alternatively, or additionally, the signal generator can be configured to respond to a data signal from the processor to generate an output signal. In such aspects, the generator can comprise, for example, a transmitter of light and/or sound.

The data storage 1606 can be accomplished with various devices, including, for example, capacitors, DRAM cells, thyristors, GLTRAM cells, non-volatile storage devices, and/or devices comprising a bipolar transistor in combination with a field effect transistor (such as the above-described BIFETRAM devices).

The logic devices incorporated within structure 1608 can include, for example, CMOS inverters, NOR devices and/or NAND devices, including, for example, 2-NOR cross-coupled latches.

In particular aspects, one or more of the data-storage devices can include an active region extending into a crystalline layer comprising silicon and germanium. The portion of the active region within the crystalline layer can be entirely contained within a single crystal in such layer. In alternative or additional aspects, one or more of the logic devices can have an active region extending into a crystalline layer comprising silicon and germanium, and an entirety of the portion of such active region within the crystalline layer can be contained within a single crystal of such layer. If the data storage devices and logic devices all have active regions extending into a crystalline Si/Ge layer, and all of the portions of the active regions within such layer are within single crystals of such layers, a single monocrystalline Si/Ge material can be utilized upon which the logic and data storage devices are formed in a relatively "planar" configuration.

Although a single processor is shown within the structure 1600, it is to be understood that the structure can include multiple separate processors, and that various of the processors can be in data communication with one another, as well as within one or more signal generators. Also, although the processor is shown as a single module comprising both data storage and logic, it is to be understood that an individual processor can comprise multiple separate modules.

Referring to FIG. 40, a particular embodiment of an electronic assembly is illustrated as an assembly 1700. Such assembly is configured to identify properties of an object, and in the shown exemplary application it is configured as a device which can identify a person. Assembly 1700 comprises a processor 1704. The processor includes logic circuitry 1706 in data communication with data storage circuitry 1708.

The logic circuitry 1706 can include devices having active regions extending into Si/Ge materials. In particular aspects, the Si/Ge materials can be crystalline, and an active region of a device within the crystalline SiGe material can be entirely contained within a single crystal of such material. In additional, or alternative, aspects an active region of a device can extend into a pair of crystalline layers, with one of the crystalline layers having a relaxed crystalline lattice and the other having a strained crystalline lattice. Examples of relaxed crystalline lattice materials and strained crystalline lattice materials are described above with reference to, for example, FIGS. 1–9, where a relaxed crystalline material is shown as material 26 and a strained crystalline lattice material is shown as material 40. Particular logic devices that can be utilized include CMOS inverters, NOR devices, and NAND devices, such as, for example, the various devices described previously in this disclosure.

Data storage devices 1708 can include devices having active regions extending into a crystalline Si/Ge material, with an entirety of a portion of an individual active region within such material being entirely contained within a single crystalline material. Examples of data storage devices having active regions extending into crystalline Si/Ge materials are described previously in this disclosure. In additional, or alternative, aspects the data storage devices can have active regions extending into a pair of crystalline layers, with one of the crystalline layers having a relaxed crystalline lattice and the other having a strained crystalline lattice. Exemplary devices formed over a pair of crystalline materials in which one of the crystalline materials has a relaxed crystalline lattice and the other has a strained crystalline lattice have been described previously in this disclosure, with exemplary material having a relaxed crystalline lattice being the material 26 of various of the previous figures, an exemplary material having a strained crystalline lattice being the material 40 of various of the previous figures.

The data storage devices can include, for example, one or more devices selected from the group consisting of DRAM cells, GLTRAM cells non-volatile storage devices, and BIFETRAM cells.

Assembly 1700 further includes light sensing devices 1710 and digit print devices 1712 in data communication with processor 1704. The light sensing devices and digit print devices can optionally be in data communication with one another, as indicated by the dashed arrows extending between the light sensing devices and the digit print devices.

Light sensing devices are devices configured to detect light received from a person. Exemplary light sensing devices are pixels of the type described in, for example, Wuu et al., "A High Performance Active Pixel Sensor With 0.18 Micrometer CMOS Color Imager Technology", I.E.D.M. Technical Digest, 2001, pages 555–558; or described in Catrysse et al., "An Integrated Colored Pixel in 0.18 Micrometer CMOS Technology", I.E.D.M. Technical Digest, 2001, pages 559–562.

The light sensing devices generate one or more data signals in response to detection of the light, and such data signals are sent to processor 1704. The data signals can then be compared to a reference bank to photographically identify a person.

The digit print devices are devices configured to identify an individual from topographical characteristics of a digit. The term "digit" can encompass a finger, thumb or toe. Exemplary digit print devices are described in, for example, Maeda et al., "An Artificial Fingerprint Device (AFD) Module Using Poly-Si Thin Film Transistors With Logic LSI Compatible Process For Built-In Security", I.E.D.M. Technical Digest, 2001, pages 760–763; and Sato et al., "MEMS Fingerprint Sensor With Arrayed Cavity Structure", I.E.D.M. Technical Digest, 2001, pages 913–916. Accordingly, the digit print devices can include one or more deformable devices for detecting characteristics of a surface topography of a digit, with exemplary deformable devices being MEMS. Alternatively, or additionally, the digit print devices can include polycrystalline silicon thin film transistors with appropriate logic circuitry to identify characteristics associated with a surface topography of a digit.

The digit print devices characterize surface topography of a digit and generate data signals in response to such characterization. The data signals are sent to processor 1704. The processor can then, for example, compare the data signals to a reference bank to identify the digit corresponding to the signals. In particular aspects, the photograph obtained by the light sensing devices and the digit print obtained by the digit print device can create a unique identifier for a person. Such unique identifier is stored in a reference bank, and the person can then be distinguished from other persons by such unique identifier.

Assembly 1700 can be fabricated into any appropriate size and shape device, and can ultimately form a convenient device for personal security and identification.

FIG. 41 illustrates an exemplary cross section of device elements and arrays of a fragment of a schematic construction 1800 which can be incorporated into the exemplary assembly 1700 described with reference to FIG. 40.

Fragment 1800 comprises a substrate 12 having an insulative material 14 thereover. Substrate 12 and insulative material 14 can comprise the same components described previously with reference to FIG. 1.

Assembly 1800 comprises a non-volatile memory element 1802 similar to the element described with reference to FIG. 29. Such element can be utilized as a data storage device. Functional memory arrays and data storage devices of the assembly 1800 are represented by element 1802.

Construction 1800 also comprises NFET elements 1804 and 1806, and a PFET element 1808. The NFET elements are similar to the device described previously with reference to FIG. 7, and the PFET elements are similar to the device described previously with reference to FIG. 9. The NFET device 1804 represents an exemplary scheme for construction of sense devices and circuitry for the adjacent photodiode array 1820. The device-pair of NFET 1806 and PFET 1808 is representative of various CMOS random logic constructions including processors and controllers for assembly 1800. The assembly 1800 also comprises a MEMS device array 1830 with regions 1840 and 1842 together representing sensing devices and circuitry for support devices for the MEMS array. Passive devices (e.g., resistors, capacitors, inductors, etc.) are represented in region 1810 whereby a p-type diffused resistor 1812 with an associated n+ guard ring 1814 is schematically shown.

Photodiode array 1820 is provided over a section of substrate 12, with such array comprising n-type doped diffusion regions 1822 extending into a p-type doped silicon material 1824. The silicon material can be formed over a seed layer 1826 which is epitaxially grown over a conductive pedestal 1828. The conductive pedestal includes a p− region over a p region, and can be electrically connected to one or more of the data storage devices (such as, for example, device 1802), and logic devices (such as, for example, the devices 1804, 1806 and 1808). Electrical connections between the conductive pedestal and the logic and data storage devices are not shown, but could be fabricated utilizing conventional methodologies.

The array 1830 of MEMS devices 1832 is over a portion of substrate 12, and such array can be a portion of a digit print detection device. The array is formed over an oxide 62, which in turn is over a mass 1840. Mass 1840 can comprise various sensing and support devices. The shown mass 1840 is over a layer 1842, which in turn is over a layer 1844. Layer 1844 can comprise, for example, a seed layer, and layer 1842 can comprise, for example, conductively doped silicon or conductively-doped silicon germanium. In particular aspects, layer 1842 is p-type doped semiductive material. The various sensing and support devices can extend within any and all of layers 1840, 1842 and 1844. The various sensing and support devices are not specifically shown in assembly 1800 but can be formed utilizing conventional methodology, and are utilized for detecting a data signal from the MEMS array and passing such data signal to appropriate logic devices and/or data storage devices.

Assembly 1800 can be an element of a SID, and can be formed to have a thin, flat configuration, which can be suitable for incorporation into small devices.

The assemblies of FIGS. 40 and 41 can be utilized not only for identifying persons but also for storing personal information about particular subjects. Accordingly, a device incorporating such assemblies can identify a subject, and also have pertinent information about the subject stored in a reference database, with exemplary personal information including a date of birth, and information about life experiences including, for example, information about any dates of incarceration. Further, it should be understood that the assemblies can be utilized for applications other than identifying people. The assemblies can be utilized for example, in identifying any of numerous objects, including, for example, identification of inanimate or animate objects, such as, for example, identification of animals. If the assemblies are utilized for identification of objects other than people, the digit print sensing devices can be eliminated. Alternatively, the digit print sensing devices can be modified to identified a surface topography relevant to identification of the particular non-human object.

Several of the figures provided herein show various different dopant levels, and utilize the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions.

The p+, p, and p− dopant levels are shown in the drawings only to illustrate differences in dopant concentration. It is noted that the term "p" is utilized herein to refer to both a dopant type and a relative dopant concentration. To aid in interpretation of this specification and the claims that follow, the term "p" is to be understood as referring only to dopant type, and not to a relative dopant concentration, except when it is explicitly stated that the term "p" refers to a relative dopant concentration. Accordingly, for purposes of interpreting this disclosure and the claims that follow, it is to be understood that the term "p-type doped" refers to a dopant type of a region and not a relative dopant level. Thus, a p-type doped region can be doped to any of the p+, p, and p− dopant levels discussed above. Similarly, an n-type doped region can be doped to any of the n+, n, and n− dopant levels discussed above.

The various illustrated systems of this disclosure are intended to provide a general understanding of various applications for the devices and circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method for machine detection of at least one aspect of an object, comprising:
    providing at least one sensing device configured to generate one or more data signals in response to detection of a property of said object;
    providing a processor configured to receive said one or more data signals, the processor comprising a data storage device, the data storage device including an active region extending into a pair of crystalline layers;

one of the crystalline layers having a relaxed crystalline lattice and the other having a strained crystalline lattice; and detecting said property of the, object with the sensing device, generating the one or more data signals in response to the detection of said property, receiving the one or more data signals with the processor, and processing at least one of the one or more data signals utilizing the data storage device.

2. The method of claim 1 wherein the at least one sensing device includes a digit print sensing device, and wherein the detection of said property comprises sensing of a digit print.

3. The method of claim 1 wherein the at least one sensing device includes a light sensing device for detecting light received from the object; and wherein the method includes generating the one or more of the data signals in response to the detection of the light with the light sensing device.

4. The method of claim 1 wherein the at least one sensing device includes an array of deformable devices for characterizing a surface topography of the object; and wherein the deformable devices generate the one or more data signals in response to the characterization of the topography.

5. The method of claim 4 wherein the deformable devices include MEMS.

6. The method of claim 1 wherein the active region of the data storage device is part of a field effect transistor.

7. The method of claim 1 wherein the active region of the data storage device is part of a field effect transistor; wherein the transistor comprises a gate; and wherein the strained crystalline lattice is between the relaxed crystalline lattice and the gate.

8. The method of claim 1 wherein the data storage device includes a capacitor.

9. The method of claim 1 wherein the data storage device is a DRAM cell.

10. The method of claim 1 wherein the data storage device includes a thyristor.

11. The method of claim 1 wherein the data storage device is a GLTRAM cell.

12. The method of claim 1 wherein the data storage device includes a Schottky diode.

13. The method of claim 1 wherein the data storage device is a NVRAM cell.

14. The method of claim 1 wherein the data storage device includes a bipolar transistor and a field effect transistor, and wherein the active region is comprised by the field effect transistor.

15. The method of claim 1 wherein the data storage device is a non-volatile device.

16. The method of claim 1 wherein a charge trapping region is within the active region.

17. The method of claim 1 wherein a charge trapping region is within the active region, and wherein the charge trapping region comprises a silicon rich insulator layer.

18. The method of claim 17 wherein the silicon rich insulator is silicon-rich-nitride.

19. The method of claim 17 wherein the silicon rich insulator is silicon-rich-oxynitride.

20. The method of claim 17 wherein the silicon rich insulator is silicon-rich-oxide.

21. The method of claim 1 wherein the data storage device is provided as part of an SOI construction, and is spaced from a supporting substrate of the SOI construction by an insulative material.

22. The method of claim 21 wherein the supporting substrate comprises a semiconductive material.

23. The method of claim 21 wherein the supporting substrate comprises glass.

24. The method of claim 21 wherein the supporting substrate comprises aluminum oxide.

25. The method of claim 21 wherein the supporting substrate comprises silicon dioxide.

26. The method of claim 21 wherein the supporting substrate comprises a metal.

27. The method of claim 21 wherein the supporting substrate comprises a plastic.

28. The method of claim 1 wherein the crystalline layer having the relaxed crystalline lattice comprises from about 10 to about 60 atomic percent germanium.

29. A method for machine identification of a person, comprising:
providing an assembly comprising:
one or more light sensing units for detecting light received from the person; the light sensing units being configured to generate one or more first data signals in response to the detection of the light;
at least one topography-characterization structure for characterizing a surface topography of a digit; the structure being configured to generate one or more second data signals in response to the characterization of the topography; and
a processor configured to receive the first and second data signals, the processor comprising a device which has an active region extending into a crystalline layer comprising silicon and germanium;
reflecting light form a person onto at least one of the light sensing units, the at least one of the light sensing units generating at least one first data signal in response to the light;
characterizing a topography of a surface of a digit of the person with the at least one topography-characterization structure, the at least one topography-characterization structure generating at least one second signal in response to the characterization; and
receiving and processing the first and second data signals with the processor, the processing utilizing the device active region.

30. The method of claim 29 wherein the crystalline layer comprises from about 10 to about 60 atomic percent germanium.

31. The method of claim 29 wherein the entirety of the active region within the crystalline layer is within only a single crystal of the crystalline layer.

32. The method of claim 29 wherein the active region of the device is part of a field effect transistor; wherein the transistor comprises a gate; wherein the crystalline layer has a relaxed crystalline lattice, and further comprising a layer having a strained crystalline lattice; the strained crystalline lattice being between the relaxed crystalline lattice and the gate.

33. The method of claim 32 wherein the device is a logic device.

34. The method of claim 33 wherein the logic device is a CMOS inverter.

35. The method of claim 33 wherein the logic device is a NOR device; wherein the active region is a first active region associated with a first transistor device; wherein the logic device comprises a second active region associated with a second transistor device; wherein the first and second active regions extend into the crystalline layer; and wherein the entirety of the first and second active regions within the crystalline layer are within only a single crystal of the crystalline layer.

36. The method of claim 33 wherein the logic device is a NAND device; wherein the active region is a first active region associated with a first transistor device; wherein the logic device comprises a second active region associated with a second transistor device; wherein the first and second active regions extend into the crystalline layer; and wherein the entirety of the first and second active regions within the crystalline layer are within only a single crystal of the crystalline layer.

37. The method of claim 29 wherein the device is a data storage device.

38. The method of claim 37 wherein the data storage device includes a capacitor.

39. The method of claim 37 wherein the data storage device is a DRAM cell.

40. The method of claim 37 wherein the data storage device includes a thyristor.

41. The method of claim 37 wherein the data storage device is a GLTRAM cell.

42. The method of claim 37 wherein the data storage device includes a Schottky diode.

43. The method of claim 37 wherein the data storage device is a NVRAM cell.

44. The method of claim 37 wherein the data storage device includes a bipolar transistor and a field effect transistor, and wherein the active region is comprised by the field effect transistor.

45. The method of claim 37 wherein the data storage device is a non-volatile device.

46. The method of claim 37 wherein a charge trapping region is within the active region.

47. The method of claim 37 wherein a charge trapping region is within the active region, and wherein the charge trapping region comprises a silicon rich insulator layer.

48. The method of claim 29 wherein the topography-characterization structure includes an array of MEMs.

49. The method of claim 29 wherein the topography-characterization structure includes polysilicon thin film transistors.

50. A method of forming an electronic system, comprising:
providing at least one signal generator; and
providing a processor in data communication with the signal generator, the processor comprising a data storage device, the data storage device including an active region extending into a crystalline layer comprising Si/Ge; at least the majority of the active region within the crystalline layer being within a single crystal of the crystalline layer.

51. The method of claim 50 wherein the entirety of the active region within the crystalline layer is within only a single crystal of the crystalline layer.

52. The method of claim 50 wherein the at least one signal generator includes MEMs.

53. The method of claim 50 wherein the at least one signal generator includes light-sensitive pixels.

54. The method of claim 50 wherein the at least one signal generator includes an antenna.

55. The method of claim 50 wherein the at least one signal generator is within an RF circuit.

56. The method of claim 50 wherein the at least one signal generator is within a digital circuit.

57. The method of claim 50 wherein the at least one signal generator is within an analogue circuit.

58. The method of claim 50 wherein the at least one signal generator is part of a transmitter.

59. The method of claim 50 wherein the at least one signal generator is part of a receiver.

60. The method of claim 50 wherein the active region of the data storage device is part of a field effect transistor.

61. The method of claim 50 wherein the active region of the data storage device is part of a field effect transistor; wherein the transistor comprises a gate; wherein the crystalline layer has a relaxed crystalline lattice, and wherein the data storage device further comprises a layer having a strained crystalline lattice; the strained crystalline lattice being between the relaxed crystalline lattice and the gate.

62. The method of claim 50 wherein the data storage device includes a capacitor.

63. The method of claim 50 wherein the data storage device is a DRAM cell.

64. The method of claim 50 wherein the data storage device includes a thyristor.

65. The method of claim 50 wherein the data storage device is a GLTRAM cell.

66. The method of claim 50 wherein the data storage device includes a Schottky diode.

67. The method of claim 50 wherein the data storage device is a NVRAM cell.

68. The method of claim 50 wherein the data storage device includes a bipolar transistor and a field effect transistor, and wherein the active region is comprised by the field effect transistor.

69. The method of claim 50 wherein the data storage device is a non-volatile device.

70. The method of claim 50 wherein a charge trapping region is within the active region.

71. The method of claim 50 wherein a charge trapping region is within the active region, and wherein the charge trapping region comprises a silicon rich insulator layer.

72. The method of claim 50 wherein the germanium is present in the layer to a concentration of from about 10 atomic % to about 60 atomic %.

* * * * *

UNITED STATES PATENT AND TRADEMARK OFFICE
CERTIFICATE OF CORRECTION

PATENT NO. : 7,158,401 B2
APPLICATION NO. : 11/000784
DATED : January 2, 2007
INVENTOR(S) : Arup Bhattacharyya It is certified that error appears in the above-identified patent and that said Letters Patent is hereby corrected as shown below:

Col. 3, line 25 —
Replace "Digest, 2002 00. 98-99; and Huang, L.J. et al., "Carrier"
With --Digest 2002 pp. 98-99; and Huang, L.J. et al., "Carrier--

Col. 3, line 32 —
Replace "strained-latticechanneled-field effect transistors on relaxed"
With --strained-lattice-channeled-field effect transistors on relaxed--

Col. 15, line 16 —
Replace "those described above with reference FIG. 10. Identical"
With --those described above with reference to FIG. 10. Identical--

Col. 17, line 29 —
Replace "a basic CMOS One of the source/drain regions 314 of the"
With --a basic CMOS. One of the source/drain regions 314 of the--

Col. 22, line 50 —
Replace "such is appropriate when taking into a consideration the"
With --such is appropriate when taking into consideration the--

Col. 22, line 51 —
Replace "work function differences association with such option."
With --work function differences associated with such option.--

Col. 25, line 55 —
Replace "$1 \times 10^{-8} /cm^2$), and to conduct a large forward current at"
With --$1 \times 10^{-8} A/cm^2$), and to conduct a large forward current at--

Col. 61, line 44 —
Replace "metal suicides 937 and metal oxides 938."
With --metal silicides 937 and metal oxides 938.--

Col. 29, line 60 —
Replace "transition metal suicides have relatively low Schottky barrier"
With --transition metal silicides have relatively low Schottky barrier--

Col. 30, line 27 —
Replace "device. Memory cell 982 can be can be referred to as a"
With --device. Memory cell 982 can be referred to as a--

UNITED STATES PATENT AND TRADEMARK OFFICE
CERTIFICATE OF CORRECTION

PATENT NO. : 7,158,401 B2
APPLICATION NO. : 11/000784
DATED : January 2, 2007
INVENTOR(S) : Arup Bhattacharyya It is certified that error appears in the above-identified patent and that said Letters Patent is hereby corrected as shown below:

Col. 31, line 29 —
Replace "over conductively-doped source/region 987, and"
With --over conductively-doped source/drain region 987, and--

Col. 33, line 22 —
Replace "1154 can have thickness of less than 150 Å, and typically has"
With --1154 can have a thickness of less than 150 Å, and typically has--

Col. 35, line 11 —
Replace "the location the charge trapping region 1230 is on or near the"
With --the location of the charge trapping region 1230 is on or near the--

Col. 37, line 14 —
Replace "In the specific construct of FIG. 32, the PFET device of"
With --In the specific construction of FIG. 32, the PFET device of--

Col. 39, line 23 —
Replace "logic construct."
With --logic construction--

Col. 39, line 44 —
Replace "In the specific construct of FIG. 35. The NFET device of"
With --In the specific construction of FIG. 35. The NFET device of--

Col. 40 line 55 —
Replace "with such logic construct. Such dense wireability can"
With --with such logic construction. Such dense wireability can--

Col. 46, line 3 —
Replace "identified a surface topography relevant to identification of"
With --identify a surface topography relevant to identification of--

Col. 47, line 4 —
Replace "detecting said property of the, object with the sensing"
With --detecting said property of the object with the sensing--

UNITED STATES PATENT AND TRADEMARK OFFICE
CERTIFICATE OF CORRECTION

PATENT NO.         : 7,158,401 B2
APPLICATION NO. : 11/000784
DATED                  : January 2, 2007
INVENTOR(S)       : Arup Bhattacharyya It is certified that error appears in the above-identified patent and that said Letters Patent is hereby corrected as shown below:

Col. 48, line 30 —
 Replace "reflecting light form a person onto at least one of the light"
 With --reflecting light from a person onto at least one of the light--

Signed and Sealed this

Sixth Day of May, 2008

JON W. DUDAS
*Director of the United States Patent and Trademark Office*